(12) United States Patent
Yang et al.

(10) Patent No.: US 8,542,940 B2
(45) Date of Patent: *Sep. 24, 2013

(54) METHOD, SYSTEM AND COMPUTER PROGRAM PRODUCT FOR OPTIMIZATION OF DATA COMPRESSION

(75) Inventors: En-hui Yang, Petersburg (CA); Longji Wang, Waterloo (CA)

(73) Assignee: Slipstream Data Inc., Waterloo, Ontario (CA)

(*) Notice: Subject to any disclaimer, the term of this patent is extended or adjusted under 35 U.S.C. 154(b) by 0 days.

This patent is subject to a terminal disclaimer.

(21) Appl. No.: 13/615,702

(22) Filed: Sep. 14, 2012

(65) Prior Publication Data

US 2013/0028533 A1    Jan. 31, 2013

Related U.S. Application Data

(63) Continuation of application No. 13/166,951, filed on Jun. 23, 2011, now Pat. No. 8,374,449, which is a continuation of application No. 12/774,313, filed on May 5, 2010, now Pat. No. 7,978,923, which is a continuation of application No. 11/180,513, filed on Jul. 14, 2005, now Pat. No. 7,742,643.

(60) Provisional application No. 60/588,380, filed on Jul. 16, 2004, provisional application No. 60/587,555, filed on Jul. 14, 2004.

(51) Int. Cl.
*G06K 9/00* (2006.01)

(52) U.S. Cl.
USPC ........... 382/251; 382/232; 382/233; 382/245; 382/248; 382/250; 375/240.01; 375/240.03; 375/240.26; 375/240.27

(58) Field of Classification Search
USPC .................. 382/232, 233, 245, 246, 248, 250, 382/251; 375/240.01, 240.03, 240.27, 240.26
See application file for complete search history.

(56) References Cited

U.S. PATENT DOCUMENTS

| 5,682,152 | A |   | 10/1997 | Wang et al. |
|---|---|---|---|---|
| 5,734,755 | A | * | 3/1998 | Ramchandran et al. ...... 382/250 |

(Continued)

FOREIGN PATENT DOCUMENTS

| EP | 1333679 B1 | 4/2004 |
|---|---|---|
| EP | 1453208 A1 | 9/2004 |

(Continued)

OTHER PUBLICATIONS

Ortega Et Al., "Optimal Trellis-Based Buffered Compression and Fast Approximations", IEEE Transactions on Image Processing, IEEE Service Center, Piscataway, NJ, US, vol. 3, No. 1, Jan. 1994, pp. 26-39, XP000433559, ISSN: 1057-7149; paragraphs [0III], [00IV]; figures 2-4.

(Continued)

*Primary Examiner* — Ali Bayat
(74) *Attorney, Agent, or Firm* — Bereskin & Parr LLP/S.E.N.C.R.L., s.r.l.

(57) ABSTRACT

A sequence of n coefficients is compressed by determining a cost-determined sequence of n coefficient indices represented by a cost-determined sequence of (run, index derivative) pairs under a given quantization table and run-index derivative coding distribution, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value derived from a value of the index following the number of consecutive indices of the special value.

33 Claims, 36 Drawing Sheets

(56) References Cited

U.S. PATENT DOCUMENTS

| | | | |
|---|---|---|---|
| 5,926,222 A | 7/1999 | Nickerson | |
| 5,991,451 A | 11/1999 | Keith et al. | |
| 6,167,162 A | 12/2000 | Jacquin et al. | |
| 6,212,302 B1 | 4/2001 | Honsinger et al. | |
| 6,349,151 B1 | 2/2002 | Jones et al. | |
| 6,356,668 B1 | 3/2002 | Honsinger et al. | |
| 6,507,616 B1 | 1/2003 | Ryu | |
| 6,594,398 B1 | 7/2003 | Wu et al. | |
| 6,891,889 B2 | 5/2005 | Kim et al. | |
| 6,925,120 B2 | 8/2005 | Zhang et al. | |
| 6,999,432 B2 | 2/2006 | Zhang et al. | |
| 7,010,037 B2 | 3/2006 | Ye et al. | |
| 7,149,360 B2 | 12/2006 | Brake et al. | |
| 7,742,643 B2 * | 6/2010 | Yang et al. | 382/232 |
| 7,978,923 B2 * | 7/2011 | Yang et al. | 382/245 |
| 2003/0179937 A1 * | 9/2003 | Brake et al. | 382/232 |
| 2004/0028131 A1 * | 2/2004 | Ye et al. | 375/240.11 |
| 2004/0066973 A1 | 4/2004 | Prakash et al. | |
| 2004/0120398 A1 | 6/2004 | Zhang et al. | |
| 2004/0179606 A1 | 9/2004 | Zhou et al. | |
| 2005/0015248 A1 | 1/2005 | Kadono et al. | |
| 2005/0052294 A1 | 3/2005 | Liang et al. | |
| 2006/0013300 A1 | 1/2006 | Han | |
| 2007/0047639 A1 | 3/2007 | Ye | |

FOREIGN PATENT DOCUMENTS

| | | |
|---|---|---|
| JP | 06-021830 A | 1/1994 |
| JP | 06-237184 A | 8/1994 |
| JP | 08-079088 A | 3/1996 |

OTHER PUBLICATIONS

W. Pennebaker and J. Mitchell, "JPEG Still Image Data Compression Standard," Kluwer Academic Publishers, 1993, pp. 401-403, 503; 1993, published before U.S. Appl. No. 10/924,189, filed Jul. 14, 2004.

G. Wallace, "The JPEG Still Picture Compression Standard," Communications of the ACM, vol. 34, pp. 30-44, Apr. 1991.

C. Hung and T. Meng, "Optimal Quantizer Step Sizes for Transform Coders," in Proc. IEEE Int. Conf. Acoustics, Speech and Signal Processing, pp. 2621-2624, Apr. 1991.

S. Wu and A. Gersho, "Rate-Constrained Picture-Adaptive Quantization for JPEG Baseline Coders," in Proc. IEEE Int. Conf. Acoustics, Speech and Signal Processing, vol. 5, pp. 389-392, 1993; published before U.S. Appl. No. 10/924,189, filed Jul. 14, 2004.

V. Ratnakar and M. Livny, "RD-OPT: An Efficient Algorithm for Optimizing DCT Quantization Tables", in Proc. Data Compression Conf., pp. 332-341, 1995; published before U.S. Appl. No. 10/924,189, filed Jul. 14, 2004.

V. Ratnakar and M. Livny, "An Efficient Algorithm for Optimizing DCT Quantization", IEEE Trans. Image Processing, vol. 9 pp. 267-270, Feb. 2000.

K. Ramchandran and M. Vetterli, "Rate-Distortion Optimal Fast Thresholding with Complete JPEG/MPEG Decoder Compatibility," IEEE Trans Image Processing, vol. 3, pp. 700-704, Sep. 1994.

M. Crouse and K. Ramchandran, "Joint Thresholding and Quantizer Selection for Decoder-compatible Baseline JPEG," in Proc. IEEE Int. Conf. Acoustics, Speech and Signal Processing, pp. 2331-2334, May 1995.

M. Crouse and K. Ramchandran, "Joint Thresholding and Quatizer Selection for Transform Image Coding: Entropy Constrained Analysis and Applications to Baseline JPEG," IEEE Trans Image Processing, vol. 6, pp. 285-297 Feb. 1997.

E.-H. Yang, Z. Zhang, and T. Berger, "Fixed Slope Universal Lossy Data Compression," IEEE Trans. Inform. Theory, vol. 43, pp. 1465-1476, Sep. 1997.

E.-H. Yang and Z. Zhang, "Variable-Rate Trellis Source Coding." IEEE Trans. Inform. Theory, vol. 45, pp. 586-608, Mar. 1999.

Wavelet Image Compression Construction Kit http://www.geoffdavis.net/Dartmouth/wavelet/wavelet.html.

J. Shapiro, "Embedded Image Coding Using Zerotrees of Wavelet Coefficients", IEEE Trans. Signal Processing, vol. 41, pp. 344-3462, Dec. 1993.

Said and W.A. Pearlman, "New, Fast, and Efficient Image Codec Based on Set Partitioning in Hierarchical Trees", IEEE Trans. Circuits, Syst., Video Technol, vol. 6, pp. 243-249, Jun. 1996.

D. Taubman, "High Performance Scalable Image Compression with EBCOT", IEEE Trans. Image Processing, vol. 9, pp. 1158-1170, Jul. 2000.

X. Wu, "High-Order Context Modeling and Embedded Conditional Entropy Coding of Wavelet Coefficients for Image Compression", in Proc. 31st Asilomar Conf. Signals, Systems, Computers, pp. 1378-1382, Nov. 1997.

Tu, J. Liang, and T. Tran, "Adaptive Runlength Coding", IEEE Signal Processing Letters, vol. 10, pp. 61-64, Mar. 2003.

Tu and T. Tran, "Context-Based Entropy Coding of Block Transform Coefficients for Image Compression", IEEE Trans. Image Processing, vol. 11, pp. 1271-1283, Nov. 2002.

T. Tran, J. Liang, and C. Tu, "Lapped Transform Via Time-Domain Pre- and Post- Filtering", IEEE Trans. Signal Processing, vol. 51, pp. 1557-1571, Jun. 2003.

PCT International Search Report in relation to Application No. PCT/CA2004/001559 dated Mar. 8, 2005.

PCT Written Opinion in relation to Application No. PCT/CA2004/001559 dated Mar. 9, 2005.

Wen et Al., "Trellis-based R-D Optimal Quantization in H.263+", IEEE Transactions on Image Processing, vol. 9, No. 8, Aug. 2000, pp. 1431-1434.

Office Action in relation to Canadian Patent Application No. 2,572,812 dated Jul. 16, 2010.

D. Taubman, "High Performance Scalable Image Compression with EBCOT", IEEE Trans. Image Processing, vol. 9, pp. 1158-1170, Jul. 2000; X. Wu, "High-Order Context Modeling and Embedded Conditional Entropy Coding of Wavelet Coefficients for Image Compression", in Proc. 31st Asilomar Conf. Signals, Systems, Computers, pp. 1378-1382, Nov. 1997.

Office Action in relation to related Patent Application No. 2,572,818 dated Apr. 6, 2009.

Office Action in relation to related Patent Application No. 2,572,818 dated Sep. 9, 2011.

Office Action in relation to related Patent Application No. 12/491,764 dated Oct. 6, 2011.

Office Action in relation to related U.S. Appl. No. 12/774,313 dated Nov. 10, 2010.

Office Action in relation to U.S. Appl. No. 10/924,189, dated Feb. 26, 2008.

Office Action in relation to U.S. Appl. No. 10/924,189, dated Jun. 17, 2008.

Office Action in relation to U.S. Appl. No. 10/924,189, dated Dec. 22, 2008.

Office Action in relation to Application No. 200480043979.5, dated Jun. 5, 2009.

Supplementary European Search report in relation to application No. 04761723.6, mailed May 7, 2008.

Supplementary European Search report in relation to application No. 057635567.7, mailed May 9, 2008.

International Search Report and Written Opinion for PCT/CA2005/001084 dated Nov. 2, 2005.

International Search Report and Written Opinion for Application No. PCT/CA2004/001559 dated Mar. 9, 2005.

International Search Report and Written Opinion for Application No. PCT/CA2005/001084 dated Mar. 9, 2005.

International Preliminary Report on Patentability and Written Opinion for PCT/CA2005/001084 dated Jan. 25, 2007.

European Patent Office Communication under Rule 71(3) EPC for Application No. 05763556.7 dated Sep. 4, 2009.

Annex to EPO Form 2004, Communication pursuant to Rule 71(3) EPC for Application No. EP 05763556.7, Sep. 4, 2009.

Annex to EPO Form 2004, Communication pursuant to Rule 71(3) EPC for Application No. EP 05763556.7.

Chinese Office Action for Application No. 200580030761.0 dated Sep. 11, 2009.

European Patent Decision to Grant a European patent pursuant to Article 97(1) EPC for Application No. 04761723.8 dated May 17, 2010.
European Patent Office Communication pursuant to Article 94(3) EPC for Application No. 04761723.8 dated Dec. 23, 2008.
European Patent Office Communication for Application No. 04761723.8 dated May 7, 2008.
European Patent Office Communication under Rule 71(3) EPC for Application No. 04761723.8 dated Nov. 13, 2009.
Supplementary European Search Report and Examination Opinion for Application No. 05763566.7, dated Apr. 17, 2008.
Supplementary European Search Report for Application No. EP 04761723.8 dated Apr. 17, 2008.
Formalities Examination Report for Singapore Patent Application No. 200904747-3, dated Jul. 23, 2009.
Formalities Examination Report for Singapore Patent Application No. 200904746-5, dated Jul. 23, 2009.
European Patent Office Communication for Application No. 05763556.7 dated May 9, 2008.
Notice of Allowance for U.S. Appl. No. 11/180,513, dated Feb. 22, 2010.
Notice of Allowance for U.S. Appl. No. 11/180,513 dated Nov. 3, 2009.
Office Action in relation to U.S. Appl. No. 11/180,513, dated May 12, 2009.
Office Action in relation to U.S. Appl. No. 11/180,513 dated Mar. 27, 2009.
Office Action in relation to U.S. Appl. No. 13/166,951 dated May 30, 2012.
Ramchandran, K et al., "Bit Allocation for Dependent Quantization with Application to Multi resolution and MPEG video Coders", IEEE Transactions on Image Processing, IEEE Service Center, Piscataway, NJ, US, vol. 3, No. 5, Sep. 1, 2007, pp. 533-545, XP000476830, ISSN: 1057-7149, Paragraphs [00II]-[0III]; Figures 1-8.
En-Hui Yang et al., << Joint-Optimization of 1-59 Run Length Coding, Huffman Coding and Quantization Table with Complete Baseline JPEG Compatibility, Image Processing, 2007, ICIP 2007, IEEE International Conference ON, IEEE, PI, Sep. 2007, pp. 111-181, XP031158034, ISBN: 978-1-4244-1436-9, the whole document.
Second Office Action, Chinese Patent Application No. 200580030761.0, dated Nov. 1, 2011.
Office Action in relation to U.S. Appl. No. 13/473,738 dated Jan. 23, 2013.
First Examination Report, Indian Patent Application No. 222/DELNP/2007, dated Dec. 30, 2010.
Notice of Allowance, U.S. Appl. No. 13/166,591, mailed Dec. 3, 2012.

* cited by examiner

Notations:

$C_{i,j}$ – the $i^{th}$ DCT coefficient ($1 \leq i \leq 63$) of block $j$;

c_abs(i) – absolute value of $C_{i,j}$;

$q_i$ – the current quantization step size for the $i^{th}$ DCT coefficient in zigzag order;

s_min(s) – the minimum absolute number in size group $s$ ($1 \leq s \leq 10$);

s_max(s) – the maximum absolute number in size group $s$ ($1 \leq s \leq 10$);

dist(r, i) – mean square distortion of dropping all the coefficients between state $i-r-1$ and state $i$, i.e., $dist(r,i) = \sum_{k=i-r}^{i-1} C_{k,j}^2$;

ent(r, s) – entropy rate associated with the pair (r, s), i.e., $ent(r,s) = -\log_2 P(r,s) + s$;

d(i, s) – mean square distortion resulting from $C_{i,j}$ when the corresponding index is forced into size group $s$;

ID(i, s) – index to be sent for $C_{i,j}$ when the index is in size group s;

state(i).r – the *run* part of the last *(r, s)* pair on the optimal path to state *i*;

state(i).s – the *size* part of the last *(r, s)* pair on the optimal path to state *i*;

state(i).ID – index to be sent for $C_{i,j}$;

state(i).cost – the minimum Lagrangian cost to state *i*;

eob_cost(i) – the cost of dropping the coefficients after state *i*, i.e., $eob\_cost(i) = \sum_{k=i+1}^{63} C_{k,j}^2 + \lambda \cdot ent(0,0)$;

$J^*(i)$ – the minimum cost of a full path where the $i^{th}$ index is the last nonzero index.

FIG. 6a

Initialization:

Pre-calculate ent(r, s) based on $P_0$ and set the state 0 appropriately (we do not optimize DC coefficient in this procedure).

For each 8x8 block, pre-calculate dist(r, i) and eob_cost(i) recursively.

Procedure (find the optimal run-size pairs and in-category indices for one block):

/* step 1: find the distortion and in-category index if $C_{i,j}$ is forced to size group s */ for each state i ( $1 \leq i \leq 63$ ) )

$ind = C_{i,j} // q_i$     /* '//' stands for division with rounding */ s = size_group(ind)     /* size_group() is used to find the size group of ind */

$d(i,s) = (C_{i,j} - ind * q_i)^2$

ID(i, s) = ind for $1 \leq size \leq s-1$ $d(i, size) = (c\_abs(i) - s\_max(size) * q_i)^2$ ;

ID(i, size) = ( $C_{i,j} < 0$ ) ? (-s_max(size)) : s_max(size);

for $s+1 \leq size \leq 10$ $d(i, size) = (c\_abs(i) - s\_min(size) * q_i)^2$ ;

ID(i, size) = ( $C_{i,j} < 0$ ) ? (-s_min(size)) : s_min(size);

FIG. 6b

/* step 2: find the optimal path where the $i^{th}$ index is the last nonzero index to be sent */ for each state $i$ ($1 \leq i \leq 63$)

current_minicost = a large number for each state i-r-1 ( $0 \leq r \leq i-1$ for i<16, $0 \leq r \leq 15$ for $i \geq 16$ )

for each size group s ($1 \leq s \leq 10$ )

dist_inc = dist(r, i) + d(i, s)

J = state(i-r-1).cost + dist_inc + $\lambda$*ent(r, s)

if (J < current_minicost)

current_minicost = J record r, s, ID(i,s), and *current_minicost* to state *i*

/* consider the special transition *(15,0)* for state $i$ ( $i \geq 16$ ) */ if ( $16 \leq i \leq 62$ ) /* state 63 does not have *(15,0)* incoming transition */ dist_inc = dist(15, i)+$C_{i,j}^2$

J = state(i-16).cost + dist_inc + $\lambda$*ent(15, 0)

if (J < current_minicost)

current_minicost = J record r, s, 0 and *current_minicost* to state *i*

/* find the total cost of the full path */

$J^*(i) = state(i).cost + eob\_cost(i)$

/* step 3: find the optimal path for current block */

Find the minimum Lagrangian cost by comparing $J^*(i)$ ( $0 \leq i \leq 63$ ), then trace back to obtain the optimal run-size pairs and the corresponding indices.

FIG. 6c

Appendix A: Procedure of graph-based run-length coding with context-based arithmetic coding

Notations:

$C_{i,j}$ – the $i^{th}$ DCT coefficient ($1 \leq i \leq 63$) of block $j$;

$c\_abs(i)$ – absolute value of $C_{i,j}$ within a given block $j$;

$q_i$ – the current quantization step size for the $i^{th}$ DCT coefficient in zigzag order;

$dist(r, i)$ – mean square distortion of dropping all the coefficients between state $i$-$r$-$1$ and state $i$, i.e., $dist(r,i) = \sum_{k=i-r}^{i-1} C_{k,j}^2$;

$d(i, l)$ – mean square distortion resulting from $C_{i,j}$ when the magnitude of the corresponding index is $l$;

$state(i).r$ – the *run* part of the last $(r, l)$ pair on the optimal path to the $i^{th}$ basic/regular state;

$state(i).r\_ext$ – the *run* part of the last $(r, l)$ pair on the optimal path to the $i^{th}$ extended state;

$state(i).l$ – the *level* part of the last $(r, l)$ pair on the optimal path to the $i^{th}$ basic/regular state;

$state(i).l\_ext$ – the *level* part of the last $(r, l)$ pair on the optimal path to the $i^{th}$ extended state;

$state(i).cost$ – the minimum Lagrangian cost to the $i^{th}$ basic/regular state;

$state(i).cost\_ext$ – the minimum Lagrangian cost to the $i^{th}$ extended state;

$state(i).intype$ – the incoming state type (basic/regular or extended state) on the optimal path to the $i^{th}$ basic/regular state;

$state(i).intype\_ext$ – the incoming state type (basic/regular or extended state) on the optimal path to the $i^{th}$ extended state;

$eob\_dist(i)$ – mean square distortion of dropping the coefficients after state $i$;

FIG. 22a $J^*(i)$ – minimum cost of a full path where the $i^{th}$ index is the last nonzero index.

Procedure (find the optimal run-level pairs for one block):

/* step 1: initialization */ for each state $i$ ( $1 \le i \le 63$ ) )

$l = c\_abs(i) // q_i$    /* '//' stands for division with rounding */ for $0 \le m < M$    /* $M$ is the number of transitions in comparison for a basic/regular state */

$$d(i, l - m) = (c\_abs(i) - (l - m) * q_i)^2$$

$$d(i,l) = (c\_abs(i) - q_i)^2$$

$$eob\_dist(i) = \sum_{k=i+1}^{63} C_{k,J}^2$$

/* step 2: find the optimal path where the $i^{th}$ index is the last nonzero index to be sent */ for each state $i$ ( $1 \le i \le 63$ )

$minicost$ = a large number $minicost\_ext$ = a large number for each incoming state $i$-$r$-$1$ ( $0 \le r \le i-1$ for $i < 16$, $0 \le r \le 15$ for $i \ge 16$ )

/* calculate the minimum cost to a basic/regular state */ for each transition $m$ in comparison ( $0 \le m < M$ )

/* from a basic/regular state */

$dist\_inc = dist(r, i) + d(i, l$-$m)$      /* $l$ is the output of hard-decision quantizer */
      $J = state(i$-$r$-$1).cost + dist\_inc + \lambda * f(r, l$-$m)$      /* $l - m > 1$ if $i \le 14$ */
      if ($J < minicost$)

$minicost = J$
        record $r$, $l$-$m$, $minicost$ and incoming state type to the state $i$

FIG. 22b

```
/* from an extended state */
    if ( i - r - 1 ≤ 14 )
        J = state(i-r-1).cost_ext + dist_inc + λ*f(r, 1-m)
        if (J < minicost)
            minicost = J
            record r, 1-m, minicost and incoming state type to state i
/* calculate the minimum cost to an extended state */
if ( i ≤ 14 )
    dist_inc = dist(r, i) + d(i,1)
    J = state(i-r-1).cost + dist_inc + λ*f(r, 1)          /* from a basic state */
    if (J < minicost_ext)
        minicost_ext = J
        record r, 1, minicost_ext and incoming state type to state i
    J = state(i-r-1).cost_ext + dist_inc + λ*f(r, 1)      /* from an extended state
*/
    if (J < minicost_ext)
        minicost_ext = J
        record r, 1, minicost_ext and incoming state type to state i
/* consider the special transition (15,0) for state i ( i ≥ 16 ) */
if ( 16 ≤ i ≤ 62 )   /* state 63 does not have (15,0) incoming transition */
    dist_inc = dist(15, i)+$C_{i,j}^2$
    J = state(i-16).cost + dist_inc + λ*f(15, 0)          /* from a basic/regular state */
    if (J < minicost)
        minicost = J
```

FIG. 22c record *15, 0, minicost* and incoming state type to state *i* if ($i \leq 30$)                           /* from an extended state */

$J = state(i-16).cost\_ext + dist\_inc + \lambda * f(15, 0)$ if ($J < minicost$)

$minicost = J$ record *15, 0, minicost* and incoming state type to state *i*

/* find the total cost of a full path where index *i* is the last nonzero index */ if ($i > 14$ or $state(i).cost + \lambda * f(0,0) < state(i).cost\_ext + \lambda * f(0,0)$)

$J^*(i) = state(i).cost + eob\_dist(i) + \lambda * f(0,0)$ else     /* note that f(0,0) differs for a basic state and an extended state with the same *i* */

$J^*(i) = state(i).cost\_ext + eob\_dist(i) + \lambda * f(0,0)$

/* step 3: find the optimal path for current block */

Find the minimum Lagrangian cost by comparing $J^*(i)$ ($0 \leq i \leq 63$), then trace back to obtain the optimal run-level pairs.

FIG. 22d

METHOD, SYSTEM AND COMPUTER PROGRAM PRODUCT FOR OPTIMIZATION OF DATA COMPRESSION

CROSS-REFERENCE TO RELATED APPLICATIONS

This application is a continuation of U.S. patent application Ser. No. 13/166,951, filed Jun. 23, 2011 now U.S. Pat. No. 8,374,449, which is a continuation of U.S. Patent application Ser. No. 12/774,313, filed May 5, 2010 now U.S. Pat. No. 7,978,923, which is a continuation of U.S. patent application Ser. No. 11/180,513, filed on Jul. 14, 2005 now U.S. Pat. No. 7,742,643, which claims the benefit of U.S. Provisional Application No. 60/588,380, filed on Jul. 16, 2004, and U.S. Provisional Application No. 60/587,555, filed on Jul. 14, 2004. U.S. patent application Ser. No. 13/166,951 issued to patent as U.S. Pat. No. 8,374,449. U.S. patent application Ser. No. 11/180,513 issued to patent as U.S. Pat. No. 7,742,643. U.S. patent application Ser. No. 12/774,313 issued to patent as U.S. Pat. No. 7,978,923. The entire contents of application Ser. Nos. 13/166,951, Application No. 12/774,313, Application No. 11/180,513, Application No. 60/588,380 and of Application No. 60/587,555 are hereby incorporated by reference.

FIELD OF THE INVENTION

The present invention relates generally to data compression, and more specifically relates to the joint optimization of quantization step sizes, quantized coefficients and entropy coding based on a run-index derivative coding distribution.

BACKGROUND OF THE INVENTION

JPEG as described in W. Pennebaker and J. Mitchell, "JPEG still image data compression standard," Kluwer Academic Publishers, 1993, (hereinafter "reference [1]"), G. Wallace, "The JPEG still-image compression standard," Commun. ACM, vol. 34, pp. 30-44, April 1991 (hereinafter "reference [2]"), is a popular DCT-based still image compression standard. It has spurred a wide-ranging usage of JPEG format such as on the World-Wide-Web and in digital cameras.

The popularity of the JPEG coding system has motivated the study of JPEG optimization schemes—see for example J. Huang and T. Meng, "Optimal quantizer step sizes for transform coders," in Proc. IEEE Int. Conf. Acoustics, Speech and Signal Processing, pp. 2621-2624, April 1991 (hereinafter "reference [3]"), S. Wu and A. Gersho, "Rate-constrained picture-adaptive quantization for JPEG baseline coders," in Proc. IEEE Int. Conf. Acoustics, Speech and Signal Processing, vol. 5, pp. 389-392, 1993 (hereinafter "reference [4]"), V. Ratnakar and M. Livny, "RD-OPT: An efficient algorithm for optimizing DCT quantization tables", in Proc. Data Compression Conf., pp. 332-341, 1995 (hereinafter "reference [5]") and V. Ratnakar and M. Livny, "An efficient algorithm for optimizing DCT quantization," IEEE Trans. Image Processing, vol. 9 pp. 267-270, February 2000 (hereinafter "reference [6]"), K. Ramchandran and M. Vetterli, "Rate-distortion optimal fast thresholding with complete JPEG/MPEG decoder compatibility," IEEE Trans Image Processing, vol. 3, pp. 700-704, September 1994 (hereinafter "reference [7]"), M. Crouse and K. Ramchandran, "Joint thresholding and quantizer selection for decoder-compatible baseline JPEG," in Proc. IEEE Int. Conf. Acoustics, Speech and Signal Processing, pp. 2331-2334, 1995 (hereinafter "reference [8]") and M. Crouse and K. Ramchandran, "Joint thresholding and quantizer selection for transform image coding: Entropy constrained analysis and applications to baseline JPEG," IEEE Trans. Image Processing, vol. 6, pp. 285-297, February 1997 (hereinafter "reference [9]"). The schemes described in all of these references remain faithful to the JPEG syntax. Since such schemes only optimize the JPEG encoders without changing the standard JPEG decoders, they can not only further reduce the size of JPEG compressed images, but also have the advantage of being easily deployable. This unique feature makes them attractive in applications where the receiving terminals are not sophisticated to support new decoders, such as in wireless communications.

Quantization Table Optimization

JPEG's quantization step sizes largely determine the rate-distortion tradeoff in a JPEG compressed image. However, using the default quantization tables is suboptimal since these tables are image-independent. Therefore, the purpose of any quantization table optimization scheme is to obtain an efficient, image-adaptive quantization table for each image component. The problem of quantization table optimization can be formulated easily as follows. (Without loss of generality we only consider one image component in the following discussion.) Given an input image with a target bit rate $R_{budget}$, one wants to find a set of quantization step sizes $\{Q_k: k=0, \ldots, 63\}$ to minimize the overall distortion $$D = \sum_{n=1}^{Num\_Blk} \sum_{k=0}^{63} D_{n,k}(Q_k) \qquad (1)$$

subject to the bit rate constraint $$R = \sum_{n=1}^{Num\_Blk} R_n(Q_0, \ldots, Q_{63}) \leq R_{budget} \qquad (2)$$

where Num_Blk is the number of blocks, $D_{n,k}(Q_k)$ is the distortion of the $k^{th}$ DCT coefficient in the $n^{th}$ block if it is quantized with the step size $Q_k$, and $R_n(Q_0, \ldots, Q_{63})$ is the number of bits generated in coding the $n^{th}$ block with the quantization table $\{Q_0, \ldots, Q_{63}\}$.

Since JPEG uses zero run-length coding, which combines zero coefficient indices from different frequency bands into one symbol, the bit rate is not simply the sum of bits contributed by coding each individual coefficient index. Therefore, it is difficult to obtain an optimal solution to (1) and (2) with classical bit allocation techniques. Huang and Meng—see reference [3]—proposed a gradient descent technique to solve for a locally optimal solution to the quantization table design problem based on the assumption that the probability distributions of the DCT coefficients are Laplacian. A greedy, steepest-descent optimization scheme was proposed later which makes no assumptions on the probability distribution of the DCT coefficients—see reference [4]. Starting with an initial quantization table of large step sizes, corresponding to low bit rate and high distortion, their algorithm decreases the step size in one entry of the quantization table at a time until a target bit rate is reached. In each iteration, they try to update the quantization table in such a way that the ratio of decrease in distortion to increase in bit rate is maximized over all possible reduced step size values for one entry of the quantization table. Mathematically, their algorithm seeks the values of k and q that solve the following maximization problem $$\max_k \max_q \frac{-\Delta D|_{Q_k \to q}}{\Delta R|_{Q_k \to q}} \qquad (3)$$

where $\Delta D|_{Q_k \to q}$ and $\Delta R|_{Q_k \to q}$ are respectively the change in distortion and that in overall bit rate when the $k^{th}$ entry of the quantization table, $Q_k$, is replaced by q. These increments can be calculated by $$\Delta D|_{Q_k \to q} = \sum_{n=1}^{Num\_Blk} [D_{n,k}(q) - D_{n,k}(Q_k)] \qquad (4)$$

and $$\Delta R|_{Q_k \to q} = \qquad (5)$$
$$\sum_{n=1}^{Num\_Blk} [R_n(Q_0, \ldots, q, \ldots, Q_{63}) - R_n(Q_0, \ldots, Q_k, \ldots, Q_{63})]$$

The iteration is repeated until $|R_{budget} - R(Q_0, \ldots, Q_{63})| \leq \epsilon$, where $\epsilon$ is the convergence criterion specified by the user.

Both algorithms aforementioned are very computationally expensive. Ratnakar and Livny—see references [5] and [6]—proposed a comparatively efficient algorithm to construct the quantization table based on the DCT coefficient distribution statistics without repeating the entire compression-decompression cycle. They employed a dynamic programming approach to optimizing quantization tables over a wide range of rates and distortions and achieved a similar performance as the scheme in reference [4].

Optimal Thresholding

In JPEG, the same quantization table must be applied to every image block. This is also true even when an image-adaptive quantization table is used. Thus, JPEG quantization lacks local adaptivity, indicating the potential gain remains from exploiting discrepancies between a particular block's characteristics and the average block statistics. This is the motivation for the optimal fast thresholding algorithm of—see reference [7], which drops the less significant coefficient indices in the R-D sense. Mathematically, it minimizes the distortion, for a fixed quantizer, between the original image X and the thresholded image $\tilde{X}$ given the quantized image $\hat{X}$ subject to a bit budget constraint, i.e., $$\min[D(X, \tilde{X})|\hat{X}] \text{ subject to } R(\tilde{X}) \leq R_{budget} \qquad (6)$$

An equivalent unconstrained problem is to minimize $$J(\lambda) = D(X, \tilde{X}) + \lambda R(\tilde{X}) \qquad (7)$$

A dynamic programming algorithm is employed to solve the above optimization problem (7) recursively. It calculates $J^*_k$ for each $0 \leq k \leq 63$, and then finds $k^*$ that minimizes this $J^*_k$, i.e., finding the best nonzero coefficient to end the scan within each block independently. The reader is referred to reference [7] for details. Since only the less significant coefficient indices can be changed, the optimal fast thresholding algorithm—see reference [7]—does not address the full optimization of the coefficient indices with JPEG decoder compatibility.

Joint Thresholding and Quantizer Selection

Since an adaptive quantizer selection scheme exploits image-wide statistics, while the thresholding algorithm exploits block-level statistics, their operations are nearly "orthogonal". This indicates that it is beneficial to bind them together. The Huffman table is another free parameter left to a JPEG encoder. Therefore, Crouse and Ramchandran—see references [8] and [9]—proposed a joint optimization scheme over these three parameters, i.e., $$\min_{T,Q,H} D(T, Q) \text{ subject to } R(T, Q, H) \leq R_{budget} \qquad (8)$$

where Q is the quantization table, H is the Huffman table incorporated, and T is a set of binary thresholding tags that signal whether to threshold a coefficient index. The constrained minimization problem of (8) is converted into an unconstrained problem by the Lagrange multiplier as $$\min_{T,Q,H} [J(\lambda) = D(T, Q) + \lambda R(T, Q, H)] \qquad (9)$$

Then, they proposed an algorithm that iteratively chooses each of Q, T, H to minimize the Lagrangian cost (9) given that the other parameters are fixed.

JPEG Limitations

The foregoing discussion has focused on optimization within the confines of JPEG syntax. However, given the JPEG syntax, the R-D performance a JPEG optimization method can improve is limited. Part of the limitation comes from the poor context modeling used by a JPEG coder, which fails to take full advantage of the pixel correlation existing in both space and frequency domains. Consequently, context-based arithmetic coding is proposed in the literature to replace the Huffman coding used in JPEG for better R-D performance.

SUMMARY OF THE INVENTION

In accordance with an aspect of the present invention, there is provided a method of compressing a sequence of n coefficients by determining a cost-determined sequence of n coefficient indices represented by a cost-determined sequence of (run, index derivative) pairs under a given quantization table and run-index derivative coding distribution, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value derived from a value of the index following the number of consecutive indices of the special value. The method comprises the steps of: (a) using the given quantization table and run-index derivative coding distribution to formulate a cost function for a plurality of possible sequences of (run, index derivative) pairs; (b) applying the cost function to each possible sequence in the plurality of possible sequences of (run, index derivative) pairs to determine an associated cost; and, (c) selecting the cost-determined sequence of (run, index derivative) pairs from the plurality of possible sequences of (run, index derivative) pairs based on the associated cost of each of the plurality of possible sequences of (run, index derivative) pairs; and encoding the corresponding selected cost-determined sequence of (run, index derivative) pairs using entropy coding based on a run-index derivative coding distribution.

In accordance with a second aspect of the present invention, there is provided a method of compressing a sequence of n coefficients by determining an output quantization table, a cost-determined sequence of n coefficient indices represented by a cost-determined sequence of (run, index derivative) pairs, and a run-index derivative coding distribution, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value (derived from a value of the index following the number of consecutive indices of the special value, and wherein a sequence of n coefficient indices, together with a quantization table, determines a sequence of n soft-decision quantized coefficients. The method comprises the steps of: (a) selecting a $0^{th}$ quantization table; (b) selecting a $0^{th}$ run-index derivative coding distribution; (c) setting a counter t equal to 0; (d) using a $t^{th}$ quantization table and run-index derivative coding distribution to formulate a $t^{th}$ cost function for a $t^{th}$ plurality of possible sequences of (run, index derivative) pairs; (e) applying the $t^{th}$ cost function to each possible sequence in the $t^{th}$ plurality of possible sequences of (run, index derivative) pairs to determine a $t^{th}$ associated cost; (f) selecting a $t^{th}$ cost-determined sequence of (run, index derivative) pairs from the $t^{th}$ plurality of possible sequences of (run, index derivative) pairs based on the $t^{th}$ associated cost; (g) if the $t^{th}$ cost-determined sequence of (run, index derivative) pairs together with the $t^{th}$ quantization table and run-index derivative coding distribution, meets a selection criterion, selecting the $t^{th}$ cost-determined sequence of (run, index derivative) pairs as the cost-determined sequence of n coefficient indices and the $t^{th}$ quantization table as the output quantization table, otherwise determining a $(t+1)^{th}$ quantization table and run-index derivative coding distribution from the $t^{th}$ cost-determined sequence of (run, index derivative) pairs, increasing t by one, and returning to step (d); and (h) encoding the corresponding selected cost-determined sequence of (run, index derivative) pairs using entropy coding based on $t^{th}$ run-index derivative coding distribution.

In accordance with a third aspect of the present invention, there is provided a method of compressing a sequence of sequences of n coefficients by jointly determining an output quantization table, an output run-index derivative distribution, and, for each sequence of n coefficients in the sequence of sequences of n coefficients, a final cost-determined sequence of coefficient indices represented by a final cost-determined sequence of (run, index derivative) pairs, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value derived from a value of the index following the number of consecutive indices of the special value, and wherein a sequence of coefficient indices together with a quantization table determines a sequence of n soft-decision quantized coefficients. The method comprises: (a) selecting a $0^{th}$ quantization table; (b) selecting a $0^{th}$ run-index derivative coding distribution; (c) setting a counter t equal to 0; (d) for each sequence of n coefficients in the sequence of sequences of n coefficients, (i) using a $t^{th}$ quantization table and run-index derivative coding distribution to formulate a $t^{th}$ cost function for an associated $t^{th}$ plurality of possible sequences of (run, index derivative) pairs; (ii) applying the cost function to each possible sequence in the associated $t^{th}$ plurality of possible sequences of (run, index derivative) pairs to determine an associated cost; (iii) selecting an associated $t^{th}$ cost-determined sequence of (run, index derivative) pairs from the associated $t^{th}$ plurality of possible sequences of (run, index derivative) pairs based on the associated cost; (e) after step (d), applying an aggregate cost function to the $t^{th}$ associated cost-determined sequence of (run, index derivative) pairs for each sequence of n coefficients in the sequence of sequences of n coefficients, to determine a $t^{th}$ aggregate cost; (f) if the $t^{th}$ aggregate cost meets a selection criterion, selecting the $t^{th}$ quantization table and run-index derivative coding distribution as the output quantization table and the output run-index derivative coding distribution, and, for each sequence of n coefficients in the sequence of sequences of n coefficients, the final cost-determined sequence of coefficient indices represented by the final cost-determined sequence of (run, index derivative) pairs as the associated $t^{th}$ sequence of (run, index derivative) pairs; otherwise determining a $(t+1)^{th}$ quantization table and run-index derivative coding distribution from the selected sequence of the $t^{th}$ cost-determined sequences of (run, index derivative) pairs, increasing t by one, and returning to step (d); and (g) encoding the corresponding selected sequences of (run, index derivative) pairs using Huffman coding.

In accordance with a fourth aspect of the present invention, there is provided a data processing system for compressing a sequence of n coefficients by determining a cost-determined sequence of n coefficient indices represented by a cost-determined sequence of (run, index derivative) pairs under a given quantization table and run-index derivative coding distribution, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value derived from a value of the index following the number of consecutive indices of the special value. The data processing system comprises: (a) initialization means for using the given quantization table and run-index derivative coding distribution to formulate a cost function for a plurality of possible sequences of (run, index derivative) pairs; and, (b) calculation means for applying the cost function to each possible sequence in the plurality of possible sequences of (run, index derivative) pairs to determine an associated cost, and for selecting the cost-determined sequence of (run, index derivative) pairs from the plurality of possible sequences of (run, index derivative) pairs based on the associated cost of each of the plurality of possible sequences of (run, index derivative) pairs; and encoding the corresponding selected cost-determined sequence of (run, index derivative) pairs using entropy coding based on a run-index derivative coding distribution.

In accordance with a fifth aspect of the present invention, there is provided a data processing system for compressing a sequence of n coefficients by determining an output quantization table, a cost-determined sequence of n coefficient indices represented by a cost-determined sequence of (run, index derivative) pairs, and a run-index derivative coding distribution, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value (derived from a value of the index following the number of consecutive indices of the special value, and wherein a sequence of n coefficient indices, together with a quantization table, determines a sequence of n soft-decision quantized coefficients. The data processing system comprises: (a) initialization means for selecting a $0^{th}$ quantization table and a 0th run-index derivative coding distribution, and setting a counter t equal to 0; (b) calculation means for (i) using a $t^{th}$ quantization table and run-index derivative coding distribution to formulate a $t^{th}$ cost function for a $t^{th}$ plurality of possible sequences of (run, index derivative) pairs; (ii) applying the $t^{th}$ cost function to each possible sequence in the $t^{th}$ plurality of possible sequences of (run, index derivative) pairs to determine a $t^{th}$ associated cost; (iii) selecting a $t^{th}$ cost-determined sequence of (run, index derivative) pairs from the $t^{th}$ plurality of possible sequences of (run, index derivative) pairs based on the $t^{th}$ associated cost; (iv) if the $t^{th}$ cost-determined sequence of (run, index derivative) pairs together with the $t^{th}$ quantization table and run-index derivative coding distribution, meets a selection criterion, selecting the $t^{th}$ cost-determined sequence of (run, index derivative) pairs as the cost-determined sequence of n coefficient indices and the $t^{th}$ quantization table as the output quantization table, otherwise determining a $(t+1)^{th}$ quantization table and run-index derivative coding distribution from the $t^{th}$ cost-determined sequence of (run, index derivative) pairs, increasing t by one, and returning to step (i); and (v) encoding the corresponding selected cost-determined sequence of (run, index derivative) pairs using entropy coding based on $t^{th}$ run-index derivative coding distribution.

In accordance with a sixth aspect of the present invention, there is provided a data processing system for compressing a sequence of sequences of n coefficients by jointly determining an output quantization table, an output run-index derivative distribution, and, for each sequence of n coefficients in the sequence of sequences of n coefficients, a final cost-determined sequence of coefficient indices represented by a final cost-determined sequence of (run, index derivative) pairs, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value derived from a value of the index following the number of consecutive indices of the special value, and wherein a sequence of coefficient indices together with a quantization table determines a sequence of n soft-decision quantized coefficients. The data processing system comprises: (a) initialization means for selecting a 0th quantization table, selecting a 0th run-index derivative coding distribution and setting a counter t equal to 0; (b) calculation means for, for each sequence of n coefficients in the sequence of sequences of n coefficients, (i) using a $t^{th}$ quantization table and run-index derivative coding distribution to formulate a $t^{th}$ cost function for an associated $t^{th}$ plurality of possible sequences of (run, index derivative) pairs; (ii) applying the cost function to each possible sequence in the associated $t^{th}$ plurality of possible sequences of (run, index derivative) pairs to determine an associated cost; (iii) selecting an associated $t^{th}$ cost-determined sequence of (run, index derivative) pairs from the associated $t^{th}$ plurality of possible sequences of (run, index derivative) pairs based on the associated cost; (iv) after steps (i) to (iii), applying an aggregate cost function to the $t^{th}$ associated cost-determined sequence of (run, index derivative) pairs for each sequence of n coefficients in the sequence of sequences of n coefficients, to determine a $t^{th}$ aggregate cost; (v) if the $t^{th}$ aggregate cost meets a selection criterion, selecting the $t^{th}$ quantization table and run-index derivative coding distribution as the output quantization table and the output run-index derivative coding distribution, and, for each sequence of n coefficients in the sequence of sequences of n coefficients, the final cost-determined sequence of coefficient indices represented by the final cost-determined sequence of (run, index derivative) pairs as the associated $t^{th}$ sequence of (run, index derivative) pairs; otherwise determining a $(t+1)^{th}$ quantization table and run-index derivative coding distribution from the selected sequence of the $t^{th}$ cost-determined sequences of (run, index derivative) pairs, increasing t by one, and returning to step (i); and (vi) encoding the corresponding selected sequences of (run, index derivative) pairs using Huffman coding.

In accordance with a seventh aspect of the present invention, there is provided a computer program product for use on a computer system to compress a sequence of n coefficients by determining a cost-determined sequence of n coefficient indices represented by a cost-determined sequence of (run, index derivative) pairs under a given quantization table and run-index derivative coding distribution, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value derived from a value of the index following the number of consecutive indices of the special value. The computer program product comprises a recording medium, and means recorded on the recording medium for instructing the computer system to perform the steps of (a) using the given quantization table and run-index derivative coding distribution to formulate a cost function for a plurality of possible sequences of (run, index derivative) pairs; (b) applying the cost function to each possible sequence in the plurality of possible sequences of (run, index derivative) pairs to determine an associated cost; and, (c) selecting the cost-determined sequence of (run, index derivative) pairs from the plurality of possible sequences of (run, index derivative) pairs based on the associated cost of each of the plurality of possible sequences of (run, index derivative) pairs; and encoding the corresponding selected cost-determined sequence of (run, index derivative) pairs using entropy coding based on a run-index derivative coding distribution.

In accordance with a eighth aspect of the present invention, there is provided a computer program product for use on a computer system to compress a sequence of n coefficients by determining an output quantization table, a cost-determined sequence of n coefficient indices represented by a cost-determined sequence of (run, index derivative) pairs, and a run-index derivative coding distribution, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value (derived from a value of the index following the number of consecutive indices of the special value, and wherein a sequence of n coefficient indices, together with a quantization table, determines a sequence of n soft-decision quantized coefficients. The computer program product comprising a recording medium and means recorded on the recording medium to instruct the computer system to perform the steps of (a) selecting a $0^{th}$ quantization table; (b) selecting a 0th run-index derivative coding distribution; (c) setting a counter t equal to 0; (d) using a $t^{th}$ quantization table and run-index derivative coding distribution to formulate a $t^{th}$ cost function for a $t^{th}$ plurality of possible sequences of (run, index derivative) pairs; (e) applying the $t^{th}$ cost function to each possible sequence in the $t^{th}$ plurality of possible sequences of (run, index derivative) pairs to determine a $t^{th}$ associated cost; (f) selecting a $t^{th}$ cost-determined sequence of (run, index derivative) pairs from the $t^{th}$ plurality of possible sequences of (run, index derivative) pairs based on the $t^{th}$ associated cost; (g) if the $t^{th}$ cost-determined sequence of (run, index derivative) pairs together with the $t^{th}$ quantization table and run-index derivative coding distribution, meets a selection criterion, selecting the $t^{th}$ cost-determined sequence of (run, index derivative) pairs as the cost-determined sequence of n coefficient indices and the $t^{th}$ quantization table as the output quantization table, otherwise determining a $(t+1)^{th}$ quantization table and run-index derivative coding distribution from the $t^{th}$ cost-determined sequence of (run, index derivative) pairs, increasing t by one, and returning to step (d); and (h) encoding the corresponding selected cost-determined sequence of (run, index derivative) pairs using entropy coding based on $t^{th}$ run-index derivative coding distribution.

In accordance with a ninth aspect of the present invention, there is provided a computer program product for use on a computer system to compress a sequence of sequences of n coefficients by jointly determining an output quantization table, an output run-index derivative distribution, and, for each sequence of n coefficients in the sequence of sequences of n coefficients, a final cost-determined sequence of coefficient indices represented by a final cost-determined sequence of (run, index derivative) pairs, wherein each sequence of (run, index derivative) pairs defines a corresponding sequence of coefficient indices such that (i) each index in the corresponding sequence of coefficient indices is a digital number, (ii) the corresponding sequence of coefficient indices includes a plurality of values including a special value, and (iii) each (run, index derivative) pair defines a run value representing a number of consecutive indices of the special value, and an index-based value derived from a value of the index following the number of consecutive indices of the special value, and wherein a sequence of coefficient indices together with a quantization table determines a sequence of n soft-decision quantized coefficients. The computer program product comprising a recording medium and means recorded on the recording medium to instruct the computer system to perform the steps of (a) selecting a 0th quantization table; (b) selecting a 0th run-index derivative coding distribution; (c) setting a counter t equal to 0; (d) for each sequence of n coefficients in the sequence of sequences of n coefficients, (i) using a $t^{th}$ quantization table and run-index derivative coding distribution to formulate a $t^{th}$ cost function for an associated $t^{th}$ plurality of possible sequences of (run, index derivative) pairs; (ii) applying the cost function to each possible sequence in the associated $t^{th}$ plurality of possible sequences of (run, index derivative) pairs to determine an associated cost; (iii) selecting an associated $t^{th}$ cost-determined sequence of (run, index derivative) pairs from the associated $t^{th}$ plurality of possible sequences of (run, index derivative) pairs based on the associated cost; (e) after step (d), applying an aggregate cost function to the $t^{th}$ associated cost-determined sequence of (run, index derivative) pairs for each sequence of n coefficients in the sequence of sequences of n coefficients, to determine a $t^{th}$ aggregate cost; (f) if the $t^{th}$ aggregate cost meets a selection criterion, selecting the $t^{th}$ quantization table and run-index derivative coding distribution as the output quantization table and the output run-index derivative coding distribution, and, for each sequence of n coefficients in the sequence of sequences of n coefficients, the final cost-determined sequence of coefficient indices represented by the final cost-determined sequence of (run, index derivative) pairs as the associated $t^{th}$ sequence of (run, index derivative) pairs; otherwise determining a $(t+1)^{th}$ quantization table and run-index derivative coding distribution from the selected sequence of the $t^{th}$ cost-determined sequences of (run, index derivative) pairs, increasing t by one, and returning to step (d); and (g) encoding the corresponding selected sequences of (run, index derivative) pairs using Huffman coding.

BRIEF DESCRIPTION OF THE DRAWINGS

A detailed description of the preferred embodiments is provided herein below with reference to the following drawings, in which:

FIGS. 6*a*, 6*b* and 6*c* is pseudo-code illustrating a graph-based optimization method in accordance with an aspect of the invention;

FIGS. 22a to 22d list pseudo-code illustrating a graph-based optimization method in accordance with a further aspect of the invention;

DETAILED DESCRIPTION OF ASPECTS OF THE INVENTION

Figure 1:
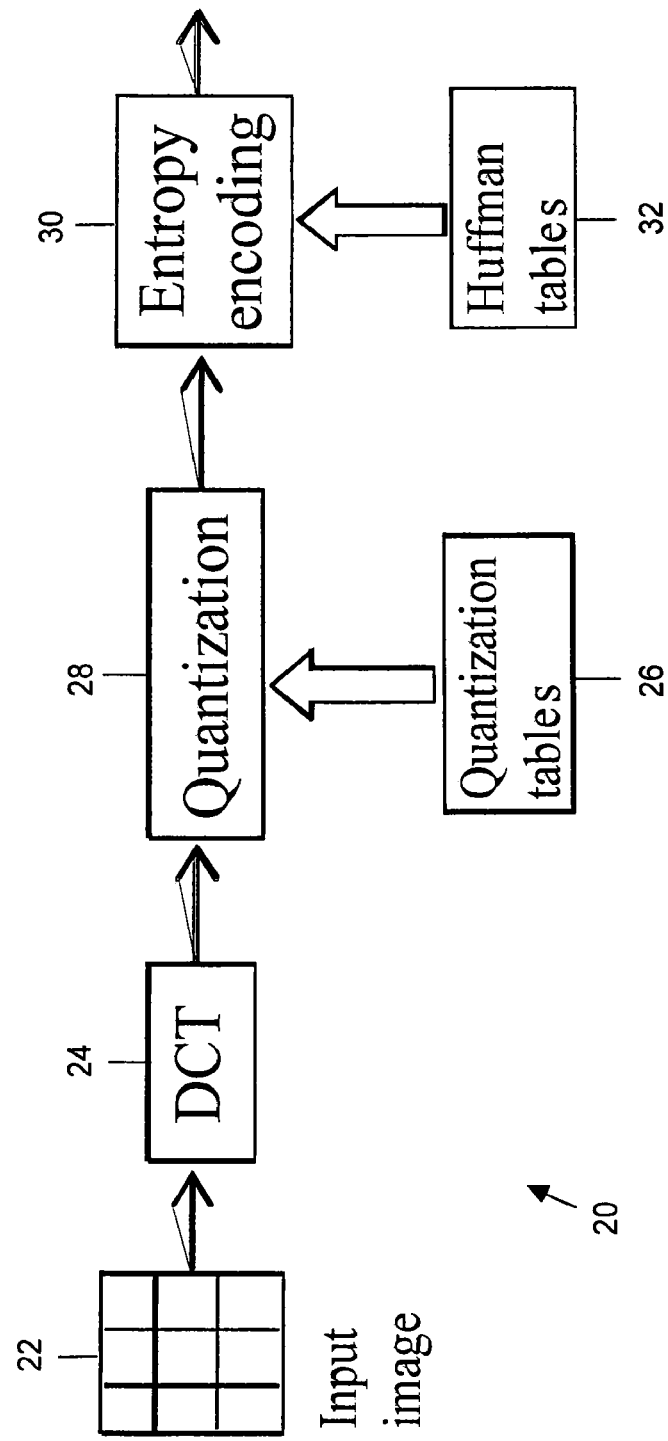
FIG. 1, in a block diagram, illustrates a JPEG encoder.

Section I: Joint Optimization of Run-Length Coding, Huffman Coding and Quantization Table with Complete Baseline JPEG Compatibility A JPEG encoder 20 executes three basic steps as shown in FIG. 1. The encoder 20 first partitions an input image 22 into 8×8 blocks and then processes these 8×8 image blocks one by one in raster scan order (baseline JPEG). Each block is first transformed from the pixel domain to the DCT domain by an 8×8 DCT 24. The resulting DCT coefficients are then uniformly quantized using an 8×8 quantization table 26. The coefficient indices from the quantization 28 are then entropy coded in step 30 using zero run-length coding and Huffman coding. The JPEG syntax leaves the selection of the quantization step sizes and the Huffman codewords to the encoder provided the step sizes must be used to quantize all the blocks of an image. This framework offers significant opportunity to apply rate-distortion (R-D) consideration at the encoder 20 where the quantization tables 26 and Huffman tables 32 are two free parameters the encoder can optimize.

Figure 2:
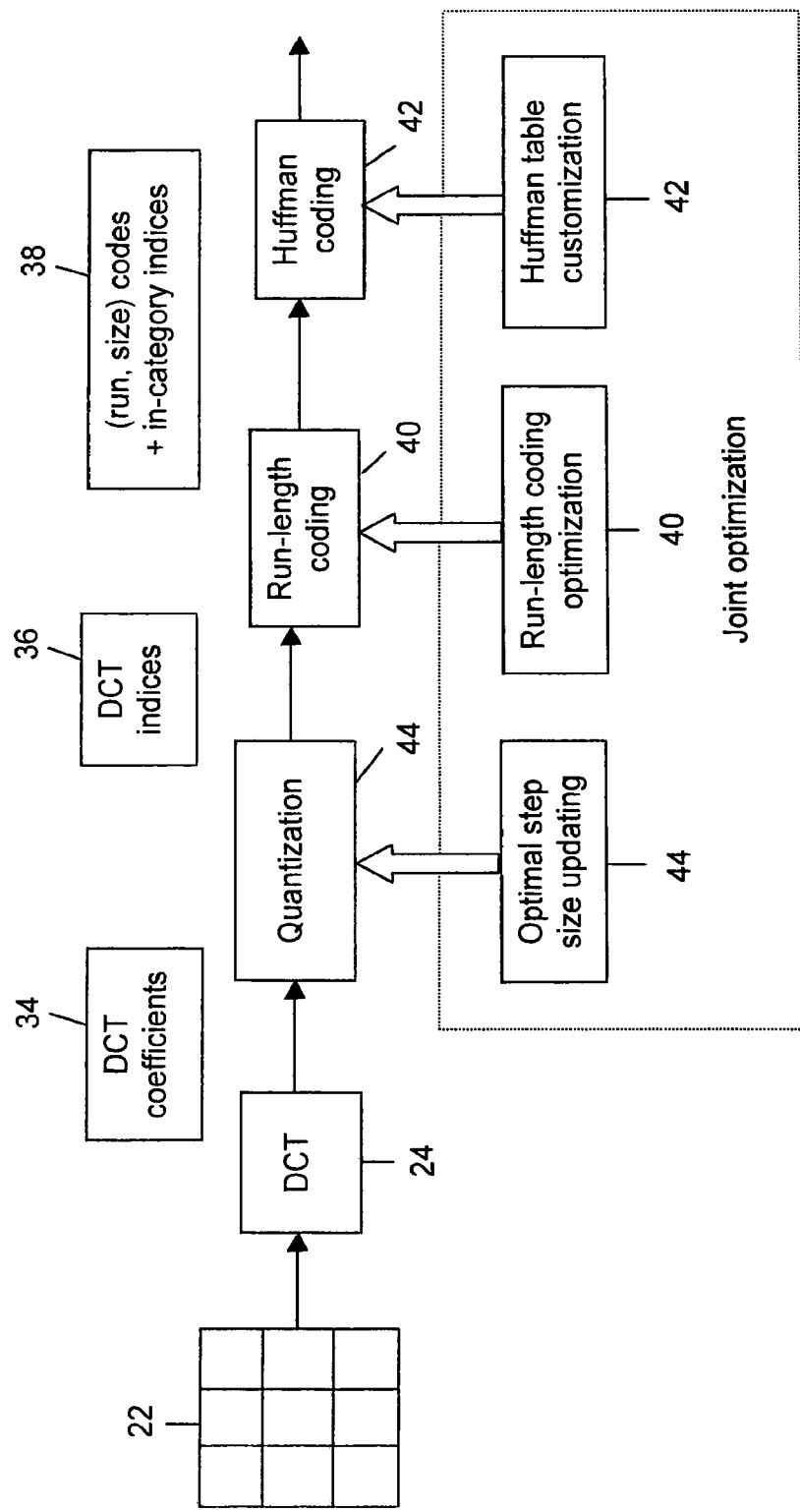
FIG. 2, in a block diagram, illustrates joint optimization of quantization, run-length coding and Huffman coding in accordance with an aspect of the present invention.

The third but somewhat hidden free parameter which the encoder can also optimize is the image data themselves. Depending on the stage where the image date are at during the whole JPEG encoding process, the image data take different forms as shown in FIG. 2. Before hard decision quantization, they take the form of DCT coefficients 34; after hard decision quantization, they take the form of DCT indices 36, i.e., quantized DCT coefficients normalized by the used quantization step size; after zigzag sequencing and run-length coding, they take the form of run-size pairs followed by integers specifying the exact amplitude of DCT indices within respective categories—(run, size) codes and in-category indices 38. (For clarity, we shall refer to such integers as in-category indices.) Note that DCT indices, together with quantization step sizes, determine quantized DCT coefficients. Although the JPEG syntax allows the quantization tables to be customized at the encoder, typically some scaled versions of the example quantization tables given in the standard—see reference [1]—(called default tables) are used. The scaling of the default tables is suboptimal because the default tables are image-independent and the scaling is not image-adaptive either. Even with an image-adaptive quantization table, JPEG must apply the same table for every image block, indicating that potential gain remains from optimizing the coefficient indices, i.e., DCT indices. Note that hard decision quantization plus coefficient index optimization amounts to soft decision quantization. Since the coefficient indices can be equally represented as run-size pairs followed by in-category indices through run-length coding, we shall simply refer to coefficient index optimization as run-length coding optimization in parallel with step size and Huffman coding optimization. As described below, we not only propose a very neat, graph-based run-length code optimization scheme, but also present an iterative optimization scheme for jointly optimizing the run-length coding, Huffman coding and quantization step sizes as in steps 40, 42 and 44, respectively, of FIG. 2.

Formal Problem Definition

We now formulate our joint optimization problem, where the minimization is done over all the three free parameters in the baseline JPEG. We only consider the optimization of AC coefficients in this section. The optimization of DC coefficients will be discussed below.

Given an input image $I_0$ and a fixed quantization table Q in the JPEG encoding, the coefficient indices completely determine a sequence of run-size pairs followed by in-category indices for each 8×8 block through run-length coding, and vice versa. Our problem is posed as a constrained optimization over all possible sequences of run-size pairs (R, S) followed by in-category indices ID, all possible Huffman tables H, and all possible quantization tables Q $$\min_{(R,S,ID),H,Q} d(I_0, (R, S, ID)_Q) \text{ subject to } r[(R, S), H] \le r_{budget} \quad (10)$$

or equivalently $$\min_{(R,S,ID),H,Q} r[(R, S), H] \text{ subject to } d[I_0, (R, S, ID)_Q] \le d_{budget} \quad (11)$$

where $d[I_0,(R,S,ID)_Q]$ denotes the distortion between the original image $I_0$ and the reconstructed image determined by (R,S,ID) and Q over all AC coefficients, and $r[(R,S),H]$ denotes the compression rate for all AC coefficients resulting from the chosen sequence (R, S, ID) and the Huffman table H. In (10) and (11), respectively, $r_{budget}$ and $d_{budget}$ are respectively the rate constraint and distortion constraint. With the help of the Lagrange multiplier, we may convert the rate-constrained problem or distortion constrained problem into the following unconstrained problem $$\min_{(R,S,ID),H,Q} \{J(\lambda) = d[I_0, (R, S, ID)_Q] + \lambda \cdot r[(R, S), H]\} \quad (12)$$

where the Lagrangian multiplier $\lambda$ is a fixed parameter that represents the tradeoff of rate for distortion, and $J(\lambda)$ is the Lagrangian cost. This type of optimization fails into the category of so-called fixed slope coding advocated in E.-h. Yang, Z. Zhang, and T. Berger, "Fixed slope universal lossy data compression," IEEE Trans. Inform. Theory, vol. 43, pp. 1465-1476, September 1997 (hereinafter "reference [10]") and E.-h. Yang and Z. Zhang, "Variable-rate trellis source coding." IEEE Trans. Inform. Theory, vol. 45, pp. 586-608, March 1999 (hereinafter "reference [11]").

It is informative to compare our joint optimization problem with the joint thresholding and quantizer selection—see references [8] and [9]. On one hand, both of them are an iterative process aiming to optimize the three parameters jointly. On the other hand, our scheme differs from that considered—see references [8] and [9]—in two distinct aspects. First, we consider the full optimization of the coefficient indices or the sequence (R,S,ID) instead of a partial optimization represented by dropping only insignificant coefficient indices as considered—see references [8] and [9]. As we shall see in the next subsection, it turns out that the full optimization has a very neat, computationally effective solution. This is in contrast with the partial optimization for which a relatively time-consuming and cumbersome solution was proposed—see references [7], [8] and [9]. Second, we do not apply any time-consuming quantizer selection schemes to find the R-D optimal step sizes in each iteration. Instead, we use the default quantization table as a starting point and then update the step sizes efficiently in each iteration for local optimization of the step sizes.

Problem Solutions

The rate-distortion optimization problem (12) is a joint optimization of the distortion, rate, Huffman table, quantization table, and sequence (R,S,ID). To make the optimization problem tractable, we propose an iterative algorithm that chooses the sequence (R,S,ID), Huffman table, and quantization table iteratively to minimize the Lagrangian cost of (12), given that the other two parameters are fixed. Since a run-size probability distribution P completely determines a Huffman table, we use P to replace the Huffman table H in the optimization process. The iteration algorithm can be described as follows:

1) Initialize a run-size distribution $P_0$ from the given image $I_0$ and a quantization table $Q_0$. The application of this pre-determined quantization table $Q_0$ to $I_0$ is referred to as hard-quantization, in that quantization is image-independent. (As an example, the initial run-size distribution $P_0$ could be the empirical distribution of the sequence of (run, size) pairs obtained from using a hard-decision quantizer given by the initial $Q_0$ to quantize the DCT coefficients of $I_0$.) Set t=0, and specify a tolerance $\epsilon$ as the convergence criterion.

2) Fix $P_t$ and $Q_t$ for any t≥0. Find an optimal sequence $(R_t,S_t,ID_t)$ that achieves the following minimum $$\min_{R,S,ID} \{J(\lambda) = d[I_0, (R, S, ID)_{Q_t}] + \lambda \cdot r[(R, S), P_t]\}.$$

Denote $d[I_0,(R_t,S_t,ID_t)_{Q_t}]+\lambda \cdot r[(R_t,S_t),P_t]$ by $J^t(\lambda)$.

3) Fix $(R_t,S_t,ID_t)$. Update $Q_t$ and $P_t$ into $Q_{t+1}$ and $P_{t+1}$, and respectively so that $Q_{t+1}$ and $P_{t+1}$ together achieve the following minimum $$\min_{(Q,P)} \{J(\lambda) = d[I_0, (R_t, S_t, ID_t)_Q] + \lambda \cdot r[(R_t, S_t), P]\}$$

where the above minimization is taken over all quantization tables Q and all run-size probability distributions P. Note that $P_{t+1}$ can be selected as the empirical run-size distribution of $(R_t,S_t)$.

4) Repeat Steps 2) and 3) for t=0, 1, 2, ... until $J^t(\lambda)-J^{t+1}(\lambda) \leq \epsilon$. Then output $(R_{t+1},S_{t+1},ID_{t+1}),Q_{t+1}$, and $P_{t+1}$.

Since the Lagrangian cost function is non-increasing at each step, convergence is guaranteed. The core of the iteration algorithm is Step 2) and Step 3), i.e., finding the sequence (R,S,ID) to minimize the Lagrangian cost $J(\lambda)$ given Q and P, and updating the quantization step sizes with the new indices of the image. These two steps are addressed separately as follows.

Graph-based Run-length Coding Optimization

As mentioned above, JPEG quantization lacks local adaptivity even with an image-adaptive quantization table, which indicates that potential gain remains from the optimization of the coefficient indices themselves. This gain is exploited in Step 2). Optimal thresholding—see reference [7]—only considers a partial optimization of the coefficient indices, i.e., dropping less significant coefficients in the R-D sense. We propose an efficient graph-based optimal path searching algorithm to optimize the coefficient indices fully in the R-D sense. It can not only drop less significant coefficients, but also can change them from one category to another—even changing a zero coefficient to a small nonzero coefficient is possible if needed in the R-D sense. In other words, our graph-based optimal path searching algorithm finds the optimal coefficient indices (or equivalently, the optimal run-size pairs) among all possible coefficient indices (or equivalently, among all possible run-size pairs) to minimize the Lagrangian cost. Since given Q and P, the Lagrangian cost $J(\lambda)$ is block-wise additive, the minimization in Step 2) can be solved in a block by block manner. That is, the optimal sequence (R,S,ID) can be determined independently for every 8×8 image block. Thus, in the following, we limit our discussion to only one 8×8 image block.

Figure 3:
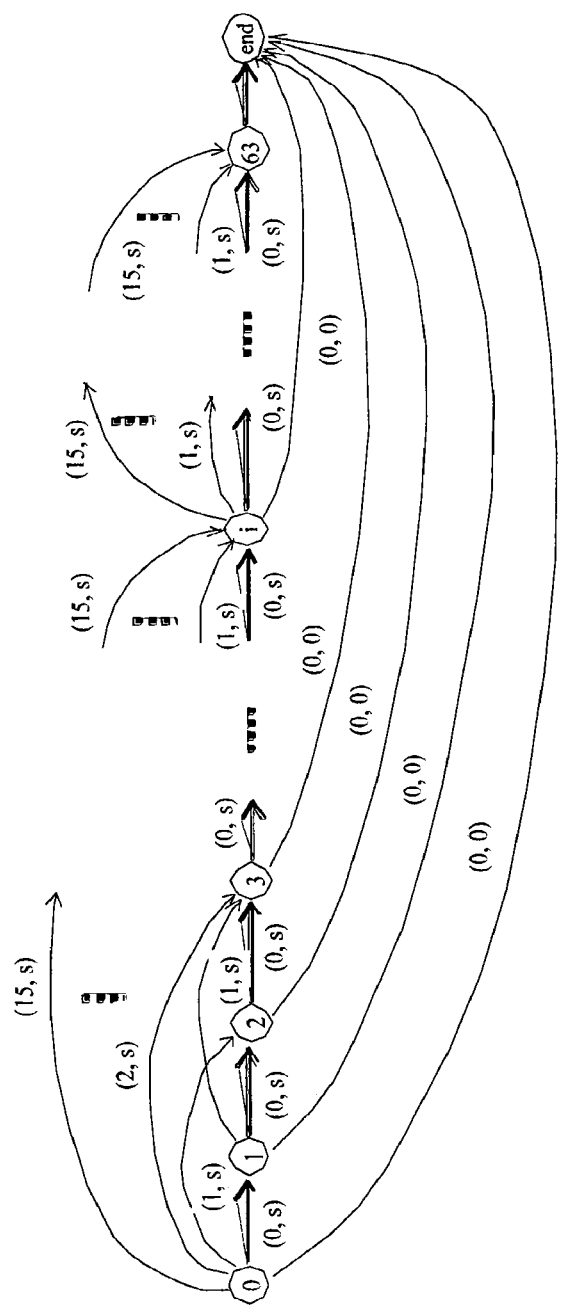
FIG. 3 illustrates a directed graph for representing different possible coefficient indices (or, equivalently, their run-size pairs) in accordance with an aspect of the present invention.

Let us define a directed graph with 65 nodes (or states). As shown in FIG. 3, the first 64 states, numbered as i=0, 1, ... 63, correspond to the 64 coefficient indices of an 8×8 image block in zigzag order. The last state is a special state called the end state, and will be used to take care of EOB (end-of-block). Each state i(i≤63) may have incoming connections from its previous 16 states j(j<i), which correspond to the run, R, in an (R,S) pair. (In JPEG syntax, R takes value from 0 to 15.) The end state may have incoming connections from all the other states with each connection from state i(i≤62) representing the EOB code, i.e., code (0,0) after the $i^{th}$ coefficient. State 63 goes to the state end without EOB code. For a given state i(i≤63) and its predecessor i−r−1 (0≤r≤15), there are 10 parallel transitions between them which correspond to the size group, S, in an (R,S) pair. For simplicity, we only draw one transition in the graph shown in FIG. 3; the complete graph needs the expansion of S. For each state i where i>15, there is one more transition from state i−16 to i which corresponds to the pair (15,0), i.e., ZRL (zero run length) code. We assign to each transition (r,s) from state i−r−1 to state i a cost which is defined as the incremental Lagrangian cost of going from state i−r−1 to state i when the $i^{th}$ DCT coefficient is quantized to size group s (i.e., the coefficient index needs s bits to represent its amplitude) and all the r DCT coefficients appearing immediately before the $i^{th}$ DCT coefficient are quantized to zero. Specifically, this incremental cost is equal to $$\sum_{j=i-r}^{i-1} C_j^2 + |C_i - q_i \cdot ID_i|^2 + \lambda \cdot (-\log_2 P(r, s) + s) \quad (13)$$

Where $C_j$, j=1, 2, ... 63, are the $j^{th}$ DCT coefficient, $ID_i$ is the in-category index corresponding to the size group s that gives rise to the minimum distortion to $C_i$ among all in-category indices within the category specified by the size groups, and $q_i$ is the $i^{th}$ quantization step size. Similarly, for the transition from state i(i≤62) to the end state, its cost is defined as $$\sum_{j=i+1}^{63} C_j^2 + \lambda \cdot (-\log_2 P(0, 0)) \quad (14)$$

No cost is assigned to the transition from state 63 to the end state.

Figure 4:
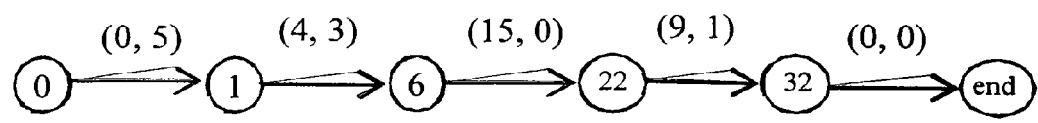
FIG. 4 illustrates a sequence of connections and nodes from the graph of FIG. 3.

It is not hard to see that with the above definitions, every sequence of run-size pairs of an 8×8 block corresponds to a path from state 0 to the end state with a Lagrangian cost. For example, the sequence of run-size pairs (0, 5), (4, 3), (15, 0), (9, 1), (0, 0) of a block corresponds to a path shown in FIG. 4. On the other hand, not all paths from state 0 to the end state in the directed graph represent a legitimate sequence of run-size pairs of an 8×8 block. We shall call such paths illegitimate paths. For instance, the path consisting of a transition (0,5) from state 0 to state 1 followed by a transition (15,0) from state 1 to state 17 and a transition (0,0) from state 17 to the end state is an illegitimate path, and does not represent a legitimate sequence of run-size pairs of an 8×8 block. However, it is not hard to see that for any illegitimate path, there is always a legitimate path the total Lagrangian cost of which is strictly less than that of the illegitimate path. Therefore, the optimal path from state 0 to the end state with the minimum total Lagrangian cost among ALL possible paths including both legitimate paths and illegitimate paths is always a legitimate path. Furthermore, the optimal path, together with its corresponding in-category indices as determined in (13), achieves the minimum in Step 2) for any given Q, P and 8×8 block. As such, one can apply a fast dynamic programming algorithm to the whole directed graph to find the optimal sequence (R,S, ID) for the given 8×8 block. It should be pointed out that baseline JPEG syntax will not generate an (R, S) sequence ended by (15, 0) for an 8×8 block. Theoretically, the optimal (R, S) sequence found by our dynamic programming may end by (15,0) through state 63 even though it is very unlikely to occur in real applications (it might occur when the entropy rate of (15, 0) is less than the entropy rate of (0, 0)). However, an (R, S) sequence ended by (15, 0) through state 63 is a legitimate path and can be encoded/decoded correctly by baseline JPEG syntax.

A more elaborate step-by-step description of the algorithm follows. As an initialization, the algorithm pre-calculates $\lambda \cdot (-\log_2 P(r,s)+s)$ for each run-size pair (r,s) based on the given run-size distribution P. It also recursively pre-calculates, for each state i, the distortion resulting from dropping the preceding 1 to 15 coefficients before the state and the remaining cost of ending the block at the state. The algorithm begins with state 0 (DC coefficient). The cost of dropping all AC coefficients is stored in $J_0$. Then, one proceeds to state 1 (the first AC coefficient). There are ten paths to state 1 which all start from state 0. These ten paths correspond to the 10 size categories that the first AC index may fall into. The cost associated with each path is calculated using equation (13), where the first term in (13) is also pre-calculated, and $ID_i$ is determined as follows. For simplicity, we only consider positive indices here; negative indices are processed similarly by symmetry. Suppose $ID'_i$ is the output of the hard-decision quantizer with step size $q_i$ in response to the input $C_i$, and it falls into the category specified by s'. If s=s', $ID_i$ is chosen as $ID'_i$ since it results in the minimum distortion for $C_i$ in this size group. If s<s', $ID_i$ is chosen as the largest number in size group s since this largest number results in the minimum distortion in this group. Similarly, if s>s', $ID_i$ is chosen as the smallest number in size group s. After the ten incremental costs have been computed out, we can find the minimum cost to state 1 from state 0 and record this minimum cost as well as the run-size pair (r,s) which results in this minimum to state 1. Then, the cost of dropping all coefficients from 2 to 63 is added to the minimum cost of state 1. This sum is stored in $J_1$, which is the total minimum cost of this block when the first AC coefficient is the last nonzero coefficient to be sent. Proceeding to state 2, there are 110 paths to state 2 from state 0. Among them, ten paths go to state 2 from state 0 directly and 100 paths go to state 2 from state 0 through state 1 (10 times 10). The most efficient way of determining the best path that ends in state 2 is to use the dynamic programming algorithm. Since the minimum costs associated with ending at state 0 and state 1 are known, the job of finding the minimum cost path ending in state 2 is simply to find the minimum incremental costs of going from state 0 to state 2 and from state 1 to state 2. Add these two minimum incremental costs to the minimum costs of state 0 and 1 respectively; the smaller one between the two sums is the minimum cost of state 2. This minimum cost and the run-size pair (r,s) which results in this minimum cost are stored in state 2. Then, the cost of dropping all coefficients from 3 to 63 is added to the minimum cost of state 2. This sum is stored in $J_2$, which is the total minimum cost of this block when the second AC coefficient is the last nonzero coefficient to be sent. Note that, if the minimum path to state 2 is from state 0 directly, the stored r in the stored run-size pair (r,s) of state 2 is 1, which means the first AC is quantized or forced to zero. If the minimum path to state 2 is from state 1, the stored r is 0, which means the first AC index is nonzero. The recursion continues to the third coefficient and so on until the last coefficient at position 63 is done. At this point, we compare the values of $J_k$, k=0, 1, . . . 63, and find the minimum value, say, $J_k$ for some k*. By backtracking from k* with the help of the stored pairs (r,s) in each state, one can find the optimal path from state 0 to the end state with the minimum cost among all the possible paths, and hence the optimal sequence (R,S,ID) for the given 8×8 block. A pseudo-code of this algorithm is illustrated in FIGS. 6a, 6b and 6c.

The above procedure is a full dynamic programming method. To further reduce its computational complexity, we can modify it slightly. In particular, in practice, we do not have to compare the incremental costs among the 10 or 11 parallel transitions from one state to another state. Instead, it may be sufficient for us to compare only the incremental costs among the transitions associated with size group s−1, s, and s+1, where s is the size group corresponding to the output of the given hard-decision quantizer. Transitions associated with other groups most likely result in larger incremental costs. We shall compare the complexity and performance difference of these two schemes in the experimental results described below.

Optimal Quantization Table Updating

To update the quantization step sizes in Step 3), we need to solve the following minimization problem $$\min_Q d[I_0, (R, S, ID)_Q]$$

since the compression rate does not depend on Q once (R,S, ID) is given, where $I_0$ denotes the original input image to be compressed, and $Q=(q_0, q_1, \ldots, q_{63})$ represents a quantization table. Let $C_{i,j}$ denote the DCT coefficient of $I_0$ at the $i^{th}$ position in the zigzag order of the $j^{th}$ block. The sequence (R,S,ID) determines DCT indices, i.e., quantized DCT coefficients normalized by the quantization step sizes. Let $K_{i,j}$ denote the DCT index at the $i^{th}$ position in the zigzag order of the $j^{th}$ block obtained from (R,S,ID). Then the quantized DCT coefficient at the $i^{th}$ position in the zigzag order of the $j^{th}$ block is given by $K_{i,j}q_i$. With help of $C_{i,j}$ and $K_{i,j}q_i$, we can rewrite $d[I_0,(R,S,ID)_Q]$ as $$d[I_0, (R, S, ID)_Q] = \sum_{i=1}^{63} \sum_{j=1}^{Num\_Blk} (C_{i,j} - K_{i,j}q_i)^2 \quad (15)$$

where Num_Blk is the number of 8×8 blocks in the given image.

From (15), it follows that the minimization of $d[I_0,(R,S,ID)_Q]$ can be achieved by minimizing independently the inner summation of (15) for each i=1, 2, ..., 63. Our goal is to find a set of new quantization step size $\hat{q}_i(1 \le i \le 63)$ to minimize $$\min_{\hat{q}_i} \sum_{j=1}^{Num\_Blk} (C_{i,j} - K_{i,j}\hat{q}_i)^2, \quad (16)$$

$$i = 1, \ldots, 63$$

Equation (16) can be written as $$\min_{\hat{q}_i} \sum_{j=1}^{Num\_Blk} C_{i,j}^2 - 2C_{i,j}K_{i,j}\hat{q}_i + K_{i,j}^2\hat{q}_i^2, \quad (17)$$

$$i = 1, \ldots, 63$$

The minimization of these quadratic functions can be evaluated by taking the derivative of (17) with respect to $\hat{q}_i$. The minimum of (16) is obtained when $$q = \frac{\sum_{j=1}^{Num\_Blk} C_{i,j} \cdot K_{i,j}}{\sum_{j=1}^{Num\_Blk} K_{i,j}^2}, \quad (18)$$

$$i = 1, \ldots, 63$$

The step sizes in Step 3) can be updated accordingly.

Trellis-based DC Optimization

In this subsection, we consider the joint optimization of the quantized DC coefficients with the quantization step size and Huffman table. In JPEG syntax, the quantized DC coefficients are coded differentially, using a one-dimensional predictor, which is the previous quantized DC value. Since the cost of encoding a quantized DC coefficient only depends on the previous quantized DC coefficient, a trellis can be used in the joint optimization.

Figure 5:
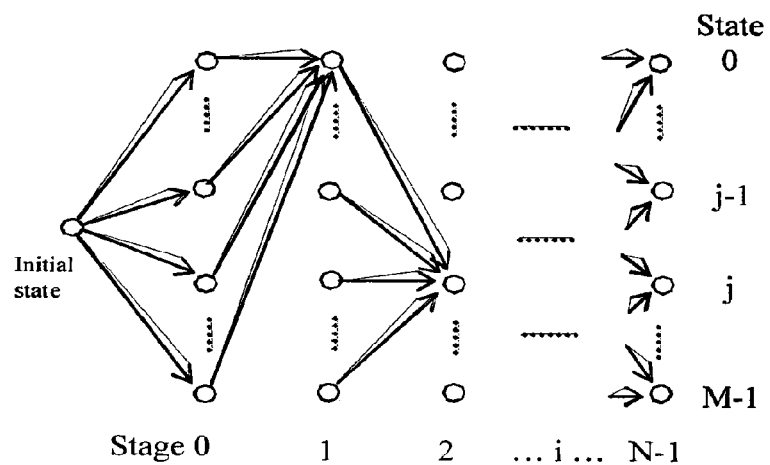
FIG. 5 illustrates a trellis structure for representing distinct values a DC index can take for a sequence of n coefficients in accordance with a further aspect of the present invention.

Let us define a trellis with N stages, which correspond to the number of DC coefficients, i.e., the number of 8×8 blocks in a restart interval (the DC coefficient prediction is initialized to 0 at the beginning of each restart interval and each scan—see reference [1]). Each stage has M states, which correspond to the distinct values a DC index can take, and states in adjacent stages are fully connected, as shown in FIG. 5. Every state in each stage is associated with a cost which is the minimum cost to this state from the initial state. The process of finding the optimal DC index sequence starts from stage 0 until stage N−1. At stage N−1, the state with the minimum cost is sorted out and the optimal path from stage 0 to stage N−1 with the minimum cost is traced out backward, yielding the optimal DC index sequence.

A more elaborate step-by-step description of the process follows. Let x(i,j) denote the $j^{th}$ state in stage i (0≤i≤N−1, 0≤j≤M−1) and v(i,j) represent the DC index value corresponding to state x(i,j). Let cost_mini (i,j) denote the minimum cost to x(i,j) from the initial state. Let cost_inc (i−1,j',i,j) represent the incremental cost from x(i−1,j) to x(i,j), which is defined as $$\text{cost\_inc}(i-1,j',i,j) = |DC_i - q_0 \cdot v(i,j)|^2 + \lambda \cdot (-\log_2 P(S) + S) \quad (19)$$

where $q_0$ is the quantization step size for DC coefficients, $DC_i$ is the $i^{th}$ DC coefficient, S is the group category of the difference |v(i,j)−v(i−1,j')| and P(S) is its probability among the 12 size categories (0≤S≤11). The cost associated with the initial state is set to zero. We start from stage 0. Since each state only has one incoming path, the cost to each state in stage 0 is the incremental cost from the initial state. Then, we proceed to stage 1 and start with state 0. There are M incoming paths to x(1,0) from x(0,j')(0≤j'≤M−1). The M incremental costs (i.e., cost_inc (0,j',1,0) are calculated using equation (19) and these M incremental costs are added to the M minimum costs associated with the M states at stage 0, respectively. The minimum is sorted out and recorded as cost_mini (1,0) for state x(1,0). The optimal predecessor is also recorded for the purpose of backtracking. In the same manner, we need to find cost_mini (1,j)(1≤j≤M−1) and the optimal predecessors for other M−1 states in stage 1. This procedure continues to stage 2 and so on until stage N−1. At this point, we can find j* with the smallest cost_mini (N−1,j) for 0≤j≤M−1. This cost-mini (N−1,j*) is the minimum cost of the optimal path from the initial state to stage N−1. By backtracking from j* with the help of the stored optimal predecessor in each state, one can find the optimal path from the initial state to stage N−1, hence, the optimal DC index sequence.

After the optimal sequence of DC indices is obtained, we may update P(S) and the quantization step size $q_0$ in the same manner as discussed above. Then the optimization process is iterated as we did for the joint optimization of the quantized AC coefficients with the quantization step size and Huffman table.

A DC index can take up to 2047 different values (−1023 to 1023) in baseline JPEG, which requires 2047 states in each stage. This large number of states not only increases the complexity of the above algorithm but also demands plenty of storage locations. In practice, if a DC coefficient is soft-quantized to a value that is far from the output of a hard-decision quantizer, it most likely results in a higher cost path. Therefore, in the real implementation of the trellis-based DC optimization, we may only set a small number of states which correspond to the DC indices that are around the output of a hard-decision quantizer. For example, we may only use 33 states in each stage with the middle state corresponding to the output of a hard-decision quantizer, and the upper and lower 16 states respectively corresponding to the 16 neighboring indices that are larger or smaller than the output of the hard-decision quantizer. This reduces the computation complexity and memory requirement significantly with only a slight degradation of the performance.

Figure 7:
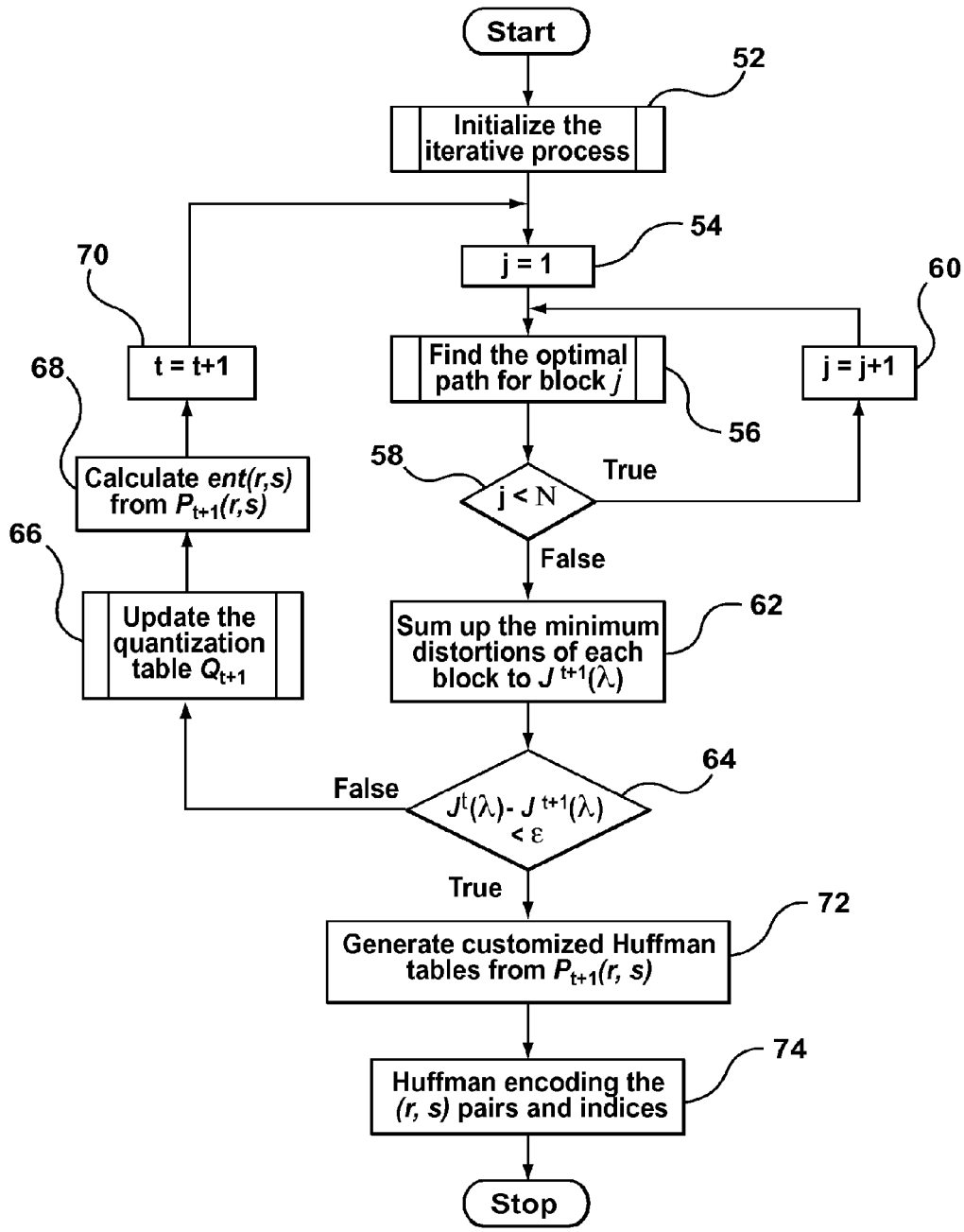
FIG. 7, in a flowchart, illustrates a process for jointly optimizing run-length coding, Huffman coding and quantization table in accordance with an aspect of the present invention.

A process for jointly optimizing the run-length coding, Huffman coding and quantization table in accordance with an aspect of the invention is shown in the flowchart of FIG. 7. At step 52, the iterative process is initialized, as outlined in detail in the flowchart of FIG. 8. At step 54, j, the index representing the $j^{th}$ block of N total blocks is set to 1. At step 56, the process determines the optimal path for block j, in this case, the first block. This is outlined in detail in the flowchart of FIG. 9. At query 58, it is determined whether j is the final block. This is achieved by comparing j to N (the total number of blocks). Where j is less than N, j is incremented in step 60.

The process of finding the optimal path for each block j continues until j=N. When j=N, an optimal path for each of the N blocks will have been determined. The $(t+1)^{th}$ value of $J(\lambda)$ is computed in step 62 as the sum of the minimum distortions associated with each of the N blocks. This value is then compared against the $t^{th}$ value of $J(\lambda)$ in query 64. Where the difference between the $t^{th}$ value of $J(\lambda)$ and the $(t+1)^{th}$ value of 4) is less than $\epsilon$ (the selection criterion, or more specifically, the convergence criterion), the optimization is considered complete. Where this is not the case, the joint optimization process moves to step 66 and quantization table $Q_{t+1}$ is updated, as outlined in detail in the flowchart of FIG. 12.

At step 68, the $(t+1)^{th}$ probability distribution function is used to calculate the entropy rate associated with run-size pair (r,s). At step 70, index t is incremented and an additional iteration is subsequently performed. Where it was determined that the selection criterion was satisfied in query 64, the $(t+1)^{th}$ probability distribution function associated with run-size pair (r,s) is used to generate customized Huffman tables in step 72. Step 74 uses these customized Huffman tables to encode the run-size pairs and indices. The process for jointly optimizing the run-length coding, Huffman coding and quantization table are complete.

Figure 8:
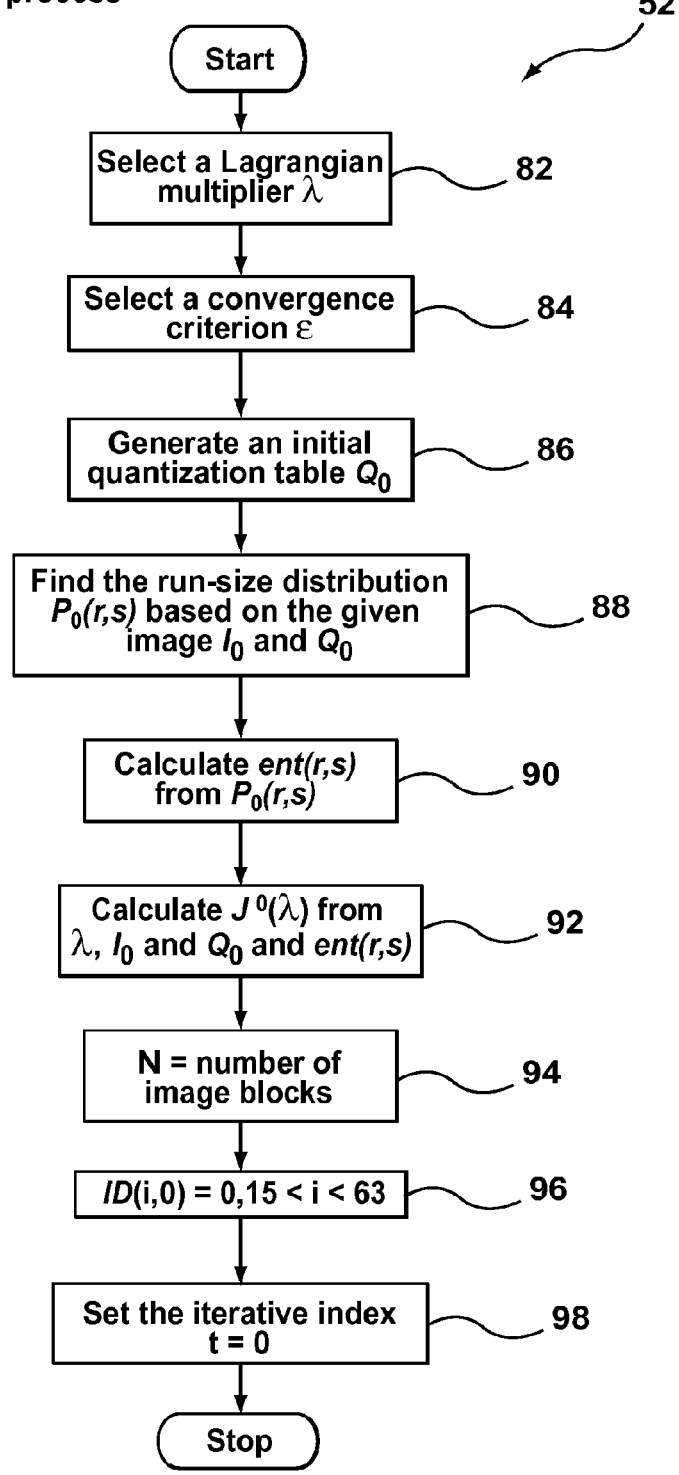
FIG. 8, in a flowchart, illustrates an initialization of an iterative process of the process of FIG. 7.

Referring now to the flowchart of FIG. 8, the initialization of the iterative process in step 52 of the flowchart of FIG. 7 is described in more detail. At step 82, a Lagrangian multiplier, $\lambda$, is selected. This is a fixed parameter that represents the trade off of rate for distortion. At step 84, the convergence criterion $\epsilon$ is selected. This is the amount by which the difference of the Lagrangian costs, $J^t(\lambda)$, of successive iterations must be below for the iteration to be deemed successful and complete.

In step 86, an initial quantization table $Q_0$ is generated. Step 88 uses the given image $I_0$ and the quantization table $Q_0$ generated in the previous step to determine the run-size distribution $P_0(r,s)$. At step 90, this run-size distribution is then used to calculate the entropy rate associated with the run-size pair (r,s). At step 92, the initial Lagrangian cost $J^0(\lambda)$ is calculated based on the original DCT coefficients and the Lagrangian multiplier $\lambda$, the quantization table $Q_0$, and the entropy rate associated with run-size pair (r,s). At step 94, N is set to be equal to the number of image blocks and at step 96, ID(i,0), the index to be sent for the $i^{th}$ DCT coefficient when the index is forced to size group 0, for 15<i<63, is set to 0. Finally, at step 98, the iterative index t is set equal to 0 and the process of initializing the iterative process is complete.

Figure 9:
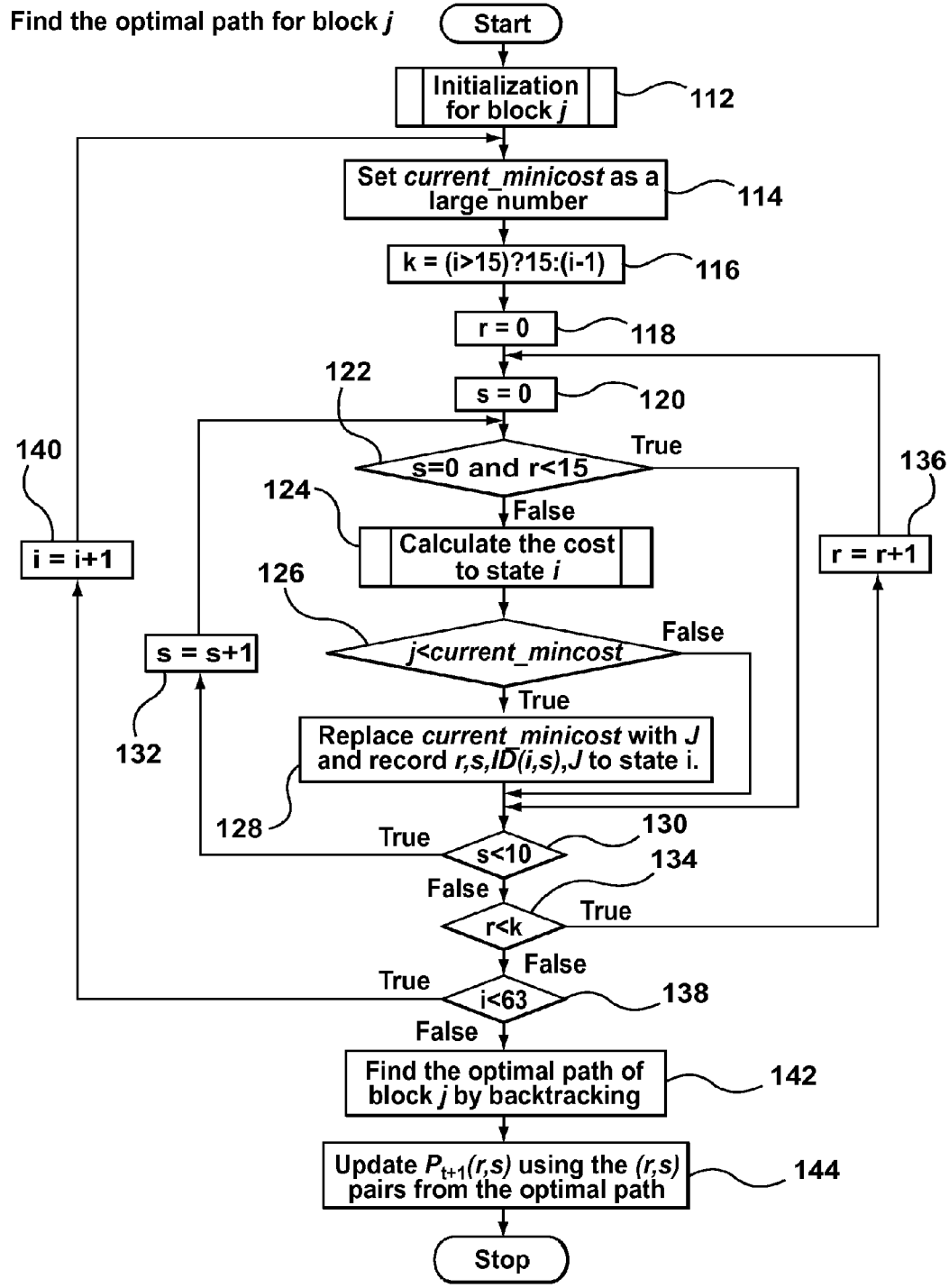
FIG. 9, in a flowchart, illustrates a process for determining an optimal path for a particular block in the process of FIG. 7.

Referring now to the flowchart of FIG. 9, the process for determining the optimal path for block j of step 56 in the flowchart of FIG. 7 is described in more detail. At step 112, block j is initialized, as outlined in detail in the flowchart of FIG. 10. At step 114, current_minicost, the variable that stores the current lowest Lagrangian cost to state i for block j is set to a large number. At step 116, variable k is assigned a value to represent the number of incoming connections from previous states. Where i>15, k is assigned a value of 15. Where i≤15, k=i−1. At step 118, r, the variable associated with run, is set equal to 0 and at step 120, s, the variable associated with size group, is set to 0.

At query 122, the process determines whether both of the relations s=0 and r<15 are true. Where this is not the case, the cost to state i is calculated in step 124, as outlined in more detail in the flowchart of FIG. 11. At query 126, the cost to state i is compared to the current minimum cost, current_minicost. Where J, the cost to state i is less than current_minicost, current_minicost is replaced with J and the variables r, s, id(i,s) and J are stored to state i in step 128.

From step 128, as well as from query 126 when the current cost was not less than current_minicost and from query 122 when it was found that s=0 and r<15 held true, the process proceeds to query 130, which asks whether s is less than 10. Where s<10, s is incremented at step 132 and the iteration associated with calculating the cost to state i is repeated with the updated variables. Where s≤10 in query 130, query 134 asks whether r is less than k. Where r<k, r is incremented at step 136, s is reset to 0 at 120 and the iteration for calculating the cost to state i is repeated. However, where r is not less than k, query 138 asks whether i is less than 63. Where this is the case, i is incremented at step 140 and the entire iteration is repeated. Where i is not less than 63, all of the costs are deemed to have been calculated and the optimal path of block j is determined by backtracking in step 142. At step 144, the run-size pairs (r,s) from the optimal path are used to update the run-size probability distribution function $P_{t+1}(r,s)$ and the process for finding the optimal path for block j is complete.

Figure 10:
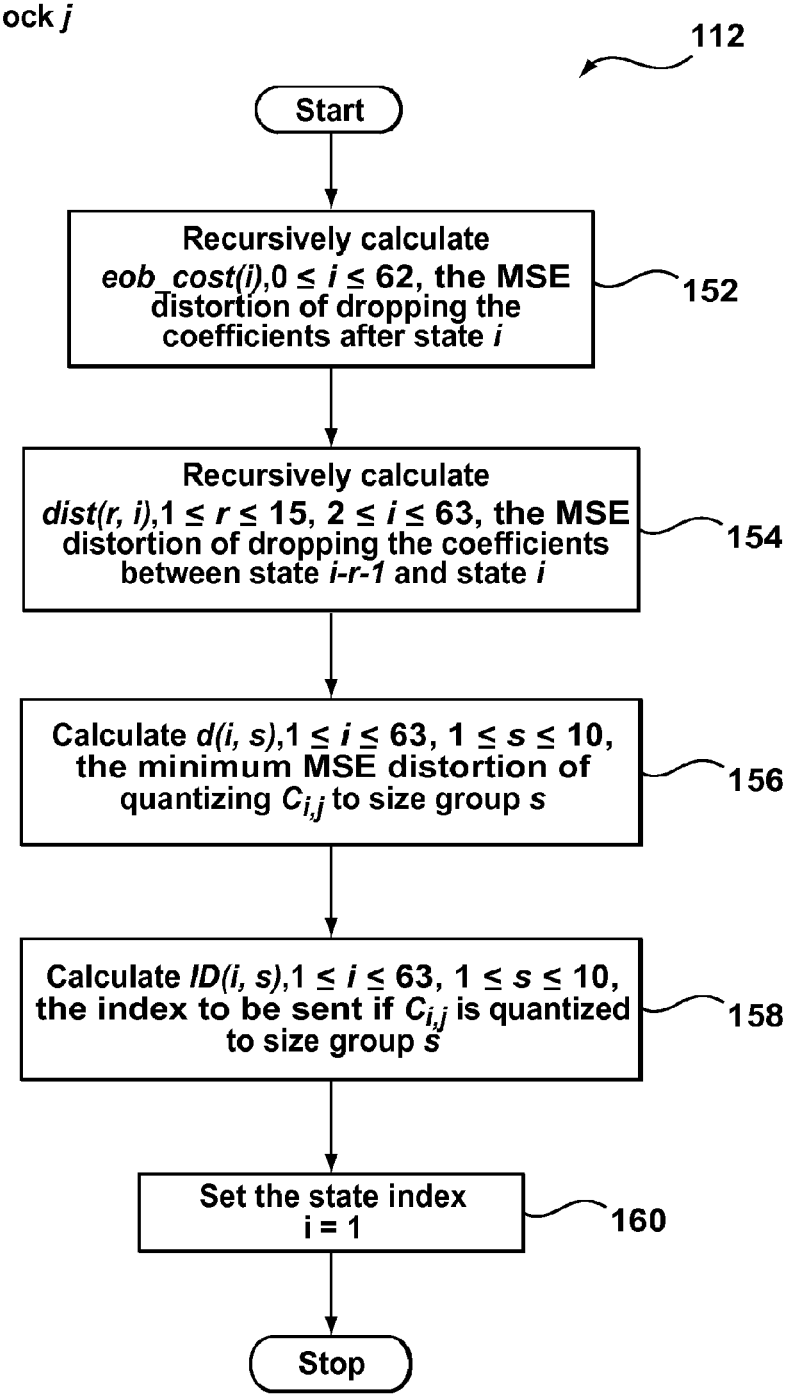
FIG. 10, in a flowchart, illustrates a block initializing process invoked by the optimal path determination process of FIG. 9.

Referring now to the flowchart of FIG. 10, the initialization for block j of step 112 of the flowchart of FIG. 9 is described in more detail. In step 152, the end of block cost, eob_cost(i) is recursively calculated for 0≤i≤62. This corresponds with the cost of dropping all of the coefficients after state i. At step 154, the distortion, dist(r,i) is recursively calculated for i≤r≤15 and 2≤i≤63. This refers to the mean square distortion (MSE) of dropping all of the coefficients between state i−r−1 and state i.

At step 156, a second distortion metric, d(i,s) is calculated for 1≤i≤63 and 1≤s≤10. This is the mean square distortion (MSE) resulting from the $i^{th}$ DCT coefficient (1≤i≤63) when the corresponding index is forced into size group s. At step 158, the index to be sent for the $i^{th}$ DCT coefficient when the index is in size group s, id(i,s), is calculated for 1≤i≤63 and 1≤s≤10. Finally, at step 160, the state index i is set equal to 1 and the initialization for block j is complete.

Figure 11:
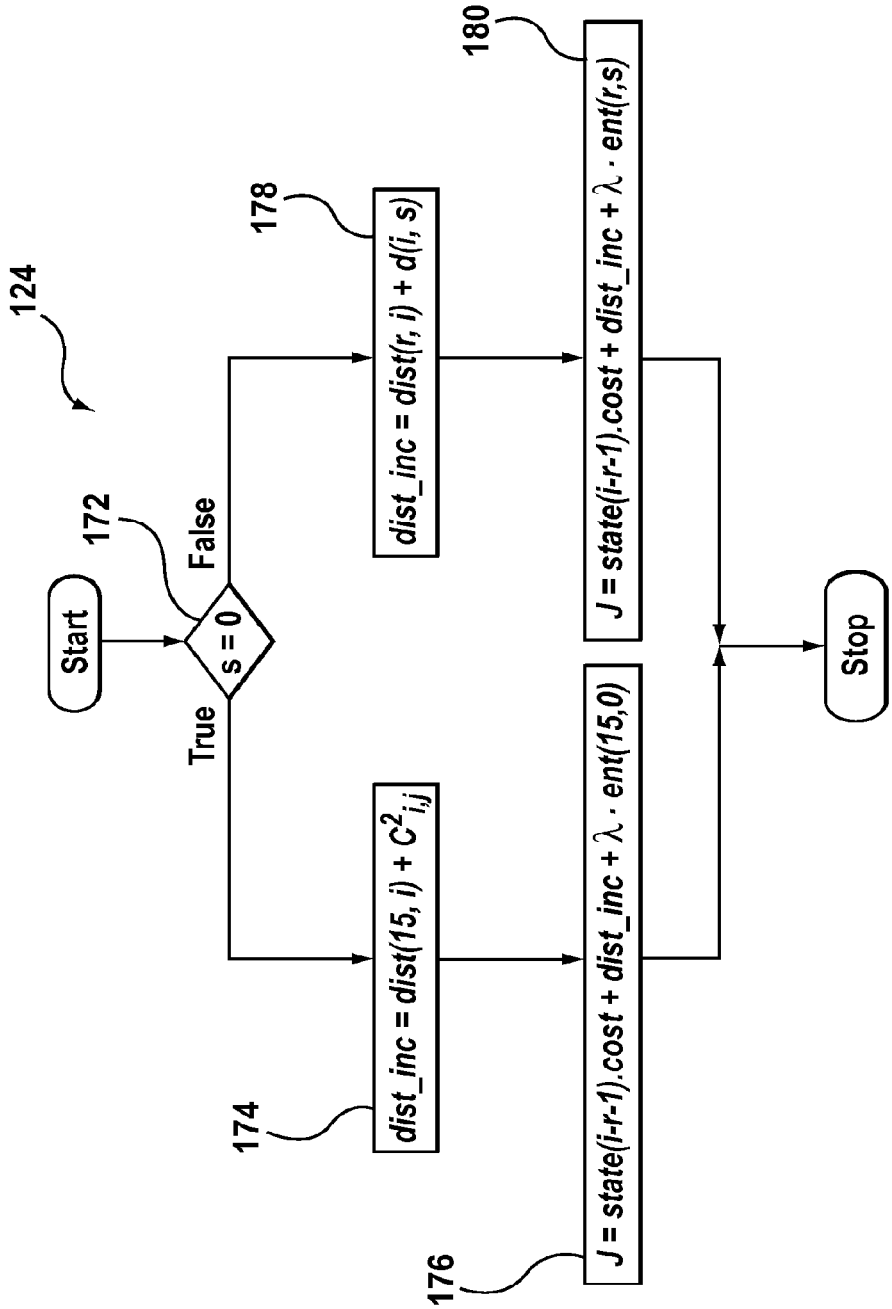
FIG. 11, in a flowchart, illustrates a incremental cost calculating process invoked by the process of FIG. 9.

Referring now to the flowchart of FIG. 11, the procedure for calculating the cost to state i, step 124 of the flowchart of FIG. 9 is described in detail. Query 172 asks whether s is equal to 0. Where this is found to be true, step 174 determines the incremental distortion from state i−r−1 (where r=15) to state i as the sum of the mean square distortion of dropping all of the coefficients between state i−16 and i, and the mean square distortion of dropping the $i^{th}$ DCT coefficient in the current block. Then, the cost to state i, is computed in step 176 as the sum of the cost to state i−r−1, the incremental distortion from state i−r−1 to state i and the entropy rate associated with the run size pair (15,0) scaled by λ.

Where s was not equal to 0 at query 172, the incremental distortion is computed in step 178 as the sum of the mean square distortion of dropping all of the coefficients between state i−r−1 and state i and the mean square distortion resulting from the $i^{th}$ DCT coefficient when the corresponding index if forced into size group s. The cost to state i is then computed in step 180 as the sum of the cost to state i−r−1, plus the incremental distortion from state i−r−1 to state i, plus the entropy rate associated with the run size pair (r,s) scaled by λ. When the cost for the iteration has been computed in either step 176 or step 180, the cost to state i calculation is complete.

Figure 12:
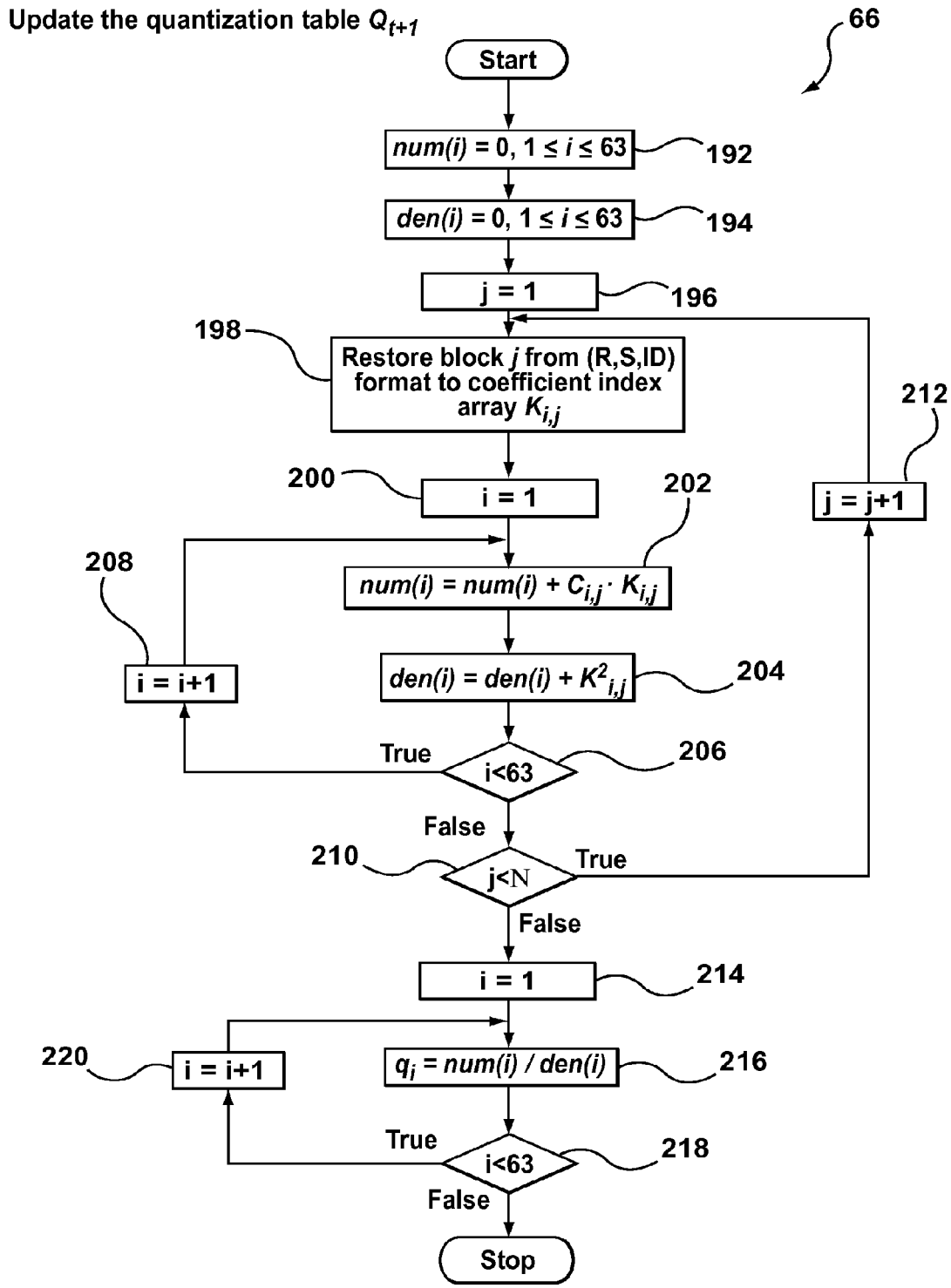
FIG. 12, in a flowchart, illustrates a process for updating a quantization table invoked by the process of FIG. 7.

Referring now to the flowchart of FIG. 12, the process for updating the quantization table $Q_{t+1}$, step 66 of the flowchart of FIG. 7, is described in detail. In step 192, a numerator array, num(i) is initialized to 0 for 1≤i≤63. Similarly, in step 194, a denominator array, den(i) is also initialized to 0 for 1≤i≤63. In step 196, the block index j is initialized to 1. At step 198, block j is restored from its run-size and indices format to create coefficient index array $K_{i,j}$. At step 200, index i, representing the position in the zig-zag order of the $j^{th}$ block is set to 1.

In step 202, the $i^{th}$ value in the numerator array is computed as the sum of its current value and the product of the original $i^{th}$ DCT coefficient of the $j^{th}$ block and the restored DCT index at the $i^{th}$ position in the zig-zag order of the $j^{th}$ block, as determined in step 198, from the run-size and indices format. In step 204, the $i^{th}$ value in the denominator array is computed as the sum of its current value and the square of the DCT index at the $i^{th}$ position in the zig-zag order of the $j^{th}$ block.

Query 206 asks whether i is less than 63. Where i<63, i is incremented at step 208 and the numerator and denominator values associated with the new i are computed. Where i is not less than 63 in query 206, query 210 asks whether j is less than N, the total number of blocks. If j<N, j is incremented in step 212 and the numerator and denominator computations are performed based on the next block. Otherwise step 214 sets i equal to 1.

In step 216, the value associated with the $i^{th}$ position in the zig-zag order of quantization table $Q_{t+1}$, $q_i$, is computed as the value of the numerator over the denominator at position i. Query 218 asks whether i is less than 63. Where this is true, i is incremented at step 220 and the remaining positions in the quantization table are computed. Otherwise, the updating of $Q_{t+1}$ is complete.

Figure 13:
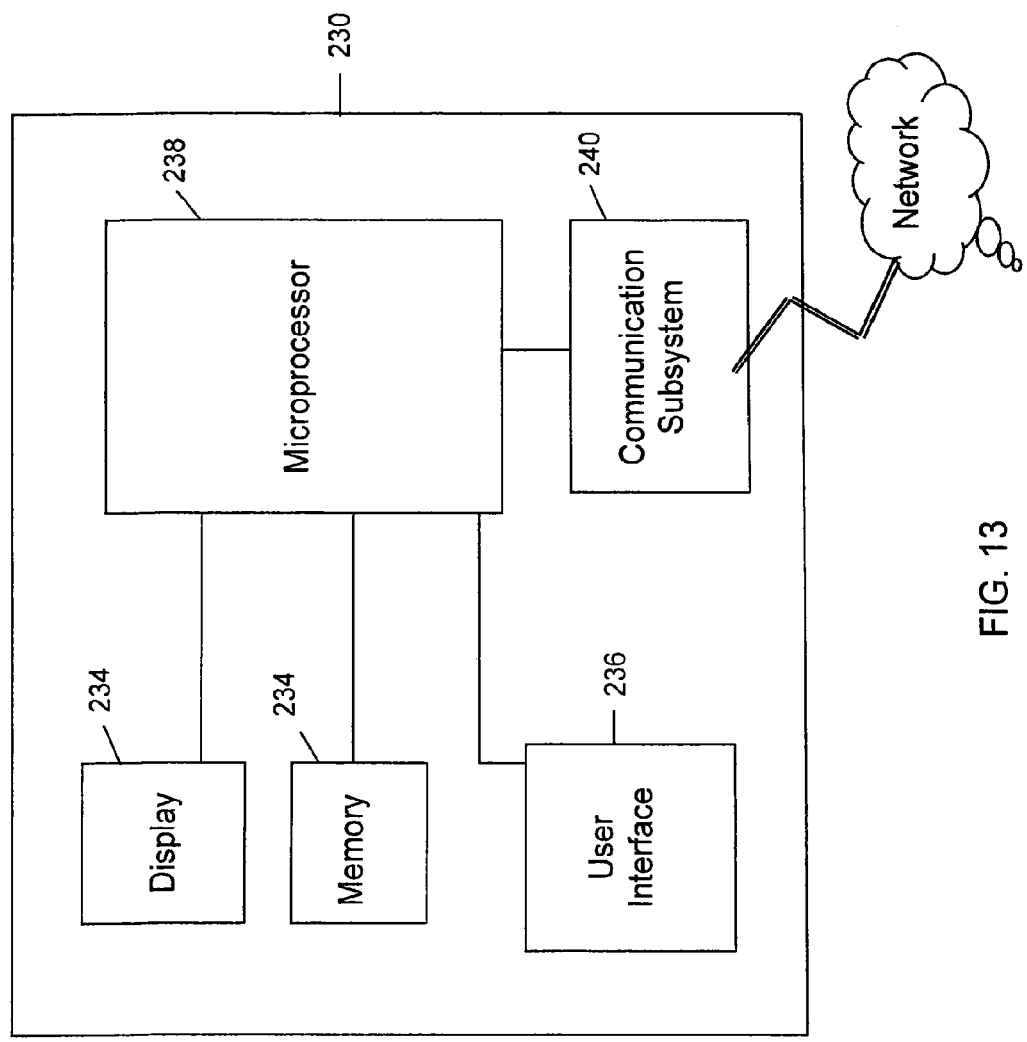
FIG. 13, in a block diagram, illustrates a data processing system in accordance with an aspect of the present invention.

Referring to FIG. 13, there is illustrated in a block diagram a data processing system 230 for implementing compression methods such as those described above in connection with FIGS. 7-12 in accordance with the preferred aspect of the invention. As shown, the system 230 comprises a display 232 for displaying, for example, images to be transmitted. Similarly, the memory 234 may include JPEG or MPEG files to be transmitted. On receiving instructions from a user via a user interface 236, a microprocessor 238 compresses the input image data in the manner described above using a calculation module and initialization module (not shown), before providing the compressed data to a communication subsystem 240. The communication subsystem 240 may then transmit this compressed data to network 242.

As described above, the system 240 may be incorporated into a digital camera or cell phone, while the mode of transmission from communication subsystem 240 to network 242 may be wireless or over a phone line, as well as by higher band width connection.

Experimental Results

Optimization of AC Coefficients

Figure 14:
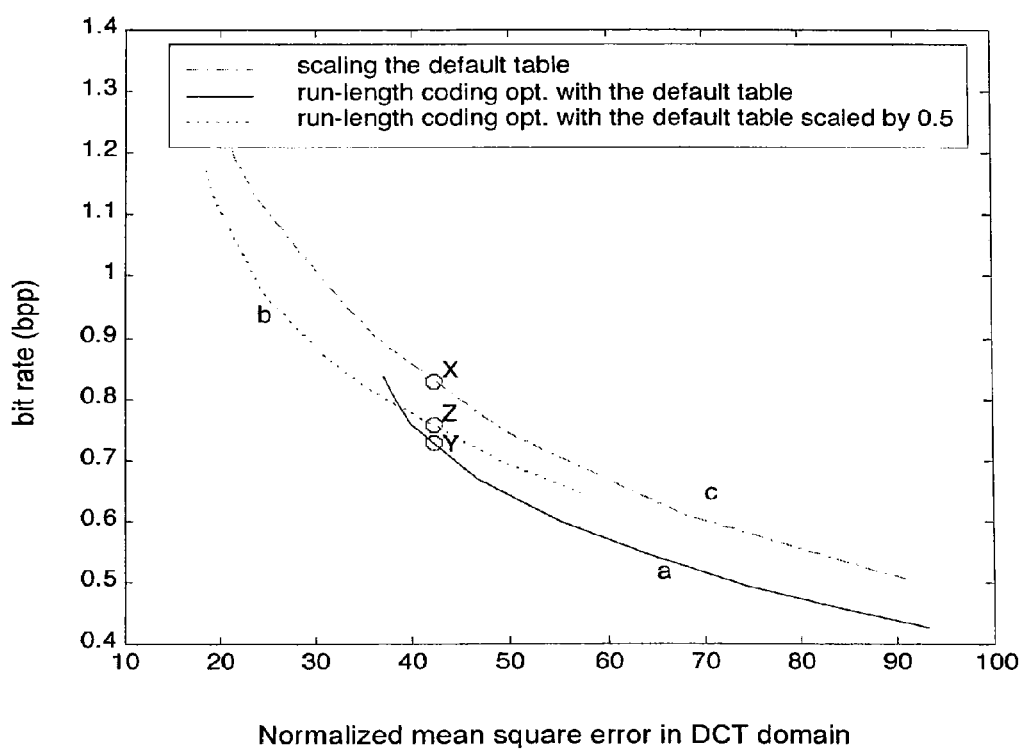
FIG. 14, in a graph, illustrates rate-distortion curves for different quantization tables.

The graph-based run-length coding optimization algorithm and the iterative joint optimization algorithm described above can be applied to the JPEG and MPEG coding environment for decoder compatible optimization. Both of them start with a given quantization table. Since the quantization step size updating algorithm discussed above only achieves local optimality, the initial scaling of the default quantization table has a direct influence on the R-D performance if a default quantization table has to be used. As an example, FIG. 14 illustrates this influence for 512×512 Barbara image using our graph-based run-length coding optimization method. Curve "a" corresponds to the default quantization table while curve "b" corresponds to a fine scale of 0.5 (i.e., halve the length of all the step sizes). The curves are obtained by sweeping the Lagrange multiplier λ through all positive values in interest. For the purpose of comparison, the R-D curve obtained by scaling the quantization table only is also given as curve "c". It can be seen that we may achieve the same distortion of point X from curve "a" or curve "b". From curve "a", we use a small λ to get point Y. (λ is placed before the rate in the implementation to reduce the complexity since it can be pre-multiplied to the entropy rate; −1/λ has the physical meaning of the slope on the R-D curve.) From curve "b", we use a comparatively large λ to get point Z. Even though a binary-search method can be used to find the optimal initial scaling factor in the R-D sense, a scale determined empirically works fine and achieves most of the gain that can be obtained by the optimization scheme. The empirical method is used in our experiments.

Figure 15:
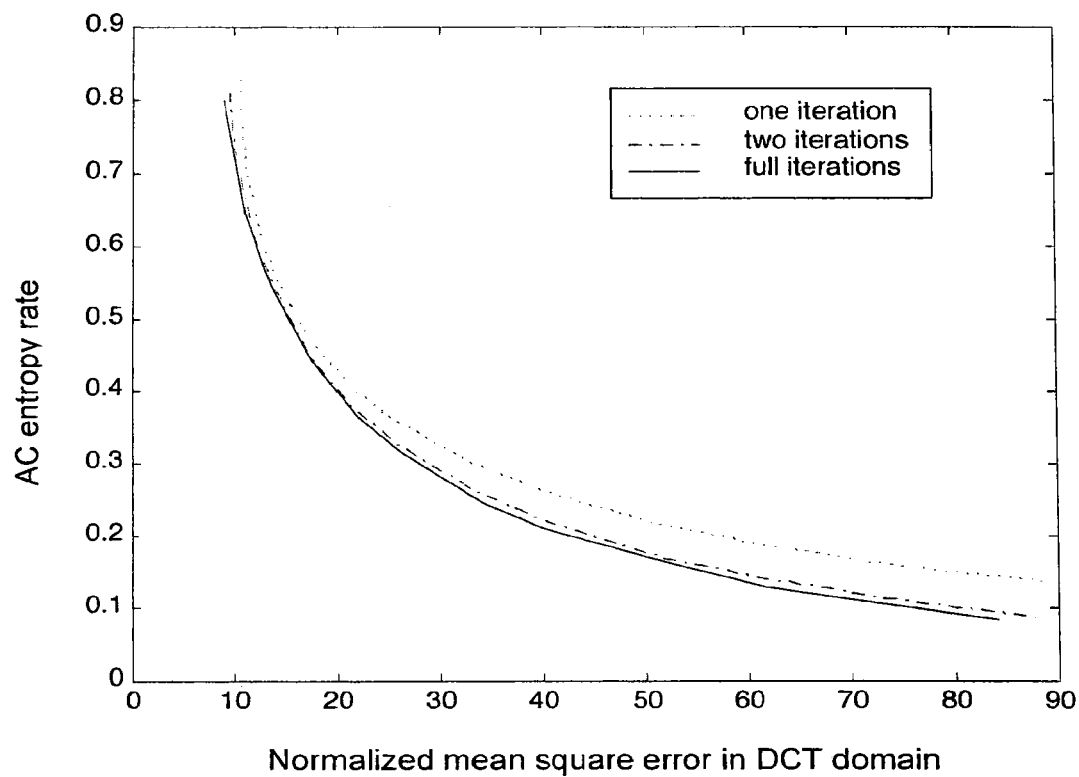
FIG. 15 is a graph showing rate-distortion curves reflecting a different number of iterations of an iterative joint optimization algorithm in accordance with an aspect of the invention.

Given the initial quantization table, the number of iterations in the iterative joint optimization algorithm also has a direct impact on the computation complexity and resulting compression performance. FIG. 15 compares the R-D curves obtained from one iteration (optimizing the run-size pairs only), two iterations, and full iterations (the convergence tolerance ε is set as 0.1 and the resulting average number of iterations is around 6) for 512×512 Lena image. It can be seen that most of the gain achievable from the full joint optimization is obtained within two iterations.

Figure 16:
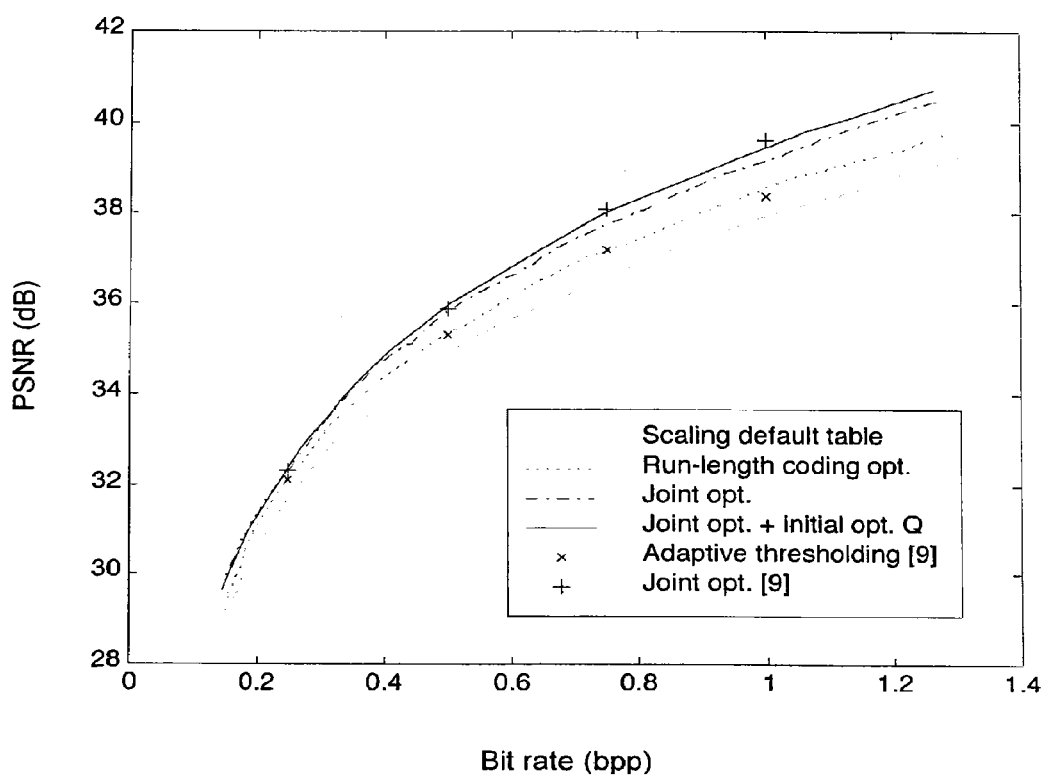
FIG. 16 plots rate-distortion (PSNR) curves of different configurations of optimization methods in accordance with different aspects of the present invention applied to a 512×512 Lena image.
Figure 17:
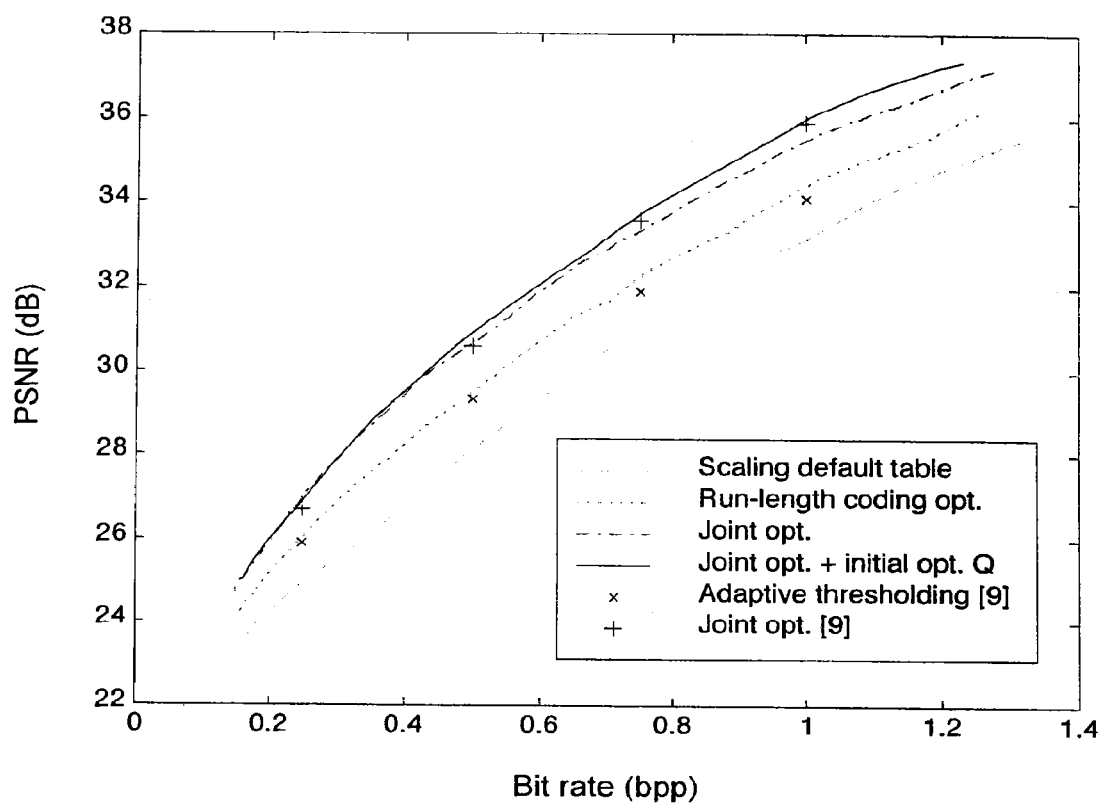
FIG. 17 plots rate-distortion (PSNR) curves of different configurations of optimization methods in accordance with different aspects of the present invention applied to a 512×512 Barbara image.

As mentioned above, the quantization step size updating algorithm only achieves local optimality. In addition to a scaled default quantization table, the proposed joint optimization algorithm can also be easily configured to start with any other quantization table such as one obtained from any schemes in references [3]-[5]. (It should be pointed out that schemes proposed in references [3]-[5] address only how to design optimal quantization tables for hard decision quantization; as such, quantization tables obtained from these schemes are not optimal for soft decision quantization we consider in this paper. Nonetheless, as an initial quantization table for our iterative joint optimization algorithm, these quantization tables are better than a scaled default quantization table.) In our experiments, we choose the fast algorithm in reference [5] to generate an initial quantization table to start with. FIG. 16 and Table I compare the Peak Signal-to-Noise Ratio (PSNR) performance of different configurations of our optimization methods as well as the reference methods for 512×512 Lena image. FIG. 17 and Table II compare the same performance for 512×512 Barbara image. A customized Huffman table is used in the last entropy encoding stage. Several remarks are in order. First, the optimal adaptive thresholding scheme in references [7] and [9] is a subset of the proposed run-length coding optimization. Therefore, the proposed run-length coding optimization scheme outperforms the optimal adaptive thresholding scheme for both images under any bit rates as we expected. Second, quantization table optimization plays a less important role at low bit rates since more coefficients are quantized to zero at low bit rates. The proposed joint optimization scheme with an initial scaled default quantization table achieves better results than the joint optimization scheme in reference [9] at low bit rate(s). Third, for complicated images like Barbara, since there are more nonzero coefficient indices that can be optimized on, the proposed joint optimization algorithm with an initial quantization table generated from the scheme of reference [5] outperforms the joint optimization scheme in reference [9] for all bit rates under comparison. For simple images like Lena, the proposed joint optimization algorithm still achieves better results than the scheme in reference [9] at low bit rates since quantization table optimization plays a less important role at low bit rates. However, the scheme in reference [9] still achieves better results at high bit rates for image Lena because our method does not find the optimal quantization step sizes exhaustively in each iteration. Fourth, the proposed joint optimization algorithm improves the objective PSNR significantly, as compared to the customized baseline .MPEG, to the extent that the performance even exceeds the quoted PSNR results of some state-of-the-art wavelet-based image coders like Shapiro's embedded zerotree wavelet algorithm in J. Shapiro, "Embedded image coding using zerotrees of wavelet coefficients," IEEE Trans. Signal Processing, vol. 41, pp. 3445-3462, December 1993 (hereinafter "reference [13]") for some complicated image like Barbara at the bit rates under comparison. Table III and IV tabulate the PSNR results of the proposed optimization algorithms for two more images (512×512 Mandrill and Goldhill).

TABLE I

Comparison of PSNR with different optimization methods (512 × 512 Lena)

| Rate (bpp) | Customized baseline | Adaptive threshold [9] | Run-length coding optimization | Joint opt. + initial scaled default q-table | Joint opt. + initial q-table from [5] | Joint optimization [9] | Baseline wavelet transform coder [12] | Embedded zerotree wavelet algorithm [13] |
|---|---|---|---|---|---|---|---|---|
| .25 | 31.64 | 32.1 | 32.19 | 32.39 | 32.45 | 32.3 | 33.17 | 33.17 |
| .50 | 34.90 | 35.3 | 35.38 | 35.74 | 35.99 | 35.9 | 36.18 | 36.28 |
| .75 | 36.56 | 37.2 | 37.25 | 37.59 | 38.05 | 38.1 | 38.02 | N/A |
| 1.00 | 37.94 | 38.4 | 38.58 | 39.12 | 39.50 | 39.6 | 39.42 | 39.55 |

TABLE II

Comparison of PSNR with different optimization methods (512 × 512 Barbara)

| Rate (bpp) | Customized baseline | Adaptive threshold [9] | Run-length coding optimization | Joint opt. + initial scaled default q-table | Joint opt. + initial q-table from [5] | Joint optimization [9] | Baseline wavelet transform coder [12] | Embedded zerotree wavelet algorithm [13] |
|---|---|---|---|---|---|---|---|---|
| .25 | 24.95 | 25.9 | 26.01 | 26.91 | 27.00 | 26.7 | 26.64 | 26.77 |
| .50 | 28.10 | 29.3 | 29.49 | 30.63 | 30.90 | 30.6 | 29.54 | 30.53 |
| .75 | 31.02 | 31.9 | 32.23 | 33.13 | 33.79 | 33.6 | 32.55 | N/A |
| 1.00 | 33.16 | 34.1 | 34.41 | 35.22 | 36.01 | 35.9 | 34.56 | 35.14 |

TABLE III

PSNR results of 512 × 512 Mandrill

| Rate (bpp) | Customized baseline | Run-length coding optimization | Joint opt. + initial scaled default q-table | Joint opt. + initial q-table from [5] | Baseline wavelet transform coder [12] |
|---|---|---|---|---|---|
| .25 | 22.31 | 22.70 | 22.92 | 22.95 | 22.87 |
| .50 | 24.17 | 24.59 | 25.25 | 25.33 | 25.04 |
| .75 | 25.52 | 26.05 | 27.11 | 27.22 | 26.95 |
| 1.00 | 26.67 | 27.38 | 28.48 | 28.85 | 28.45 |

TABLE IV

PSNR results of 512 × 512 Goldhill

| Rate (bpp) | Customized baseline | Run-length coding optimization | Joint opt. + initial scaled default q-table | Joint opt. + initial q-table from [5] | Baseline wavelet transform coder [12] |
|---|---|---|---|---|---|
| .25 | 29.30 | 29.72 | 29.97 | 30.00 | 30.08 |
| .50 | 31.72 | 32.15 | 32.50 | 32.64 | 32.62 |
| .75 | 33.26 | 33.73 | 34.28 | 34.52 | 34.42 |
| 1.00 | 34.55 | 35.05 | 35.83 | 36.05 | 35.94 |

Computational Complexity

We now present some computational complexity results of the run-length coding optimization algorithm and the iterative joint optimization algorithm. As mentioned above, given a state and a predecessor, we may find the minimum incremental cost by comparing all the 10 size groups or 3 size groups (i.e., the size group from the hard-decision quantizer and its two neighboring groups). Our experiments show that these two schemes achieve the same performance in the region of interest. Only when λ is extremely large, we see that the results of comparing 10 size groups slightly outperform the results of comparing 3 size groups. In practice, however, these large values of λ will not be used since they lead to large distortions or unacceptably poor image quality. Therefore, all the experimental results in this paper are obtained by comparing 3 size groups. Table V tabulates the CPU time for the C code implementation of the proposed iterative joint optimization algorithm on a Pentium PC with one iteration with 512×512 Lena image. It can be seen that our algorithms are very efficient compared to the schemes in references [7] and [9] (the fast thresholding algorithm in reference [7] takes around 6.1 seconds for one iteration and the scheme in reference [9] takes several dozens of seconds for one iteration on a SPARC-II workstation with a 512×512 image). When the proposed iterative joint optimization algorithm is applied to web image acceleration, it takes around 0.2 seconds to optimize a typical size (300×200) JPEG color image with 2 iterations.

TABLE V

CPU time of the proposed joint optimization algorithm with one iteration on a Pentium PC (512 × 512 Lena)

| Settings | Float DCT | Fast integer DCT |
|---|---|---|
| Comparing 3 size groups | 1.5 s | 0.3 s |
| Comparing 10 size groups | 2.0 s | 0.7 s |

Optimization of DC Coefficients

Figure 18:
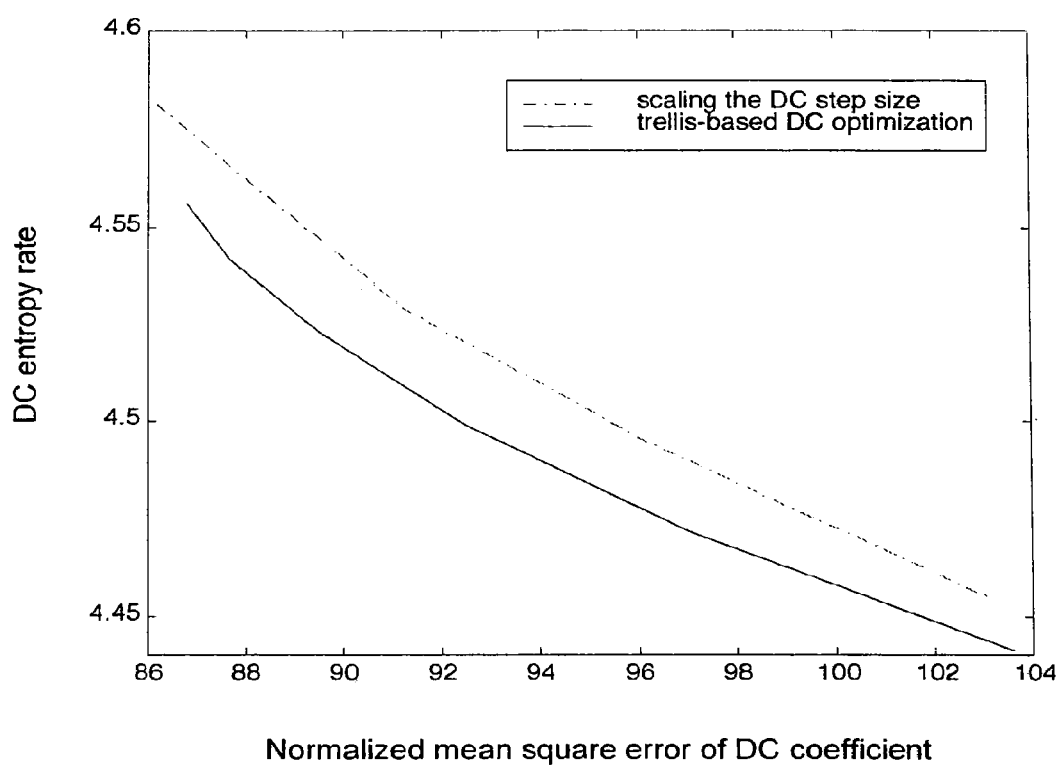
FIG. 18 plots the DC entropy rate vs. the DC distortion resulting from trellis-based DC optimization for a 512×512 Lena image in accordance with an aspect of the invention.

The quantized DC coefficients are not optimized in previous experiments. Unlike AC coefficients, the DC coefficients are usually very large and the difference only has 12 size groups for Huffman coding in JPEG syntax (contrary to 162 different run-size pairs for AC coefficients). Consequently, the gain from the trellis-based DC optimization is limited. When the gain from DC optimization is averaged to the bit rate, the overall improvement on PSNR is negligible. To illustrate the performance improvement resulting from the trellis-based DC optimization outlined in Subsection V, FIG. 18 plots the DC entropy vs. DC distortion for 512×512 Lena image. From these plots, we can clearly see the improvement of the trellis-based DC optimized algorithm over the scaled step size even though the gain is very limited.

Section II: Joint Optimization of Run-Length Coding, Context-Based Arithmetic Coding and Quantization Step Sizes The foregoing discussion proposes a graph-based joint optimization algorithm that jointly optimizes the three free parameters of a JPEG encoder: quantization step sizes, Huffman tables, and DCT indices in the format RUN-SIZE pairs. This joint optimization algorithm is computationally effective, and is also completely compatible with existing JPEG and MPEG decoders.

Suppose now we consider a different scenario where the requirement of JPEG compatibility is removed, but both encoder and decoder are required to have low computational complexity, say comparable to that of JPEG encoders and decoders. (Such a scenario arises in applications like the re-encoding of JPEG compressed images.) How can we further improve the rate-distortion performance on top of the JPEG compatible joint optimization considered above?

Once the requirement of JPEG compatibility is removed, any state-of-the-art image compression/optimization algorithms and schemes, such as the embedded zerotree wavelet (EZW) compression algorithm described in J. Shapiro, "Embedded image coding using zerotrees of wavelet coefficients," IEEE Trans. Signal Processing, vol. 41, pp. 3445-3462, December 1993 (hereinafter "reference [13]"); set partitioning in hierarchical trees (SPIHT) described in Said and W. A. Pearlman, "New, fast, and efficient image codec based on set partitioning in hierarchical tress," *IEEE Trans. Circuits, Syst., Video Technol*, vol. 6, pp. 243-249, June 1996 (hereinafter "reference [14]"); embedded block coding with optimized truncation described in D. Taubman, "High performance scalable image compression with EBCOT," *IEEE Trans. Image Processing*, vol. 9, pp. 1158-1170, July 2000 (hereinafter "reference [15]"); context-based entropy encoding of wavelet coefficients or DCT coefficients described in X. Wu, "High-order context modeling and embedded conditional entropy coding of wavelet coefficients for image compression," in *Proc. 31st Asilomar Conf. Signals, Systems, Computers*, pp. 1378-1382, November 1997; Tu, J. Liang, and T. Tran, "Adaptive Runlength Coding," *IEEE Signal Processing Letters*, vol. 10, pp. 61-64, March 2003; and, Tu and T. Tran, "Context-Based Entropy Coding of Block Transform Coefficients for Image Compression," *IEEE Trans. Image Processing*, vol. 11, pp. 1271-1283, November 2002 (hereinafter "reference [16]", "reference [17]" and "reference [18]" respectively); pre- and post-filtering techniques described in T. Tran, J. Liang, and C. Tu, "Lapped Transform via Time-domain Pre- and Post-Filtering," *IEEE Trans. Signal Processing*, vol. 51, pp. 1557-1571, June 2003 (hereinafter "reference [19]"); can be possibly employed to improve the rate-distortion performance for a given image. However, due to their inherent encoding structures, these methods may not meet the stringent computational complexity requirements on both encoder and decoder.

In this section a different approach is taken. To meet stringent computational complexity requirements, we replace the Huffman coding of JPEG by context-based arithmetic coding. In this way, we avoid performing the computationally expensive wavelet transform and inverse wavelet transform as well as the extra DCT transform and inverse DCT transform, especially in the case of re-encoding of JPEG compressed images. To improve the rate-distortion performance, we then jointly optimize run-length coding, context-based arithmetic coding, and quantization step sizes as shown in FIG. 19 where the re-encoding of a JPEG compressed image is illustrated, and in FIG. 20 where the encoding of an uncompressed image is illustrated.

Figure 19:
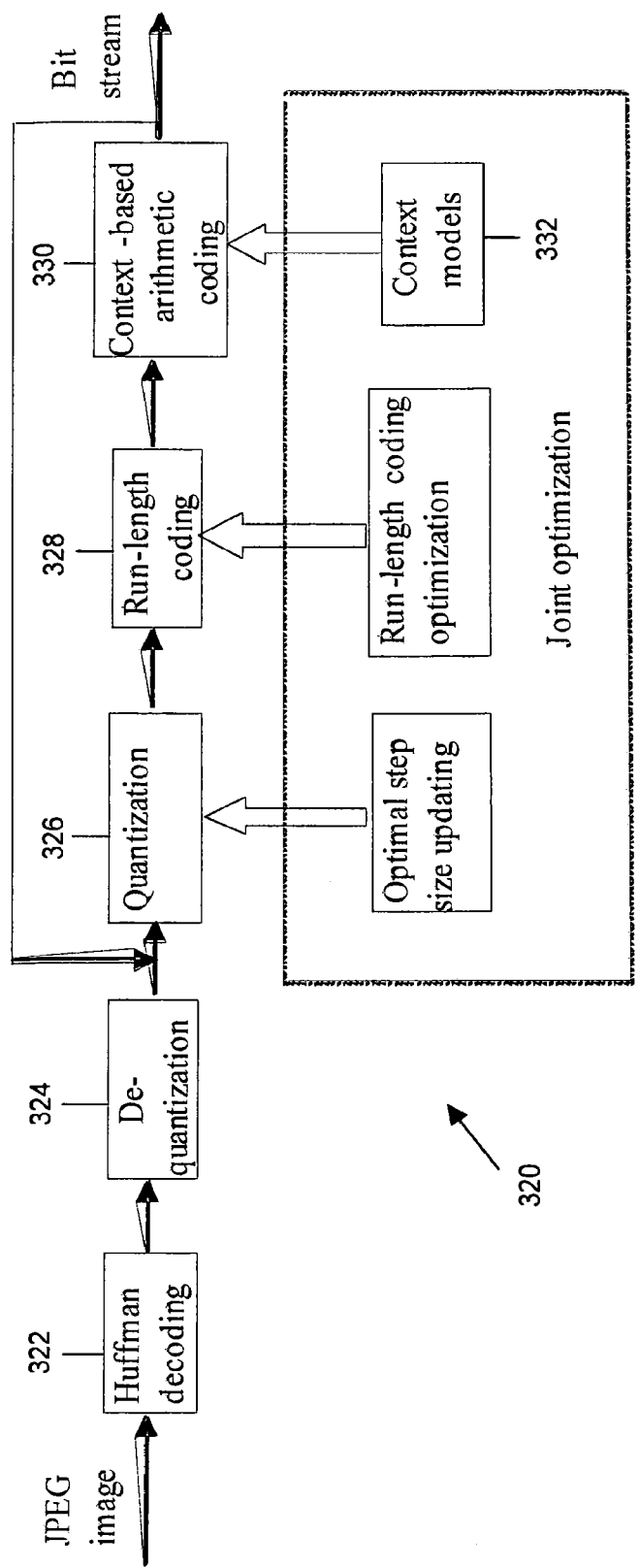
FIG. 19, in a block diagram, illustrates a generic encoder that is not limited to JPEG syntax in accordance with an aspect of the invention.
Figure 20:
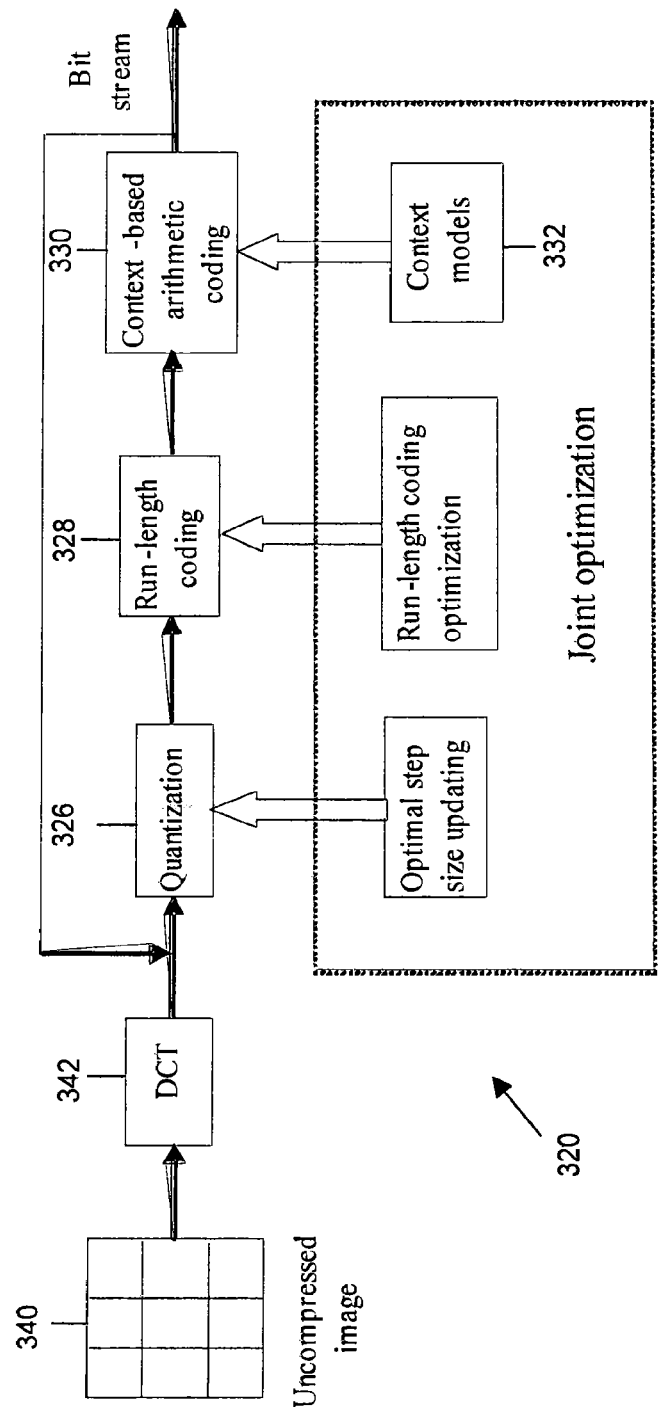
FIG. 20, in a block diagram, illustrates the generic encoder of FIG. 19 applied to an uncompressed image.

FIGS. 19 and 20 illustrate, in block diagrams, the operation of an encoder 320, in accordance with an aspect of the present invention, in different circumstances. In the situation of FIG. 19, the input is a JPEG image. As described above in connection with FIG. 1, this JPEG image has already been subjected to Huffman coding and quantization. Accordingly, to begin the joint optimization of quantization, run-length coding and context-based arithmetic coding, this JPEG image must first be Huffman decoded in step 322 and dequantized in step 324. Based on the resulting DCT coefficients, the joint optimization of quantization in step 326, run-length coding in step 328, and context-based arithmetic coding (in step 330) using context models 332 is then conducted.

In FIG. 20, the encoder 320 operates on an uncompressed image 340, instead of a JPEG image as in FIG. 19. Similar to the JPEG encoder 20 of FIG. 1, the encoder 320 of FIG. 20 first partitions the uncompressed image 340 into 8×8 blocks and then processes these 8×8 image blocks. Each block is first transformed from the pixel domain to the DC domain by an 8×8 DCT in the DCT step 342. Based on the resulting DCT coefficients, the joint optimization of quantization table in step 326, run-length coding in step 328, and context-based arithmetic coding in step 330 using context models 332 is then conducted.

Context Modeling of RUN and LEVEL

JPEG standard uses run-length coding to order a block of quantized coefficients into zigzag sequence in the order of increasing frequency shown as $(DC)(\text{RUN, SIZE})(\text{Amplitude}) \ldots (\text{RUN, SIZE})(\text{Amplitude})(EOB)$ This sequence is then Huffman encoded. In context modeling and related entropy encoding, the amplitudes of the DCT indices are usually merged into the size part to form a (RUN, LEVEL) sequence shown as (DC)(RUN, LEVEL) ... (RUN, LEVEL)(EOB)

where RUN still represents the number of consecutive zero AC coefficient indices prior to a nonzero one and LEVEL is the value of the nonzero coefficient index. The EOB symbol indicates that there are no additional nonzero coefficient indices in the current block.

Tu et al. [17] proposed a context modeling scheme which makes use of the properties of RUN-LEVEL sequences of quantized DCT blocks such as small RUNs occurring more frequently than large RUNs, LEVELs with small magnitudes occurring more often than LEVELs with large magnitudes, etc. Then, a context-based binary arithmetic coder is used to encode RUNs and LEVELs separately (EOB is treated as a special RUN symbol). To encode a nonbinary symbol by a binary arithmetic coder, the symbol is binarized first. Since small RUNs and small LEVELS occur more frequently, shorter binary sequences should be assigned to smaller RUNs and LEVELs. A simple binarization scheme which meets this requirement, described in more detail in Tu et al. [17], is as follows: RUN is binarized as (RUN+1) "0's" followed by a "1"; EOB is considered as a special RUN and binarized as "1"; and LEVEL is binarized as (|LEVEL|−1) "0's" followed by an ending "1" in addition to a sign bit. The DC coefficient of a block is predicted from the DC values of its top and left neighbor blocks. If the predicted DC residue is nonzero, it is binarized in the same manner as that of a regular LEVEL symbol. Since the statistics of different bits may differ greatly, different models are usually used for different bits to maximize coding efficiency.

Context Arithmetic Coding-Based Joint Optimization

The basic idea of the context arithmetic coding-based joint optimization is similar to the JPEG compatible joint optimization problem described above in section I. It is a constrained optimization over all sequences of (RUN, LEVEL) pairs, or (R, L) for short, all possible context models M, and all possible quantization tables Q. Therefore, the optimization problem can be posed as $$\min_{(R,L),M,Q} d[I_0, (R, L)_Q] \text{ subject to } r[(R, L), M] \leq r_{budget} \quad (20)$$

where $d[I_0,(R,L)_Q]$ denotes the distortion between the original image $I_0$ and the reconstructed image determined by (R, L) and Q over all AC coefficients, and r[(R,L),M] denotes the compression rate for all AC coefficients resulting from the chosen (R, L) pairs and the context models M. The equivalent unconstrained optimization problem is $$\min_{(R,L),M,Q} \{J(\lambda) = d[I_0, (R, L)_Q] + \lambda \cdot r[(R, L), M]\} \quad (21)$$

where the Lagrangian multiplier $\lambda$ is a fixed parameter that represents the tradeoff of rate for distortion, and $J(\lambda)$ is the Lagrangian cost. In this section, we select suitable contexts and update (or optimize) the probability distributions under each context in each iteration. Then, the iterative algorithm of solving this unconstrained optimization problem can be described as follows:

1) Initialize a context model distribution $P(M_0)$ from the given image $I_0$ and a quantization table $Q_0$. Set t=0, and specify a tolerances as the convergence criterion.
2) Fix $P(M_t)$ and $Q_t$ for any t≥0. Find an optimal sequence $(R_t,L_t)$ that achieves the following minimum $$\min_{(R,L)} \{J(\lambda) = d[I_0, (R, L)_{Q_t}] + \lambda \cdot r[(R, L), P(M_t)]\}.$$

Denote $d[I_0,(R_t,L_t)_{Q_t}]+\lambda \cdot r[(R_t,L_t),P(M_t)]$ by $J^t(\lambda)$:
3) Fix $(R_t,L_t)$. Update $P(M_t)$ and $Q_t$ into $P(M_{t+1})$ and $Q_{t+1}$, respectively so that $P(M_{t+1})$ and $Q_{t+1}$ together achieve the following minimum $$\min_{P(M),Q} \{J(\lambda) = d[I_0, (R_t, L_t)_Q] + \lambda \cdot r[(R_t, L_t), P(M)]\}:$$

4) Repeat Steps 2) and 3) for t=0, 1, 2, . . . until $J^t(\lambda) - J^{t+1}(\lambda) \leq \epsilon$. Then output $(R_{t+1}, L_{t+1})$, $Q_{t+1}$, and $P(M_{t+1})$.

The core of the iterative algorithm is Step 2) and Step 3), i.e., finding the sequence (R,L) to minimize the Lagrangian cost $J(\lambda)$ given P(M) and Q, and updating the quantization step sizes with the new indices of the image. The same quantization step-size updating algorithm in section I can be used for the latter purpose. In what follows, we address Step 2), i.e., how to find the optimal sequence of (R,L) for each block given the distribution of the context models and quantization step sizes.

Context Models Adopted

The context models used below are a set of slightly modified context models for DC, RUN, and LEVEL from reference [17], which is hereby incorporated by reference.

(1) Context Models for DC Residues

Two context models are used for the magnitude of a DC residue, which is the difference between the current DC index and the DC index of the top block neighbor, depending on whether the DC residue of the top block neighbor is zero or not.

(2) Context Models for the First RUN

The first RUN is conditioned on the flatness of the neighbor blocks. Five context models are used to encode the first RUN of a block. The first three are used to code the first binary bit of the first RUN corresponding to neither of, either of, or both the left and top block neighbors having nonzero AC indices. The fourth model is used for the second binary bit of the first RUN, and the fifth model is used for all the remaining binary bits.

It should be pointed out that the five context models of the first RUN are used only at the last entropy encoding stage; they are not involved in the joint optimization process (in the joint optimization process, we will employ a fixed model for the first RUN). This is because the first RUN is conditioned on the flatness of the neighboring blocks, and as such, including the first RUN in the joint optimization will result in a more complicated joint optimization algorithm. Since coding the first RUN only takes a very small fraction in the bit rates, this compromise is well justified.

(3) Context Models for Other RUNs

Other RUN symbols are conditioned on the magnitude and the zigzag order of the preceding LEVEL, denoted as m and zz, respectively. The context models are chosen as:

$$(zz<6 \text{ and } m=1), (zz<6 \text{ and } m>1), (6 \leq zz<15 \text{ and } m=1), (6 \leq zz<15 \text{ and } m>1), (zz \geq 15). \quad (22)$$

In addition, different models are used for the first binary bit, the second binary bit, and all remaining binary bits. A total of 15 context models are used for other RUNs.

(4) Context Models for the Magnitudes of LEVELs

The magnitude of the LEVEL is conditioned on zz, the zigzag order of the current LEVEL, and r, the current RUN. The context models are chosen as:

$$(0<zz<3), (3\leq zz<6), (6\leq zz<15 \text{ and } r<3)(15\leq zz \text{ or } 3\leq r). \qquad (23)$$

In addition, different models are used for the first binary bit and all the remaining bits. A total of 8 context models are used for LEVEL magnitudes.

One additional single model is used for the sign bit of LEVELs and DC residues and does not enter in the joint optimization either. In total, 31 binary context models are used to encode the DCT coefficient indices.

Graph-Based RUN-LEVEL Optimization

A similar idea to the graph-based optimization of section I can be employed to find the optimal sequence of (R, L) in the context arithmetic coding-based joint optimization. However, since RUNs are now encoded conditionally given both the zigzag order and the magnitude of the preceding LEVEL, a graph different from that considered in section I will be utilized.

Figure 21:
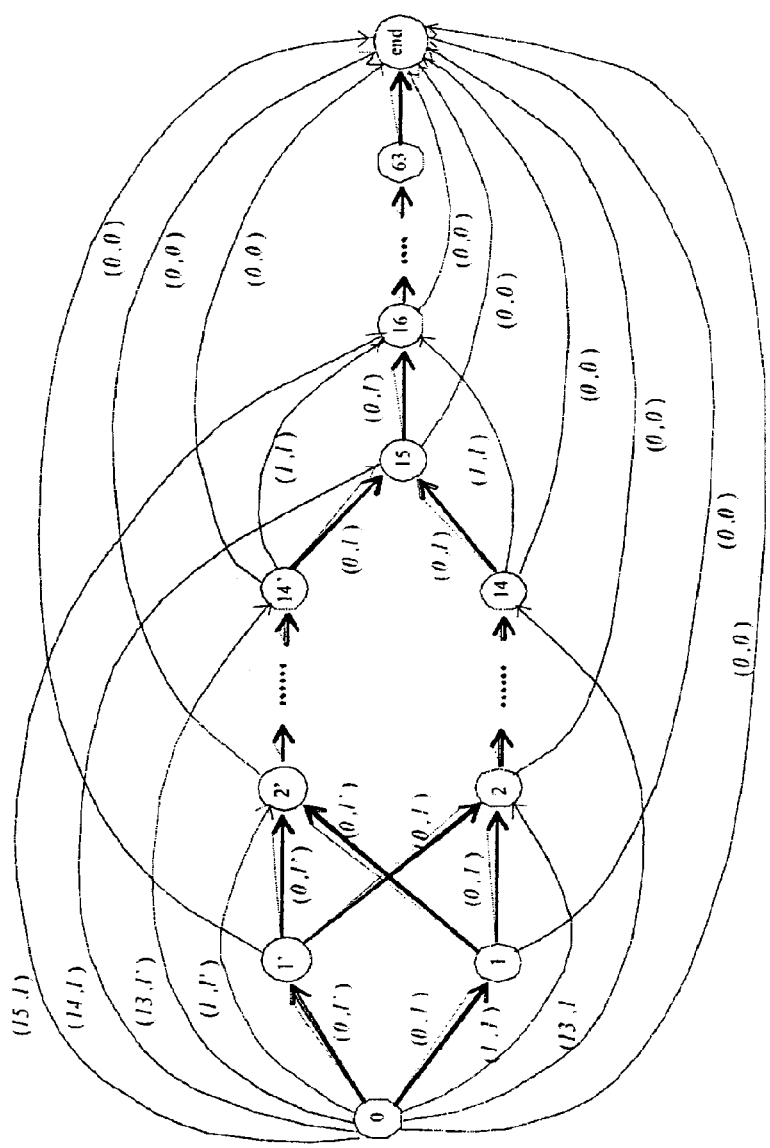
FIG. 21 illustrates a directed graph for representing different sequences of run-level pairs in accordance with a further aspect of the present invention.

From the way RUNs are encoded, it follows that the quantized magnitudes (being unity or non-unity) together with the zigzag order of the first 14 AC coefficients are used in the encoding of RUNs; however, the quantized magnitudes of the AC coefficients after the first 14 are encoded based on the zigzag order only, and not based on magnitude. To address this additional dependency, we define one more state for each of the first 14 AC coefficients. Specifically, we define a directed graph with 64 super nodes (or super states) which correspond to the 64 coefficient indices of an 8×8 image block in zigzag order and an end state (or end node) as shown in FIG. 21. Each of the first 14 super states which correspond to the first 14 AC coefficients (state 0 corresponds to the DC coefficient) includes two states (or nodes): one is called a basic state indicating that the magnitude of the corresponding AC coefficient is >1 (state 1' to state 14'); and the other is called an extended state indicating that the magnitude of the corresponding AC coefficient is equal to 1 (state 1 to state 14). Each of the remaining super states (state 15 to 63 as well as state 0) has only one state and is called a regular state. Each non-end state may have incoming connections from its previous 16 super states, which correspond to RUN, R, in an (R,L) pair with R taking values from 0 to 15. The end state may have incoming connections from all the other states, which corresponds to the EOB code, i.e., code (0, 0). State 63 goes to state end without EOB code. For a given basic state i' (1≤i'≤14) and its predecessor i'−r−1(0≤r≤15) (although for the first 14 states r≤13), there are 2m−2 parallel transitions between them where m is the maximum magnitude of LEVEL. Note that the predecessor can be either a basic state or an extended state. We assign to each transition (r,l') (−m≤l'≤m,|l'|>1) from state i'−r−1 to state i' a cost which is defined as the incremental Lagrangian cost of going from state i'−r−1 to state when the i'$^{th}$ DCT coefficient is quantized to l'(|l'|>1) and all the r DCT coefficients appearing immediately before the i' th DCT coefficient are quantized to zero. This incremental cost is defined as $$\sum_{j=i'-r}^{i'-1} C_j^2 + (C_{i'} - q_{i'} \cdot l')^2 + \lambda \cdot f(r,l'), |l'| > 1 \qquad (24)$$

where $C_{i'}$ and $q_{i'}$ are respectively the i'th DCT coefficient and the i'th quantization step size; and f(r,l') is a length function that maps from the transition (r,l') to an entropy rate based on the current probability distribution of the context models M. Note that the probability distribution of r given the context models M now depends only on the predecessor i'−r−1, and the probability distribution of l' given the context models M depends on both r and the state i'. Similarly, for a given extended state i (1≤i≤14) and its predecessor i−r−1, there are two transitions, (r,1) and (r,−1), between them. Since the sign bit is treated separately, we only draw one transition in the directed graph of FIG. 21 for simplicity. The incremental Lagrangian cost of these two transitions, which means the i$^{th}$ DCT coefficient is quantized to unity and all the r DCT coefficients appearing immediately before the i$^{th}$ DCT coefficient are quantized to zero, is defined as $$\sum_{j=i-r}^{i-1} C_j^2 + (C_i \mp q_i)^2 + \lambda \cdot f(r, \pm 1). \qquad (25)$$

For a regular state i (15≤i≤63) and its predecessor i−r−1, there are 2m parallel transitions between them (note that if the position of the predecessor is less than 15, then both the basic node and the extended node have 2m parallel transitions to state i). The incremental Lagrangian cost associated with the transition (r,l) (−m≤l≤m,l≠0) from state i−r−1 to state i is similarly defined as $$\sum_{j=i-r}^{i-1} C_j^2 + (C_i - q_i \cdot l)^2 + \lambda \cdot f(r, l), l \neq 0. \qquad (26)$$

For the transition from each super state i (both the basic state and the extended state if 1≤i≤14) to the end state, its cost is defined as $$\sum_{j=i+1}^{63} C_j^2 + \lambda \cdot f(0, 0) \qquad (27)$$

For each regular state i (i≤16), there are one or two more transitions from state i−16 to i (depending on the position of i−16) which correspond to the pair (15, 0), i.e., ZRL (zero run length) code. Its cost is defined as $$\sum_{j=i-15}^{i} C_j^2 + \lambda \cdot f(15, 0) \qquad (28)$$

where pair (15, 0) is treated as a special RUN with length of 16. With the above definitions, every sequence of (R,L) pairs of an 8×8 block corresponds to a path from state 0 to state end with a Lagrangian cost. Analogous to the method of section I, one can apply a fast dynamic programming algorithm to the whole directed graph to find the optimal sequence (R,L) for a given 8×8 block. The detailed description of the fast dynamic programming algorithm is similar to that in section I and the corresponding pseudo-code is outlined in the pseudo code of FIGS. 22a to 22d.

Figure 23:
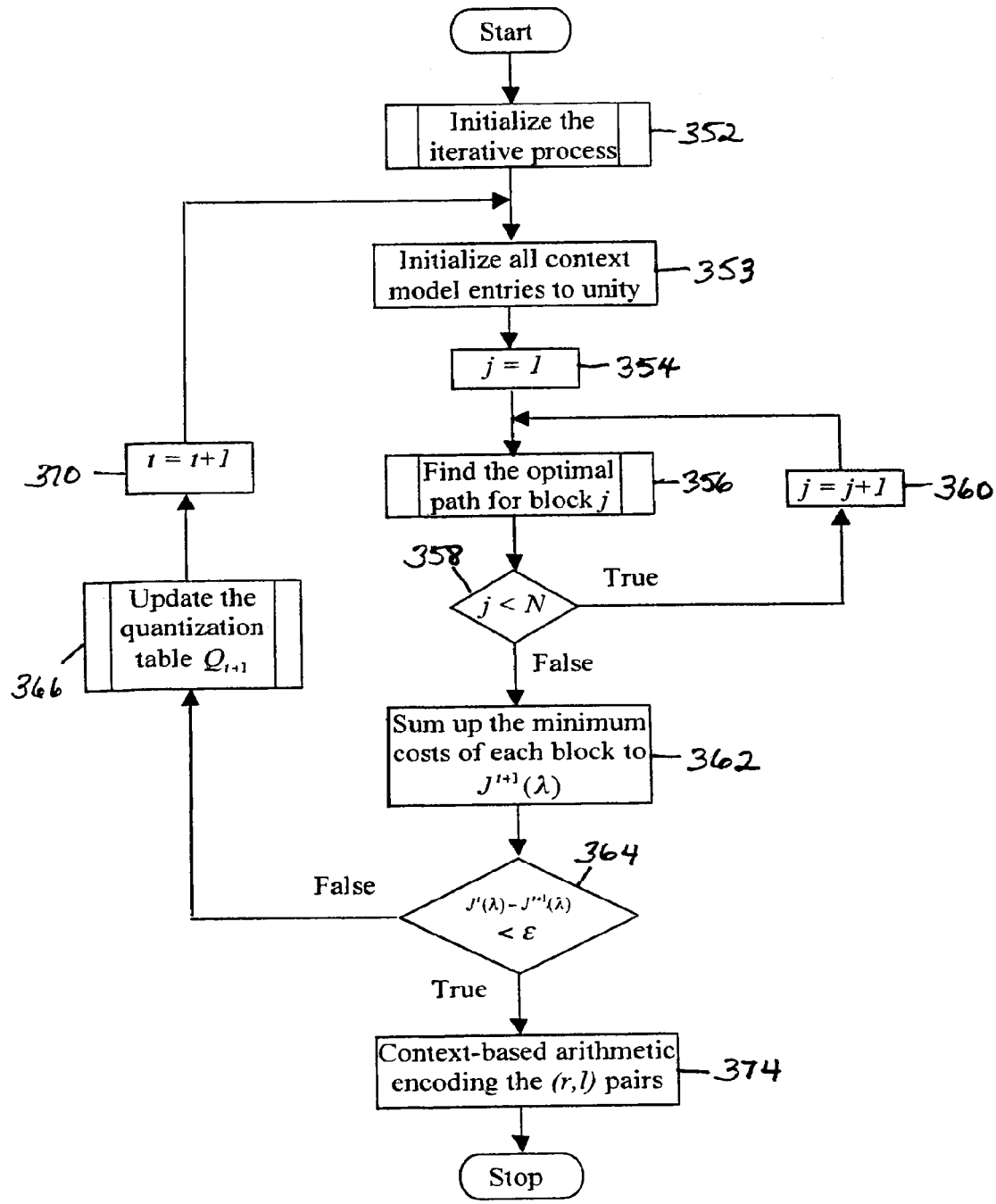
FIG. 23, in a flowchart, illustrates a process for jointly optimizing the run-length coding, context-based arithmetic coding and quantization step sizes in accordance with a further aspect of the invention.

A process for jointly optimizing the run-length coding, context-based arithmetic coding and quantization step sizes in accordance with an aspect of the invention is shown in the flow chart of FIG. 23. At step 352, the iterative process is initialized, as outlined in detail in the flow chart of FIG. 24. At step 353, all context model entries are initialized to unity. Then, in step 354, the index representing the $j^{th}$ block of N total blocks is set to 1. At step 356, the process determines the optimal path for block j, in this first run through, the first block. This is outlined in detail in the flow chart of FIG. 25. At query 358, the process determines whether j is the final block. This is achieved by comparing j to N (the total number of blocks). Where j is less than N, j is incremented in step 360.

The process of finding the optimal path for each block j continues until j equals N. When j equals N, an optimal path for each of the N blocks will have been determined. The $(t+1)^{th}$ value of $J(\lambda)$ is computed in step 362 of the method of FIG. 23 as the sum of the minimum costs associated with each of the N blocks. This value is then compared against the $t^{th}$ value of $J(\lambda)$ in query 364 where if the difference between the $t^{th}$ value of $J(\lambda)$ and the $(t+1)^{th}$ value of $J(\lambda)$ is less than $\epsilon$ (the selection criterion, or more specifically, the convergence criterion), the optimization is considered complete. Where this is not the case, the joint optimization process proceeds to step 366 in which the quantization table is updated into $Q_{t+1}$, as outlined in detail in the flow chart of FIG. 29. The context model $P(M_t)$ could be updated to $P(M_{t+1})$ using the probability distribution of the context models at the end of iteration t as discussed. In the practical implementation, adaptive context-based arithmetic coding is actually employed both for joint optimization and for final encoding/decoding. Adaptive context-based arithmetic coding sets the entries of the context models to unity at the beginning of each iteration as specified in step 353 and updates the context models at the end of each block as specified in step 444. At step 370, index t is incremented and an additional iteration is subsequently performed beginning once again at step 353.

Where it was determined that the selection criteria was satisfied in query 364, context-based arithmetic coding is used to encode the selected (r,l) pairs in step 374. After step 374, the process for jointly optimizing the run-length coding, context-based arithmetic coding and quantization table is complete.

Figure 24:
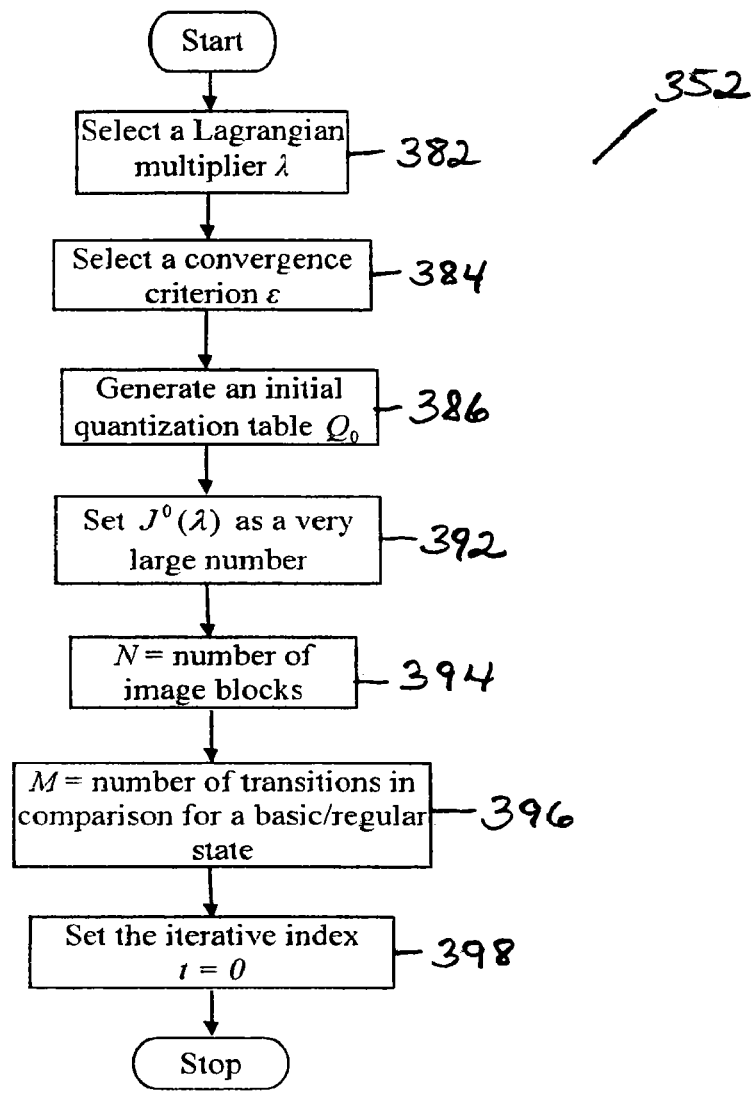
FIG. 24, in a flowchart, illustrates an initialization of an iterative process of the process of FIG. 23.

Referring now to the flow chart of FIG. 24, the initialization of the iterative process in step 352 of the flow chart of FIG. 23 is described in more detail. At step 382, the Lagrangian multiplier, $\lambda$, is selected. This is a fixed parameter representing the trade-off of rate for distortion. At step 384, the convergence criteria $\epsilon$ is selected. This is the amount by which the difference of the Lagrangian costs, $J'(\lambda)$, of successive iterations must be below for the iteration to be deemed successful and complete.

In step 386, an initial quantization table $Q_0$ is generated. In step 392, an initial Lagrangian cost $J^0(\lambda)$ is set to be a very large number, in order to make sure that this initial Lagrangian cost exceeds the minimum cost eventually determined by the method. At step 394, N is set to be equal to the number of the image blocks, and in step 396, M is set equal to the number of transitions being compared. As described above, the number of transitions being compared will differ depending on whether the state or node in question is a basic node, an extended node, or a regular node, although this step deals with basic and regular nodes only. In step 398, the iterative index t is set equal to 0 and the process of initializing the iterative process is complete.

Figure 25:
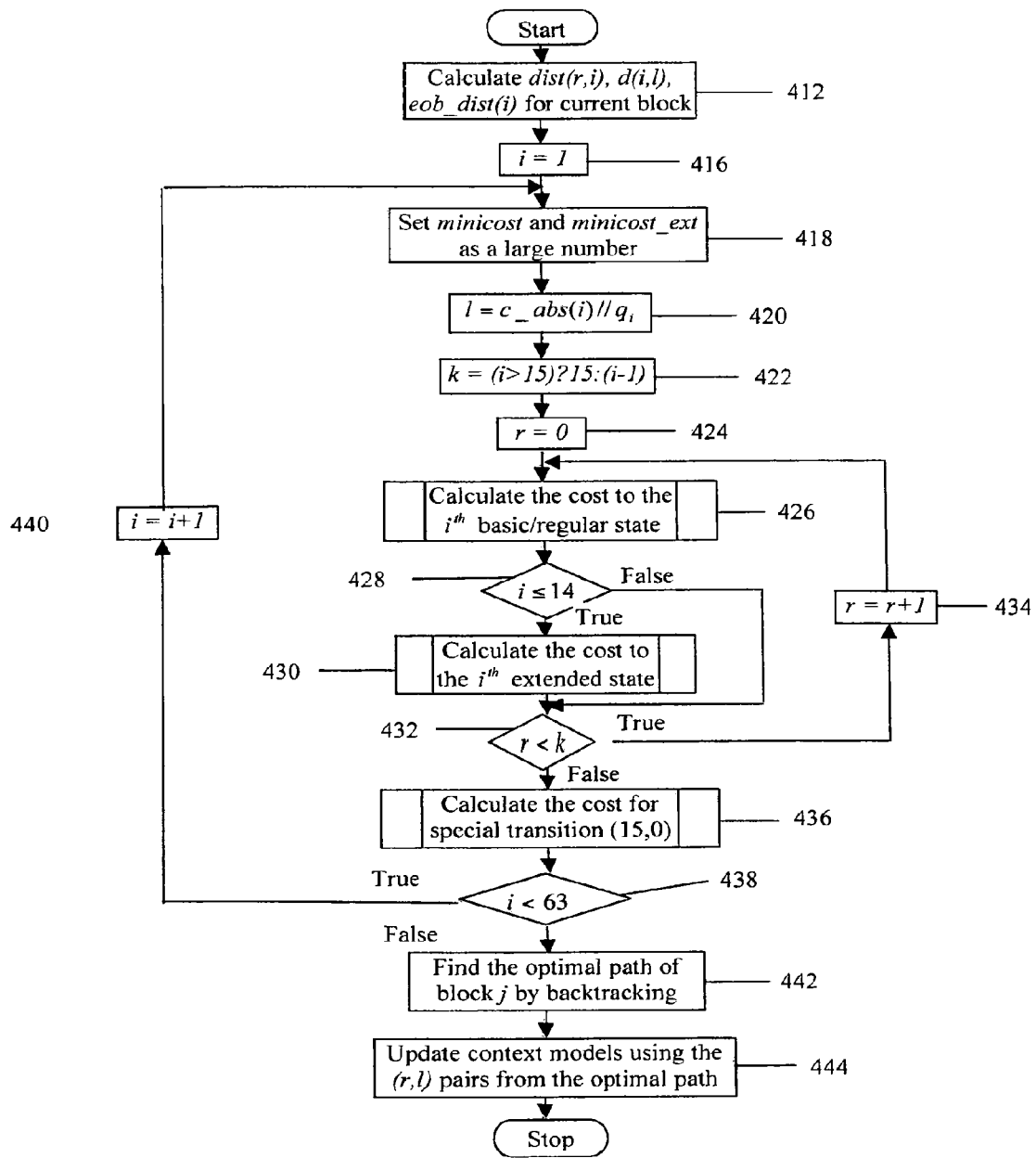
FIG. 25, in a flowchart, illustrates a process for determining an optimal path for a particular block in the process of FIG. 23.

Referring now to the flow chart of FIG. 25, the process of determining the optimal path for a block of step 356 in the flow chart of FIG. 23 is described in more detail. In step 412, dist(r,i); d(i,l); and, eob_dist(i) for the current block are determined: (1) dist(r,i) is the mean square distortion of dropping all the coefficients between state i−r−1 and state i; (2) d(i,l) is the mean square distortion resulting from $C_{i,j}$ when the magnitude of the corresponding index is I; and, (3) eob_dist(i) is the mean square distortion of dropping the coefficients after state i (eob stands for end-of-block). In step 416, i is set equal to 1, indicating that the method of FIG. 25 begins at the first AC coefficient of block j. In step 418, the minicost for the basic state, and minicost_ext for the extended state are both set equal to large numbers, although not necessarily the same large number. In step 420, the magnitude of the $i^{th}$ coefficient index is set equal to the absolute value of the corresponding $i^{th}$ DCT coefficient first divided by the current quantization step size for this coefficient in zigzag order and then rounded to the nearest integer. In step 422, variable k is assigned a value to represent the maximum possible value of the run immediately before this coefficient. Where i is greater than 15, k is assigned a value of 15. Where i is less than or equal to 15, k is set equal to i−1. At step 424, r, the variable associated with RUN, is set equal to 0.

In step 426, the cost to state i, where i is a basic or regular state, is calculated. At query 428, the process determines whether the current coefficient is one of the first 14 coefficients, for which extended states exist, or not. If the current state is one of the first 14 states, then query 428 returns the answer true and the method proceeds to step 430 in which the cost to the $i^{th}$ extended state is determined before the method then proceeds to query 432. If i exceeds 14, then the method proceeds directly to query 432 from query 428, skipping step 430.

At query 432, the method asks whether r is less than k. Where r is less than k, r is incremented at step 434, and the iteration for calculating the cost to state i is repeated. Where r is not less than k, then the method proceeds to step 436, in which the cost of the special transition (15,0)—i.e. the zero run length code—is calculated. Of course, if i is less than or equal to 15, then there will be no special transition, and therefore, no special transition cost. The method then proceeds to query 438.

Query 438 asks whether i is less than 63—that is, whether the flow chart of FIG. 25 has traversed all of the super nodes of the directed graph of FIG. 21. Where i is less than 63, then query 438 returns the answer true and the method proceeds to step 440 in which i is incremented. Subsequently, the entire iteration is repeated beginning at step 418. If, on the other hand, query 438 returns the answer false, then the minimum cost to each state is deemed to have been calculated (note that the minimum cost to state 0 is 0). In step 442, the total minimum cost of this block when the $i^{th}$ DCT coefficient is the last nonzero coefficient to be sent, $J^*(i)$, $0 \leq i \leq 63$, is computed as the sum of the minimum cost to state i, the mean square distortion of dropping the coefficients after state i (i.e., eob_dist(i)) and the entropy rate associated with the run-level pair (0,0) (i.e., the end-of-block code) scaled by $\lambda$. The total minimum cost of this block, $J^*(i^*)$, is determined by comparing the values $J^*(i)$, $0 \leq i \leq 63$. By backtracking from i* with the help of the stored run-level pairs and the incoming state type, the optimal path in run-level pair format of block j can be determined. In step 444, the run-level pairs from the optimal path are used to update the context models and the process for finding the optimal path for block j is complete.

Figure 26:
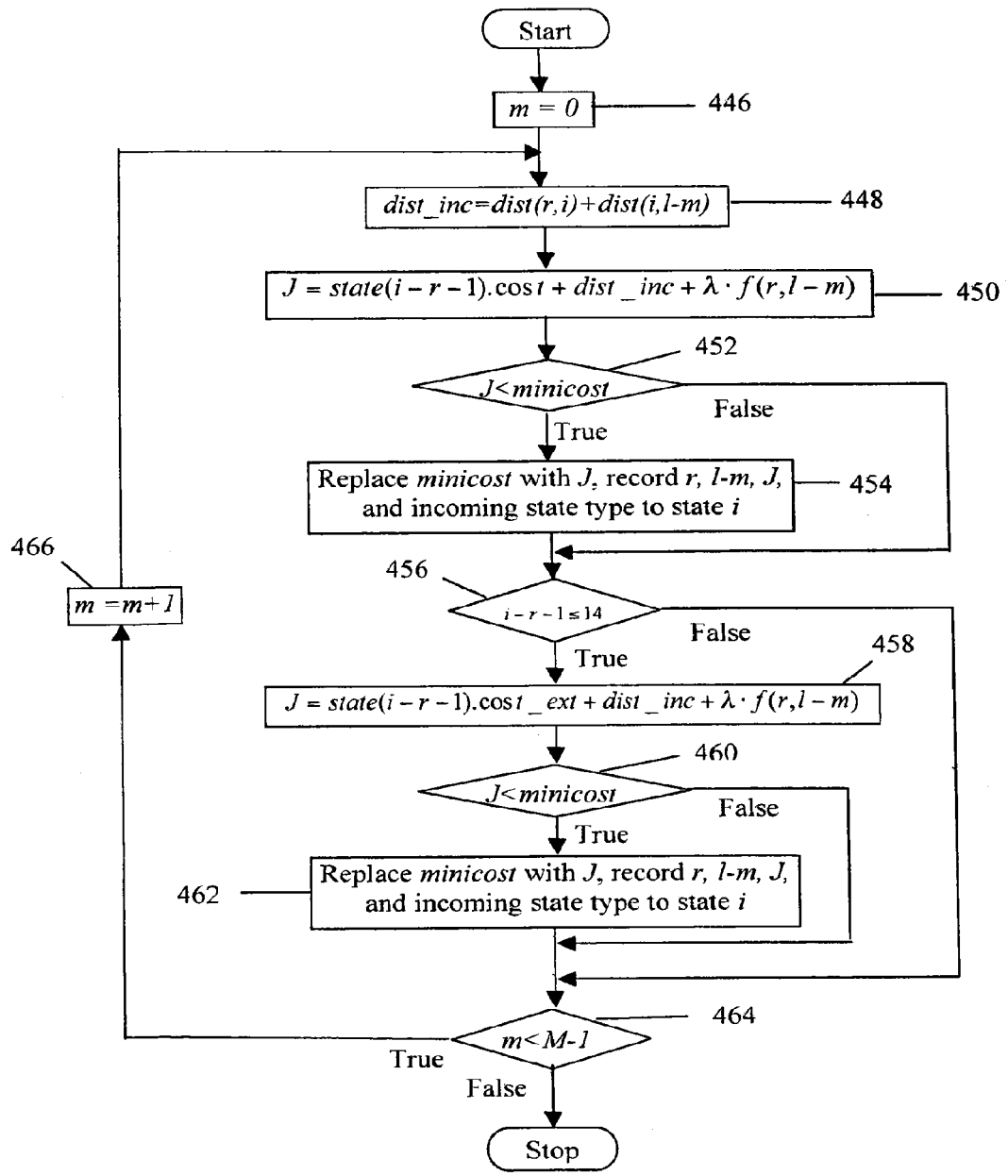
FIG. 26, in a flowchart, illustrates a process of calculating a cost to a basic/regular state invoked in the flowchart of FIG. 25.

Referring now to the flow chart of FIG. 26, the calculation of the cost to the $i^{th}$ basic/regular state of step 426 of FIG. 25 is outlined in more detail. In step 446, an offset m, representing the particular transition being considered, is initially set equal to 0. The method then proceeds to step 448, in which the incremental distortion (dist_inc) is calculated to be the sum of (1) the mean square distortion resulting from dropping all of the coefficients between state i–r–1 and state i (dist(r,i)) and (2) the mean square distortion resulting from the $i^{th}$ DCT coefficient when the corresponding level value is forced to be l–m (dist(i,l–m)). In step 450, the cost of state i is computed as the sum of the cost to state i–r–1, the incremental distortion calculated in step 448 and the entropy rate associated with the run-level pair (r,l–m) scaled by λ.

The method then proceeds to query 452, which asks whether this total cost is less than the minicost term initially set to be a large number in step 418. If the cost to state i is determined to be less than minicost, then the method proceeds to step 454, in which minicost is replaced with J. In addition, r, l–m, J and the incoming state type to state i are all recorded in step 454 before the method proceeds to query 456. If query 452 returns the answer false, in that J is greater than or equal to minicost, then the method proceeds directly to query 456, bypassing step 454.

In query 456, the method checks whether the preceding state is one of the first 14 basic states, or is instead a regular state. If query 456 returns the answer true, then the preceding state is a basic state, and the method proceeds to step 458, query 460 and step 462. If query 456 returns the answer false, in that the preceding state is a regular state rather than a basic state, then the method bypasses step 458, query 460 and step 462, instead proceeding directly to query 464.

In step 458, the method checks the costs to state i through the preceding extended state, instead of the basic state. That is, the cost of state is computed to be the sum of the cost to extended state i–r–1, the incremental distortion from extended state i–r–1 to state i and the entropy rate associated with the run-level pair (r, l–m). The method then proceeds to query 460, which checks whether this total cost is less than minicost. If J is less than minicost then the method proceeds to step 462, in which minicost is replaced with J. In this step, r, l–m, J, and the incoming state type to state i are also recorded. Then the method proceeds to query 464, which checks whether all of the specified transitions from the preceding state to the current state have been checked. If m is less than M–1, then not all of these transitions have been checked, and the method proceeds to step 466, in which m is incremented by 1. The method then proceeds back to step 448, for another transition. If, on the other hand, m is not less than M–1, then step 464 returns the answer false and the method of FIG. 26, in which the cost to the $i^{th}$ basic/regular state is calculated, is complete.

Figure 27:
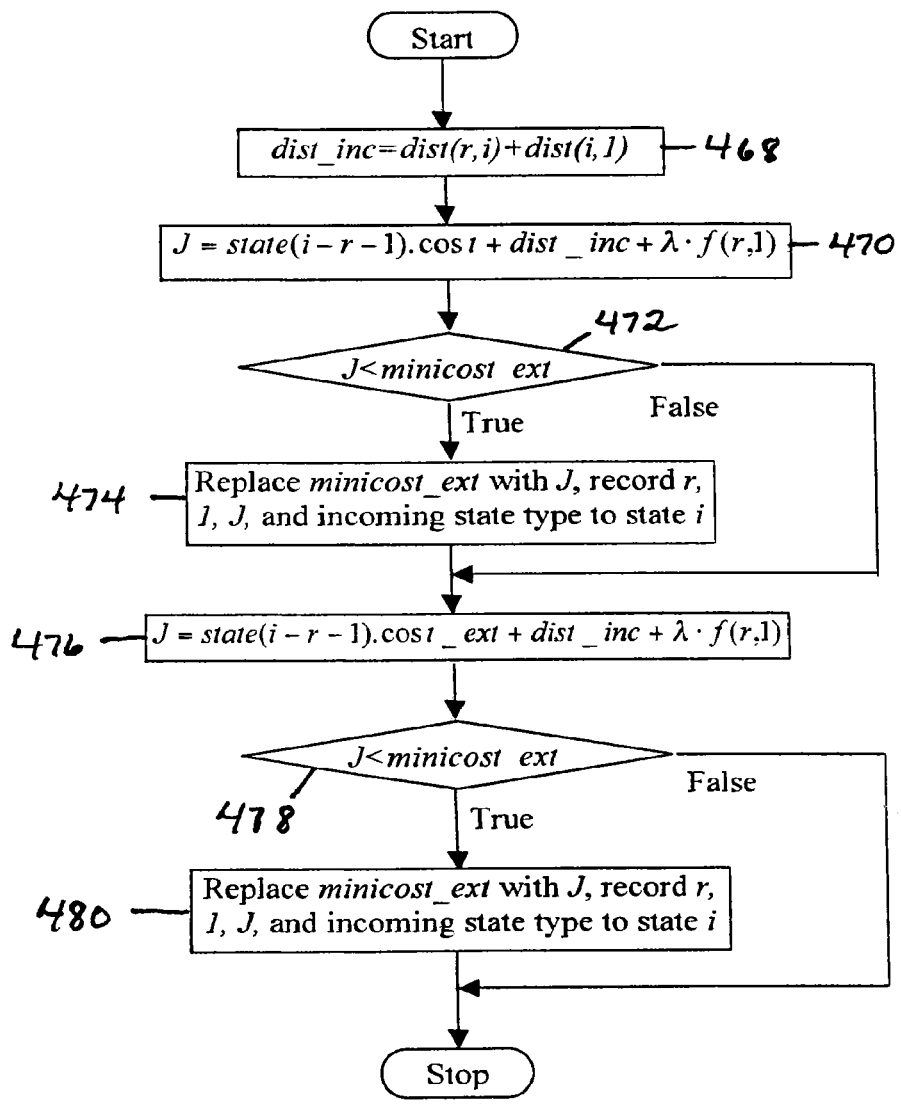
FIG. 27 illustrates a process for calculating the cost to an extended state invoked in the flowchart of FIG. 25.

Referring now to the flow chart of FIG. 27, step 430 of the flow chart of FIG. 25, in which the cost to the $i^{th}$ extended state is calculated, is outlined in more detail. In step 468, the incremental distortion is computed as the sum of (1) the mean square distortion of dropping all of the coefficients between state i–r–1 and state i and (2) the mean square distortion resulting from the $i^{th}$ DCT coefficient when the corresponding index is forced to have level value 1. In step 470, the cost to state i from a preceding basic state i–r–1 is computed as the sum of the cost to basic state i–r–1, the incremental distortion from basic state i–r–1 to state i and the entropy rate associated with the run-level pair (r,1) scaled by λ. The method then proceeds to query 472, which checks whether the cost, J, calculated in step 470 is less than the minicost_ext initially set to be a large number in step 418. If J is less than minicost_ext, then the method proceeds to step 474 in which minicost_ext is replaced with J. Also in step 474, r, 1, J, and the incoming state type to state i are also all recorded. The method then proceeds to step 476. If J is greater than or equal to minicost_ext then the method proceeds directly to step 476 from query 472.

In step 476, the cost to state i from a preceding extended state i–r–1 is calculated as the sum of the cost to extended state i–r–1, the incremental distortion from extended state i–r–1 to state i and the entropy rate associated with the run-level pair (r, 1) scaled by λ. If this cost, J, determined in step 476 is less than minicost_ext, then query 478 returns the answer true and the method proceeds to step 480, in which minicost_ext is replaced with J. The method of FIG. 27, then terminates after step 480. Additionally, r, 1, J and the incoming state type to state i are all recorded in step 480. If the total cost J determined in step 476 is not less than minicost_ext, then the method of FIG. 27 terminates without executing step 480.

Figure 28:
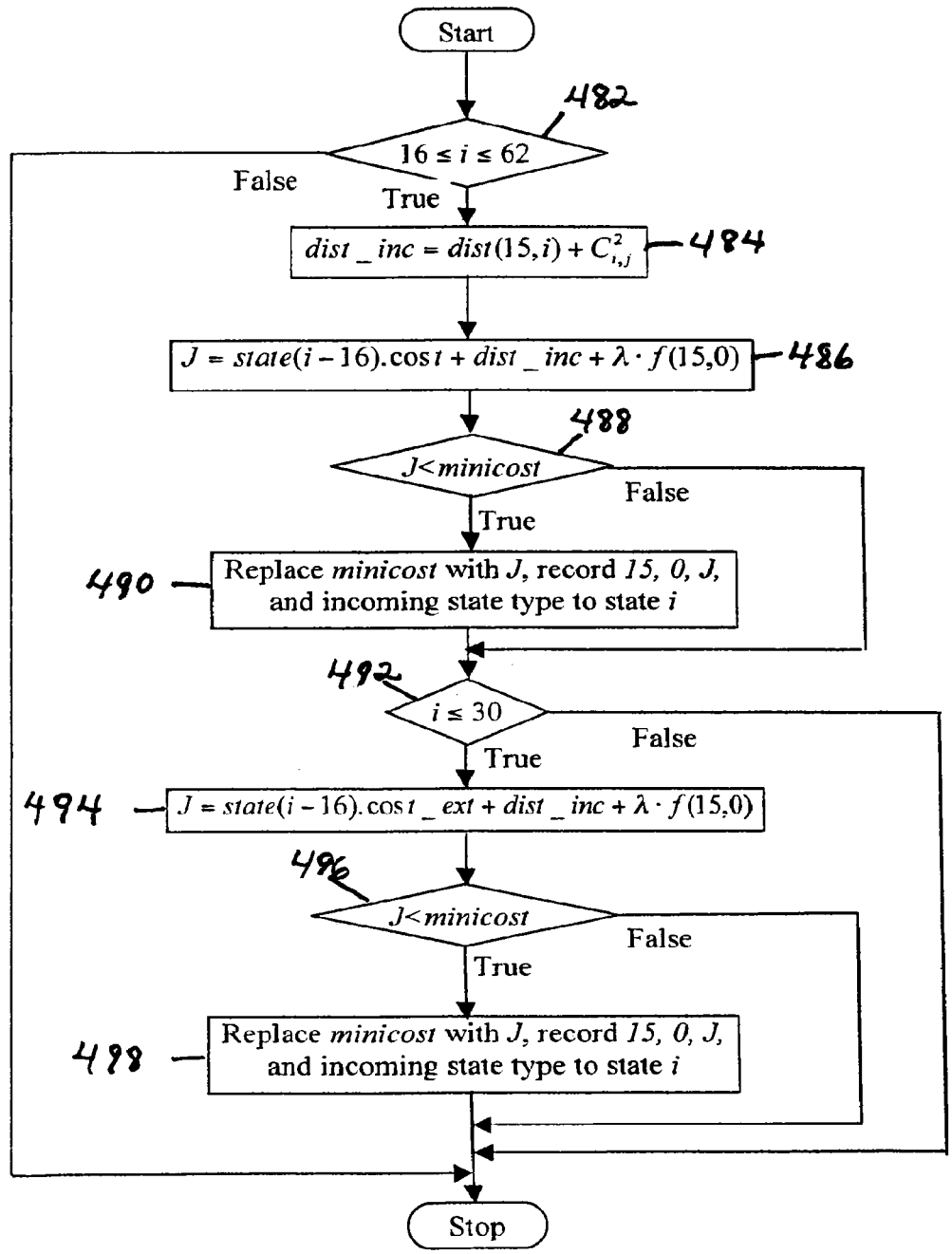
FIG. 28, in a flowchart, illustrates a process for calculating a cost for a special transition designated in a step of the flowchart of FIG. 25.

Referring to FIG. 28, the calculation of the cost for the special transition (15,0) designated in step 436 of the flow chart of FIG. 25 is outlined in more detail. Recall that for each regular state i (i is greater than or equal to 16), there is either one or two additional transitions from state i–16 (depending on whether or not state i–16 is one of the first 14 super states each of which includes two states). These transitions correspond to the zero run length (ZRL) code (15,0). The cost of this additional transition is determined in the method of the flow chart of FIG. 28.

Query 482 begins by checking whether i is less than or equal to 62 and more than or equal to 16. That is, if i is 63 then i corresponds to the last coefficient, and must be separately considered. On the other hand, if i is less than 16, then the run-length cannot, of course, be 15. Thus, if query 482 indicates that i is outside the closed interval [16,62], then the method terminates. Otherwise, the method of FIG. 28 proceeds to step 484 which determines the incremental distortion from state i–r–1 (where r equals 15) to state i as the sum of (1) the mean square distortion of dropping all of the coefficients between state i–16 and state i, and (2) the mean square distortion of dropping the $i^{th}$ DCT coefficient in the current block. Then the cost to state J, is computed in step 486 as the sum of the cost to basic or regular state i–16, the incremental distortion from state i–16 to state i and the entropy rate associated with the run-level pair (15,0) scaled by λ in step 486.

If the cost to state i, J, computed in step 486, is less than minicost then the method proceeds from query 488 to step 490, in which minicost is replaced with J. In addition, the run-length 15, the level value of 0 for the $i^{th}$ node, the cost J and the incoming state type to state i are all recorded in step 490. The method then proceeds to query 492. If the cost calculated in step 486 is not less than minicost, then the method of FIG. 28 proceeds directly from query 488 to query 492.

Query 492 checks whether i is less than or equal to 30, which is significant because if i is less than or equal to 30, then the preceding node under the special transition (15,0) may be an extended node, whereas if i is greater than 30, the preceding node under the special transition (15,0) will be a regular node. If i is less than or equal to 30, then the method of FIG. 28 proceeds to step 494, query 496 and step 498 before terminating, while if i is greater than 30, then the method of FIG. 28 terminates after query 492.

In step 494, the cost to state i is computed as the sum of the cost to extended state i–16, the incremental cost distortion from extended state i–16 to state i and the entropy rate associated with the run-level pair (15,0). If this cost, J, calculated in step 494 is less than minicost, then the method proceeds to step 498, via query 496. Alternatively, if the cost, J, is not less than minicost, then the method of FIG. 28 terminates after query 496. In step 498, minicost is updated to be the cost, J, calculated in step 494. In addition, the run-length of 15, level value of 0 for the $i^{th}$ node, J and the incoming state type to state i (extended) is recorded. Then, the method of FIG. 28 terminates.

Figure 29:
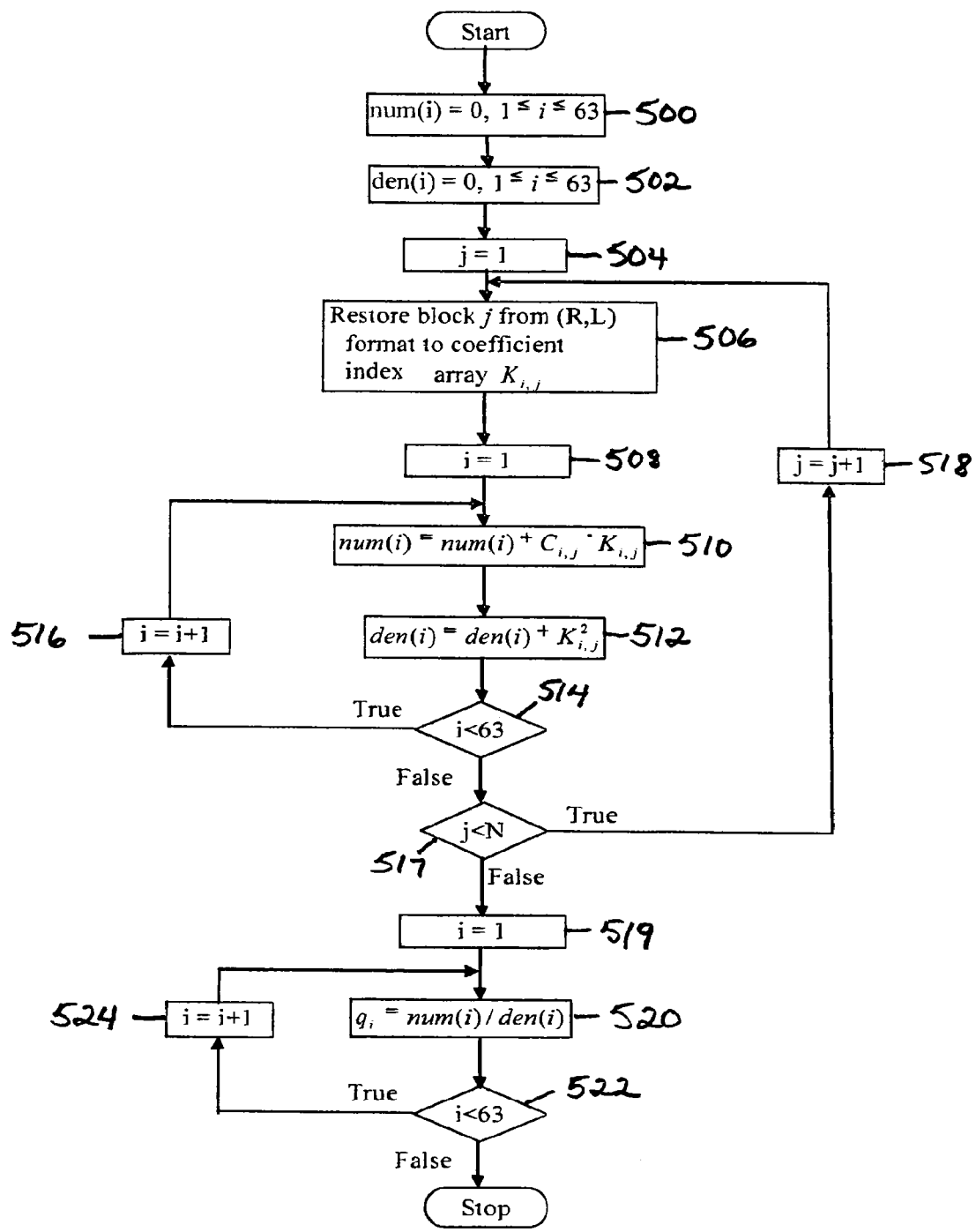
FIG. 29, in a flowchart, illustrates a process for updating a quantization table invoked by the process of the flowchart of FIG. 23.

Referring to the flow chart of FIG. 29, the process for updating the quantization table $Q_{t+1}$, step 366 of the flow chart of FIG. 23, is described in detail. In step 500, a numerator array, num(i) is initialized to 0 for 1≤i≤63. Similarly, in step 502, a denominator array, den(i) is also initialized to 0, for 1≤i≤63. In step 504, the block index j is initialized to 1. In step 506, block j is restored from run-level format to create coefficient index array $K_{i,j}$. In step 508, index i, representing the DCT coefficient position in the zigzag order of the $j^{th}$ block, is set equal to one. In step 510, the $i^{th}$ value in the numerator array is computed as the sum of its current value and the product of the original $i^{th}$ DCT coefficient of the $j^{th}$ block ($C_{i,j}$) and the restored DCT index at the $i^{th}$ position in the zigzag order of the $j^{th}$ block as determined in step 506 ($K_{i,j}$). In step 512, the $i^{th}$ value in the denominator array is computed as the sum of its current value and the square of the DCT index at the $i^{th}$ position in the zigzag order of the $j^{th}$ block ($K_{i,j}^2$)

Query 514 asks whether i is less than 63 (that is, whether all of the coefficients in this block have been considered). If i is less than 63, then the method proceeds from query 514 to step 516 where i is incremented and the method then proceeds back to step 510 for the next coefficient. If, on the other hand, i is not less than 63, the method proceeds from query 514 to query 517, which asks whether j is less than N, the total number of blocks. If j is less than N, then j is incremented in step 518 and the numerator and denominator arrays are updated based on the next block, as the method of FIG. 29 returns to step 506 described above. Otherwise, step 519 sets i=1.

In step 520, the value associated with the $i^{th}$ position in the zigzag order of the quantization table $Q_{t+1}$, $q_i$, is computed as the value of the numerator over the denominator at position i. Query 522 then asks whether i is less than 63. Where this is true, i is incremented at step 524 and the remaining elements in the quantization table are computed. Otherwise, the updating of $Q_{t+1}$, is complete and the method of FIG. 29 terminates.

In the rest of this section, we look at an example of calculating the entropy rate of a given transition.

Example: Calculate the entropy rate of the transition from state 14 to state 16 in FIG. 21 for a given/(i.e., the entropy rate of transition (1, l) from state 14 to state 16).

Except for the special transitions (0, 0) and (15, 0), the entropy rate associated with any transition consists of three parts: entropy rate of RUN, entropy rate of the sign of LEVEL, and entropy rate of the magnitude of LEVEL.

The entropy rate of RUN is the entropy rate of each bit of the current RUN, 1, which is binarized as three bits 001 according to the binarization scheme mentioned above. Since this RUN is not the first RUN (a RUN starting from state 0 is the first RUN), its first bit, second bit and remaining bits use different context models that can be determined from the zigzag order of the preceding LEVEL (here the zigzag order of the preceding LEVEL is 14 since this transition starts from state 14) and the magnitude of LEVEL of state 14 (since this transition starts from an extended state, the context model corresponding to the unity magnitude will be used). Once the context models are determined, we can find the corresponding entropy rate based on the current probability distribution of the context models.

A fixed context model is used for the sign bit at the last entropy encoding stage. We may use one bit (properly scaled by λ) as the cost of the sign bit in the calculation of incremental Lagrangian cost.

The magnitude of LEVEL is binarized as (|LEVEL|−1) "0's" followed by an ending "1". The first bit and the remaining bits of the magnitude use different context models which can be determined by the zigzag order of current state (here the zigzag order of the current state is 16) and the current run (here the current run is 1). Given a LEVEL, l, the entropy rate can be determined accordingly.

In practice, we do not have to compare the incremental costs among all the 2m−2 transitions between a predecessor and a basic state or 2m transitions between a predecessor and a regular state. Instead, we may only compare a few (e.g. 4) transitions among LEVEL=l+1, l, l−1, l−2, l−3, . . . , where l is the absolute value of the output of the hard-decision quantizer with the latest quantization step size. Other levels most likely result in larger incremental costs. We shall compare the performance and complexity difference when the number of transitions in comparison changes in the next subsection.

In accordance with still further aspects of the invention, the data processing system 230 illustrated in FIG. 13 may also be used to implement compression methods such as those described above in connection with FIGS. 19 to 29. In these cases, the memory 234 may include Huffmann decoded images obtained from JPEG or MPEG files, as well as uncompressed images. On receiving instructions from a user via the user interface 236, the microprocessor 238 will compress the input image data in the manner described above using the calculation module and initialization module before providing the compressed data to the communication subsystem 240. The communication subsystem 240 may then transmit this compressed data to network 242.

As described above in Section 1, the system 240 may be incorporated into a digital camera or cell phone, while the mode of transmission from communication subsystem 240 to network 242 may be wireless or over the phone line, as well as by high band width connection.

Experimental Results

Figure 30:
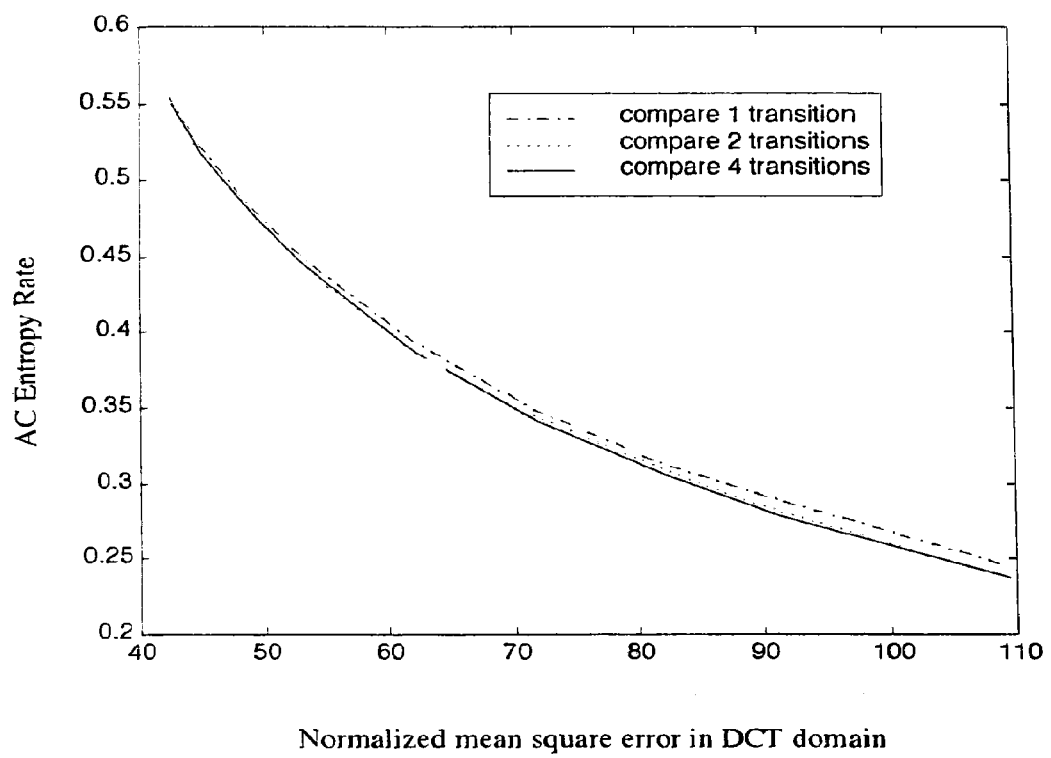
FIG. 30 plots rate-distortion curves of different configurations and optimization methods in accordance with further different aspects of the present invention applied to a 512×512 Barbara image.

As discussed in the last subsection, given a state (other than any of the extended states or the end state) and a predecessor, there are 2m or 2m−2 possible transitions where m is the maximum magnitude of LEVEL. We may find the minimum incremental cost by comparing any number of transitions up to 2m or 2m−2 between these two states. Simulation results show that comparing only two transitions achieves most of the gain a full comparison scheme can achieve. As an example, FIG. 30 plots the R-D curves when the number of transitions in comparison varies for a 512×512 Barbara image. When the number of transitions in comparison is greater than 4, there is almost no difference in compression performance. In the following experiments, we only compare up to four transitions between any two states. Table VI tabulates the CPU times for the C code implementation of the context arithmetic coding-based joint optimization algorithm for one iteration on a Pentium PC with 512×512 Barbara image when the number of transitions in comparison varies.

TABLE VI

CPU time of the proposed joint optimization algorithm on a Pentium PC (512 × 512 Barbara)

| Settings | Float DCT | Fast integer DCT |
|---|---|---|
| Comparing 1 transition | 1.7 s | 0.30 s |
| Comparing 4 transitions | 1.7 s | 0.35 s |
| Comparing 20 transitions | 1.9 s | 0.48 s |

The iterative algorithm outlined above in this section starts with an initial quantization table and updates the step sizes using the algorithm outlined in section I during the iteration. Since the step size updating algorithm in section I only achieves local optimality, the initial quantization tables also impact the R-D performance in certain degree. We can use a scaled default quantization from reference [1] or any other quantization tables such as one obtained from the schemes in references [3], [9] and [5] as we did in section I.

Figure 31:
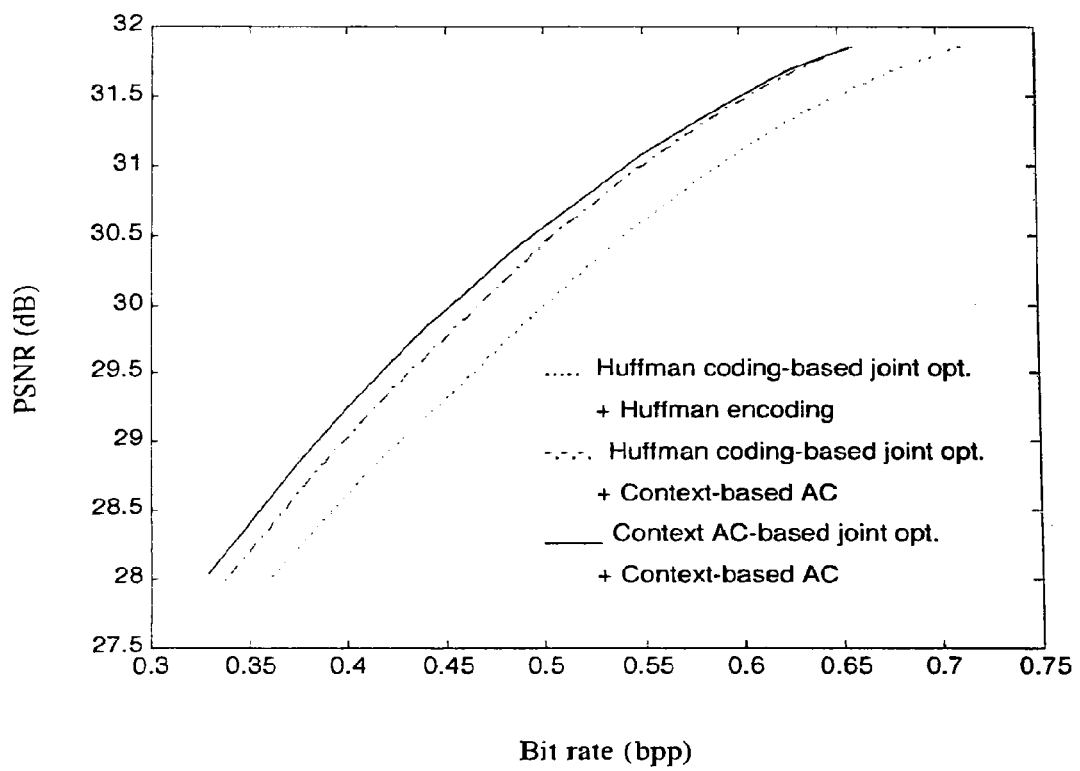
FIG. 31 plots rate-distortion (PSNR) curves for different configurations of optimization methods in accordance with different aspects of the present invention applied to a 512×512 Barbara image given a scaled default quantization table; and, FIG. 32 plots rate-distortion (PSNR) curves for different configurations of optimization methods in accordance with different aspects of the present invention applied to a 512×512 Lena image given a scaled default quantization table.
Figure 32:
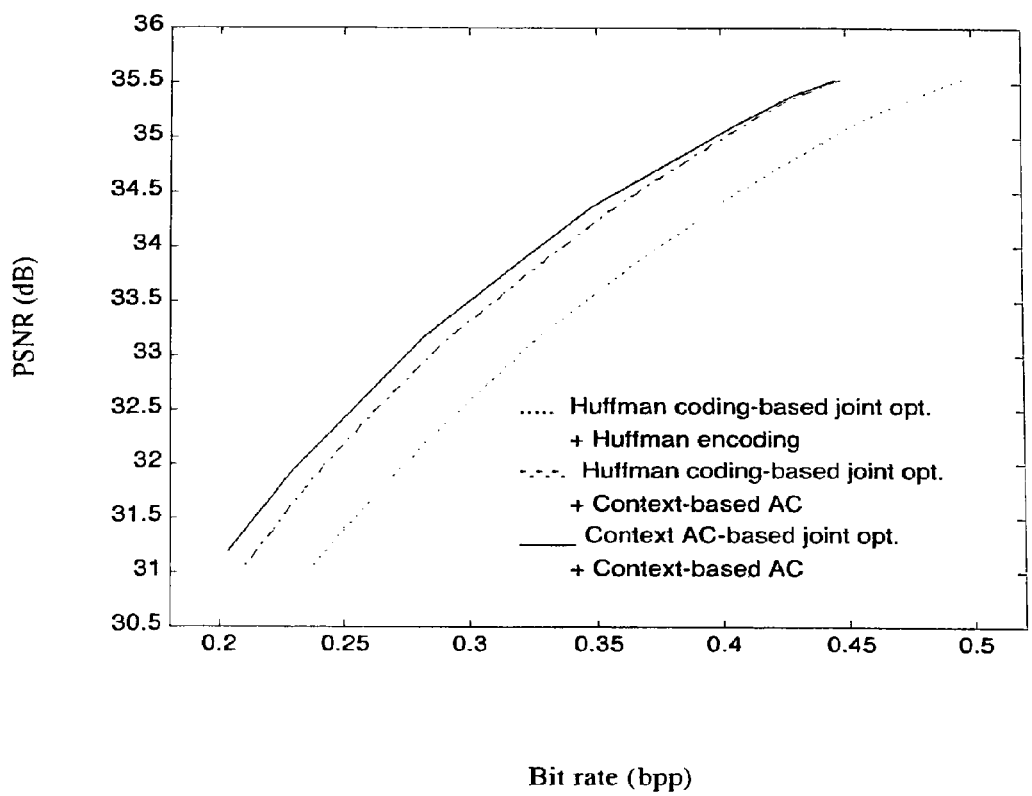

In this section, we only start the algorithm with a scaled default quantization table and compare the performance between the Huffman coding-based joint optimization algorithm and context arithmetic coding-based joint optimization. FIG. 31 shows the PSNR performance of context arithmetic coding-based joint optimization algorithm and Huffman coding-based joint optimization algorithm for 512×512 Barbara image. The curves are obtained by sweeping the Lagrangian multiplier λ through possible values given a scaled default quantization table. For illustration purposes, also shown in FIG. 31 is the PSNR performance curve generated by a mixed scheme where only the last stage of Huffman encoding in Huffman coding-based joint optimization algorithm is replaced by context-based arithmetic coding. It is easy to see that the gain of context arithmetic coding-based joint optimization algorithm over Huffman coding-based joint optimization algorithm comes from two parts. The first part comes from the gain of context-based arithmetic coding over customized Huffman coding. The second part comes from the joint optimization. FIG. 32 compares the same performance for 512×512 Lena image. Tables VII and VIII tabulate the coding results at the most popular bit rates for both images where the default quantization table is linearly scaled at the beginning for each bit rate. From these tables and figures, one can see that the context arithmetic coding-based joint optimization algorithm consistently outperforms the Huffman coding-based joint optimization algorithm by a margin up to 0.5 dB, or 10~15% size reduction.

TABLE VII

Comparison of PSNR with different optimization methods (512 × 512 Barbara)

| Rate (bpp) | Customized baseline | Huffman coding-based joint opt.[1] | Huffman coding-based joint opt. + context-based arithmetic coding | Context arithmetic coding-based joint opt. |
|---|---|---|---|---|
| .25 | 25.31 | 26.93 | 27.23 | 27.24 |
| .50 | 28.34 | 30.65 | 31.06 | 31.11 |
| .75 | 31.02 | 33.12 | 33.53 | 33.72 |
| 1.00 | 33.16 | 35.18 | 35.52 | 35.68 |

TABLE VIII

Comparison of PSNR with different optimization methods (512 × 512 Lena)

| Rate (bpp) | Customized baseline | Huffman coding-based joint opt.[1] | Huffman coding-based joint opt. + context-based arithmetic coding | Context arithmetic coding-based joint opt. |
|---|---|---|---|---|
| .25 | 31.63 | 32.37 | 32.92 | 32.96 |
| .50 | 34.90 | 35.75 | 36.18 | 36.22 |
| .75 | 36.62 | 37.60 | 38.07 | 38.11 |
| 1.00 | 37.91 | 39.13 | 39.46 | 39.53 |

Other variations and modifications of the invention are possible. For example, the context models described above in section II could readily be replaced with other context models. Further, while the aspects of the invention described above have relied on (run, size) pairs and (run, level) pairs, it will be appreciated by those of skill in the art that other (run, index derivative) pairs could be used by deriving index-based values other than size or level from the coefficient indices. All such and similar modifications or variations are believed to be within the sphere and scope of the invention as defined by the claims appended hereto.

The invention claimed is:

1. A method of compressing a sequence of n coefficients by determining a cost-determined sequence of n coefficient indices represented by a cost-determined sequence of (run, index derivative) pairs under a given quantization table and run-index derivative coding distribution, wherein each sequence of (run, index derivative) pairs defines a corresponding sequence of coefficient indices such that each index in the corresponding sequence of coefficient indices is a digital number, the corresponding sequence of coefficient indices includes a plurality of values including a special value, and each (run, index derivative) pair defines a run value representing a number of consecutive indices of the special value, and an index-based value derived from a value of the index following the number of consecutive indices of the special value, the method comprising:
   (a) using the given quantization table and run-index derivative coding distribution to formulate a cost function for a plurality of possible sequences of (run, index derivative) pairs;
   (b) applying the cost function to each possible sequence in the plurality of possible sequences of (run, index derivative) pairs to determine an associated cost of each of the plurality of possible sequences of (run, index derivative) pairs;
   (c) selecting the cost-determined sequence of (run, index derivative) pairs from the plurality of possible sequences of (run, index derivative) pairs based on the associated cost of each of the plurality of possible sequences of (run, index derivative) pairs; and,
   (d) encoding the cost-determined sequence of (run, index derivative) pairs using arithmetic coding, with a plurality of context models, based on the given run-index derivative coding distribution.

2. The method according to claim 1, wherein (b) comprises, for each possible sequence of (run, index derivative) pairs in the plurality of possible sequences of (run, index derivative) pairs:
   (i) determining a corresponding sequence of n coefficient indices;

(ii) determining a corresponding sequence of n quantized coefficients using the given quantization table and the corresponding sequence of n coefficient indices;

(iii) determining a distortion between the sequence of n coefficients and the corresponding sequence of n quantized coefficients;

(iv) determining a total compression rate resulting from using the given run-index derivative coding distribution to encode the sequence of (run, index derivative) pairs; and (v) determining the associated cost of the sequence of (run, index derivative) pairs as a function of the distortion and the total compression rate.

3. The method according to claim 1, wherein (c) comprises:

(i) providing a sequence of n super nodes, each super node comprising at least one node, in one-to-one relation with the sequence of n coefficients, such that each coefficient Ci has a corresponding ith super node wherein i is greater than or equal to 1 and less than or equal to n;

(ii) providing an initial node preceding and an end node following the sequence of n super nodes;

(iii) providing a plurality of connections between pairs of nodes including the initial node, super nodes, and the end node to represent a plurality of possible (run, index derivative) pairs;

(iv) determining the associated cost of each of the plurality of possible sequences of (run, index derivative) pairs by determining an associated incremental cost for each connection in the plurality of connections;

(v) determining a least cost sequence of connections from the plurality of connections, wherein the least cost sequence of connections extends from the initial node to the end node via at least one super node; and, (vi) determining the cost-determined sequence of (run, index derivative) pairs from the least cost sequence of connections.

4. The method as defined in claim 3, wherein (c)(v) further comprises using dynamic programming to find the least cost sequence of connections in the plurality of connections, wherein the least cost sequence of connections extends from the initial node to the end node via at least one super node.

5. The method as defined in claim 3, wherein (c)(iv) further comprises:

defining an incremental rate cost, for each connection, representing an associated (run, index derivative) pair, from one of the initial node and an (i−r−1)th super node to an ith super node, as a number of bits needed to encode the run value of the associated (run, index derivative) pair and the index-based value derived from the associated (run, index derivative) pair;

defining an incremental distortion cost, for each connection from one of the initial node and the (i−r−1)th super node to the ith super node, as a distortion incurred when the coefficient Ci is quantized to a value associated with the index-based value derived from the associated (run, index derivative) pair and all r coefficients appearing from coefficient Ci−r to coefficient Ci−1 are quantized to the special value; and defining the associated incremental cost, for each connection from one of the initial node and the (i−r−1)th super node to the ith super node, as a function of the incremental distortion cost and the incremental rate cost.

6. The method as defined in claim 3, wherein each (run, index derivative) pair is a (run, level) pair such that the index-based value is defined to be a level value defined as the value of the index following the number of consecutive indices of the special value.

7. The method as defined in claim 6 wherein providing the plurality of connections between pairs of nodes including the initial node, the super nodes, and the end node comprises:

for each super node in the sequence of n super nodes, and for each predecessor node including the initial node preceding that super node in the sequence of n super nodes and the initial node, wherein that super node and that predecessor node are separated by a number of intermediary nodes not exceeding a maximum run value in the plurality of possible (run, level) pairs, establishing a number of connections connecting that super node to that predecessor node equaling up to four times a maximum level magnitude in the plurality of possible (run, level) pairs, wherein each connection between a pair of connected nodes corresponds to a different level value;

for each super node other than the last super node in the sequence of n super nodes, and for each predecessor node including the initial node preceding that super node in the sequence of n super nodes, wherein the number of intermediary nodes separating that super node and that predecessor node equals the maximum run value in the plurality of (run, level) pairs, establishing up to two further connections connecting that super node to that predecessor node; and, for each node in the sequence of a super nodes and the initial node, establishing a single connection to the end node.

8. The method as defined in claim 7 wherein the run value and the level value of each (run, level) pair in the cost-determined sequence of (run, level) pairs are separately encoded.

9. The method as defined in claim 8 wherein the sequence of n coefficients comprises a first group of coefficients and a second group of coefficients disjoint from the first group of coefficients; and encoding the cost-determined sequence of (run, level) pairs comprises encoding the run value of each (run, level) pair in the cost-determined sequence of (run, level) pairs based on both the level value and an ordered location of the index preceding the number of consecutive indices of the special value associated with the run in the sequence of n coefficients, if the coefficient corresponding to the index preceding the number of consecutive indices of the special value associated with the run is in the first group of coefficients, and the ordered location of the index preceding the number of consecutive indices of the special value associated with the run in the sequence of n coefficients, if the coefficient corresponding to the index preceding the number of consecutive indices of the special value associated with the run is in the second group of coefficients.

10. The method as defined in claim 9 wherein each super node having a corresponding coefficient in the first group of coefficients comprises two associated nodes;

each super node having a corresponding coefficient in the second group of coefficients comprises a single associated node; and, the plurality of connections between pairs of super nodes comprises a plurality of connections between non-associated pairs of nodes representing the plurality of possible (run, level) pairs.

11. The method as defined in claim 10 wherein providing the plurality of connections between pairs of super nodes further comprises:

for each super node in the sequence of n super nodes, determining an output level using a hard-decision quantizer defined by the given quantization table to quantize the corresponding coefficient in the sequence of n coefficients; and for each super node in the sequence of n super nodes, and for each predecessor node preceding that super node in the sequence of n super nodes, the predecessor node being the initial node or a super node, wherein the number of intermediary nodes separating that super node and that predecessor node does not exceed the maximum run value in the plurality of possible (run, level) pairs, establishing a reduced number of connections connecting a node in that super node to that predecessor node, wherein each connection between a pair of connected nodes in the reduced number of connections corresponds to a different level value within a selected difference of the output level determined for that super node.

12. A data processing system for compressing a sequence of n coefficients by determining a cost-determined sequence of n coefficient indices represented by a cost-determined sequence of (run, index derivative) pairs under a given quantization table and run-index derivative coding distribution, wherein each sequence of (run, index derivative) pairs defines a corresponding sequence of coefficient indices such that each index in the corresponding sequence of coefficient indices is a digital number, the corresponding sequence of coefficient indices includes a plurality of values including a special value, and each (run, index derivative) pair defines a run value representing a number of consecutive indices of the special value, and an index-based value derived from a value of the index following the number of consecutive indices of the special value, the data processing system comprising:
   (a) an initialization module for using the given quantization table and run-index derivative coding distribution to formulate a cost function for a plurality of possible sequences of (run, index derivative) pairs;
   (b) a calculation module for applying the cost function to each possible sequence in the plurality of possible sequences of (run, index derivative) pairs to determine an associated cost of each of the plurality of possible sequences of (run, index derivative) pairs, and for selecting the cost-determined sequence of (run, index derivative) pairs from the plurality of possible sequences of (run, index derivative) pairs based on the associated cost of each of the plurality of possible sequences of (run, index derivative) pairs; and encoding the cost-determined sequence of (run, index derivative) pairs using arithmetic coding, with a plurality of context models, based on the given run-index derivative coding distribution.

13. The data processing system according to claim 12, wherein the calculation module is further operable to perform the steps of, for each possible sequence of (run, index derivative) pairs in the plurality of possible sequences of (run, index derivative) pairs:
   (i) determining a corresponding sequence of n coefficient indices;
   (ii) determining a corresponding sequence of n quantized coefficients using the given quantization table and the corresponding sequence of n coefficient indices;
   (iii) determining a distortion between the sequence of n coefficients and the corresponding sequence of n quantized coefficients;
   (iv) determining a total compression rate resulting from using the given run-index derivative coding distribution to encode the sequence of (run, index derivative) pairs; and
   (v) determining the associated cost of the sequence of (run, index derivative) pairs as a function of the distortion and the total compression rate.

14. The data processing system according to claim 12, wherein the calculation module is further operable to perform the steps of:
   (i) providing a sequence of n super nodes, each super node comprising at least one node, in one-to-one relation with the sequence of n coefficients, such that each coefficient $C_i$ has a corresponding ith super node wherein i is greater than or equal to 1 and less than or equal to n;
   (ii) providing an initial node preceding and an end node following the sequence of n super nodes;
   (iii) providing a plurality of connections between pairs of nodes including the initial node, super nodes, and the end node to represent a plurality of possible (run, index derivative) pairs;
   (iv) determining the associated cost of each of the plurality of possible sequences of (run, index derivative) pairs by determining an associated incremental cost for each connection in the plurality of connections;
   (v) determining a least cost sequence of connections from the plurality of connections, wherein the least cost sequence of connections extends from the initial node to the end node via at least one super node; and,
   (vi) determining the cost-determined sequence of (run, index derivative) pairs from the least cost sequence of connections.

15. The data processing system as defined in claim 14, wherein the calculation module is further operable to use dynamic programming to find the least cost sequence of connections in the plurality of connections, wherein the least cost sequence of connections extends from the initial node to the end node via at least one super node.

16. The data processing system as defined in claim 14, wherein the calculation module is further operable to perform the steps of:
   defining an incremental rate cost, for each connection, representing an associated (run, index derivative) pair, from one of the initial node and an (i–r–1)th super node to an ith super node, as a number of bits needed to encode the run value of the associated (run, index derivative) pair and the index-based value derived from the associated (run, index derivative) pair;
   defining an incremental distortion cost, for each connection from one of the initial node and the (i–r–1)th super node to the ith super node, as a distortion incurred when the coefficient $C_i$ is quantized to a value associated with the index-based value derived from the associated (run, index derivative) pair and all r coefficients appearing from coefficient $C_{i-r}$ to coefficient $C_{i-1}$ are quantized to the special value; and
   defining the associated incremental cost, for each connection from one of the initial node and the (i–r–1)th super node to the ith super node, as a function of the incremental distortion cost and the incremental rate cost.

17. The data processing system as defined in claim 14, wherein each (run, index derivative) pair is a (run, level) pair such that the index-based value is defined to be a level value defined as the value of the index following the number of consecutive indices of the special value.

18. The data processing system as defined in claim 17 wherein providing the plurality of connections between pairs of nodes including the initial node, the super nodes, and the end node comprises:

for each super node in the sequence of n super nodes, and for each predecessor node including the initial node preceding that super node in the sequence of n super nodes and the initial node, wherein that super node and that predecessor node are separated by a number of intermediary nodes not exceeding a maximum run value in the plurality of possible (run, level) pairs, establishing a number of connections connecting that super node to that predecessor node equaling up to four times a maximum level magnitude in the plurality of possible (run, level) pairs, wherein each connection between pairs of connected nodes corresponds to a different level value;

for each super node other than the last super node in the sequence of n super nodes, and for each predecessor node including the initial node preceding that super node in the sequence of n super nodes, wherein the number of intermediary nodes separating that super node and that predecessor node equals the maximum run value in the plurality of (run, level) pairs, establishing up to two further connections connecting that super node to that predecessor node; and, for each node in the sequence of n super nodes and the initial node, establishing a single connection to the end node.

19. The data processing system as defined in claim 18 wherein the run value and the level value of each (run, level) pair in the cost-determined sequence of (run, level) pairs are separately encoded.

20. The data processing system as defined in claim 19 wherein the sequence of n coefficients comprises a first group of coefficients and a second group of coefficients disjoint from the first group of coefficients; and the calculation module is operable to encode the run value of each (run, level) pair in the cost-determined sequence of (run, level) pairs based on both the level value and an ordered location of the index preceding the number of consecutive indices of the special value associated with the run in the sequence of n coefficients, if the coefficient corresponding to the index preceding the number of consecutive indices of the special value associated with the run is in the first group of coefficients, and the ordered location of the index preceding the number of consecutive indices of the special value associated with the run in the sequence of n coefficients, if the coefficient corresponding to the index preceding the number of consecutive indices of the special value associated with the run is in the second group of coefficients.

21. The data processing system as defined in claim 20 wherein each super node having a corresponding coefficient in the first group of coefficients comprises two associated nodes;

each super node having a corresponding coefficient in the second group of coefficients comprises a single associated node; and, the plurality of connections between pairs of super nodes comprises a plurality of connections between non-associated pairs of nodes representing the plurality of possible (run, level) pairs.

22. The data processing system as defined in claim 21 wherein providing the plurality of connections between pairs of super nodes further comprises:

for each super node in the sequence of n super nodes, determining an output level using a hard-decision quantizer defined by the given quantization table to quantize the corresponding coefficient in the sequence of n coefficients; and for each super node in the sequence of n super nodes, and for each predecessor node preceding that super node in the sequence of n super nodes, the predecessor node being the initial node or a super node, wherein the number of intermediary nodes separating that super node and that predecessor node does not exceed the maximum run value in the plurality of possible (run, level) pairs, establishing a reduced number of connections connecting a node in that super node to that predecessor node, wherein each connection between a pair of connected nodes in the reduced number of connections corresponds to a different level value within a selected difference of the output level determined for that super node.

23. A computer program product for use on a computer system to compress a sequence of n coefficients by determining a cost-determined sequence of n coefficient indices represented by a cost-determined sequence of (run, index derivative) pairs under a given quantization table and run-index derivative coding distribution, wherein each sequence of (run, index derivative) pairs defines a corresponding sequence of coefficient indices such that each index in the corresponding sequence of coefficient indices is a digital number, the corresponding sequence of coefficient indices includes a plurality of values including a special value, and each (run, index derivative) pair defines a run value representing a number of consecutive indices of the special value, and an index-based value derived from a value of the index following the number of consecutive indices of the special value, the computer program product comprising a non-transitory computer readable recording medium, and instructions recorded on the recording medium for instructing the computer system to perform the steps of:

(a) using the given quantization table and run-index derivative coding distribution to formulate a cost function for a plurality of possible sequences of (run, index derivative) pairs;

(b) applying the cost function to each possible sequence in the plurality of possible sequences of (run, index derivative) pairs to determine an associated cost of each of the plurality of possible sequences of (run, index derivative) pairs; and, (c) selecting the cost-determined sequence of (run, index derivative) pairs from the plurality of possible sequences of (run, index derivative) pairs based on the associated cost of each of the plurality of possible sequences of (run, index derivative) pairs; and, (d) encoding the cost-determined sequence of (run, index derivative) pairs using arithmetic coding, with a plurality of context models, based on the given run-index derivative coding distribution.

24. The computer program product according to claim 23, wherein step (b) comprises, for each possible sequence of (run, index derivative) pairs in the plurality of possible sequences of (run, index derivative) pairs:

(i) determining a corresponding sequence of n coefficient indices;

(ii) determining a corresponding sequence of n quantized coefficients using the given quantization table and the corresponding sequence of n coefficient indices;

(iii) determining a distortion between the sequence of n coefficients and the corresponding sequence of n quantized coefficients;

(iv) determining a total compression rate resulting from using the given run-index derivative coding distribution to encode the sequence of (run, index derivative) pairs; and (v) determining the associated cost of the sequence of (run, index derivative) pairs as a function of the distortion and the total compression rate.

25. The computer program product according to claim 23, wherein step (c) comprises:

(i) providing a sequence of n super nodes, each super node comprising at least one node, in one-to-one relation with the sequence of n coefficients, such that each coefficient Ci has a corresponding ith super node wherein i is greater than or equal to 1 and less than or equal to n;

(ii) providing an initial node preceding and an end node following the sequence of n super nodes;

(iii) providing a plurality of connections between pairs of nodes including the initial node, super nodes, and the end node to represent a plurality of possible (run, index derivative) pairs;

(iv) determining the associated cost of each of the plurality of possible sequences of (run, index derivative) pairs by determining an associated incremental cost for each connection in the plurality of connections;

(v) determining a least cost sequence of connections from the plurality of connections, wherein the least cost sequence of connections extends from the initial node to the end node via at least one super node; and, (vi) determining the cost-determined sequence of (run, index derivative) pairs from the least cost sequence of connections.

26. The computer program product as defined in claim 25, wherein step (c)(v) further comprises using dynamic programming to find the least cost sequence of connections in the plurality of connections, wherein the least cost sequence of connections extends from the initial node to the end node via at least one super node.

27. The computer program product as defined in claim 25, wherein step (c)(iv) further comprises:

defining an incremental rate cost, for each connection, representing an associated (run, index derivative) pair, from one of the initial node and an (i−r−1)th super node to an ith super node, as a number of bits needed to encode the run value of the associated (run, index derivative) pair and the index-based value derived from the associated (run, index derivative) pair;

defining an incremental distortion cost, for each connection from one of the initial node and the (i−r−1)th super node to the ith super node, as a distortion incurred when the coefficient Ci is quantized to a value associated with the index-based value derived from the associated (run, index derivative) pair and all r coefficients appearing from coefficient Ci−r to coefficient Ci−1 are quantized to the special value; and defining the associated incremental cost, for each connection from one of the initial node and the (i−r−1)th super node to the ith super node, as a function of the incremental distortion cost and the incremental rate cost.

28. The computer program product as defined in claim 25, wherein each (run, index derivative) pair is a (run, level) pair such that the index-based value is defined to be a level value defined as the value of the index following the number of consecutive indices of the special value.

29. The computer program product as defined in claim 28 wherein providing the plurality of connections between pairs of nodes including the initial node, the super nodes, and the end node comprises:

for each super node in the sequence of n super nodes, and for each predecessor node including the initial node preceding that super node in the sequence of n super nodes and the initial node, wherein that super node and that predecessor node are separated by a number of intermediary nodes not exceeding a maximum run value in the plurality of possible (run, level) pairs, establishing a number of connections connecting that super node to that predecessor node equaling up to four times a maximum level magnitude in the plurality of possible (run, level) pairs, wherein each connection between a pair of connected nodes corresponds to a different level value;

for each super node other than the last super node in the sequence of n super nodes, and for each predecessor node including the initial node preceding that super node in the sequence of n super nodes, wherein the number of intermediary nodes separating that super node and that predecessor node equals the maximum run value in the plurality of (run, level) pairs, establishing up to two further connections connecting that super node to that predecessor node; and, for each node in the sequence of n super nodes and the initial node, establishing a single connection to the end node.

30. The computer program product as defined in claim 29 wherein the run value and the level value of each (run, level) pair in the cost-determined sequence of (run, level) pairs are separately encoded.

31. The computer program product as defined in claim 30 wherein the sequence of n coefficients comprises a first group of coefficients and a second group of coefficients disjoint from the first group of coefficients; and encoding the cost-determined sequence of (run, level) pairs comprises encoding the run value of each (run, level) pair in the cost-determined sequence of (run, level) pairs based on both the level value and an ordered location of the index preceding the number of consecutive indices of the special value associated with the run in the sequence of n coefficients, if the coefficient corresponding to the index preceding the number of consecutive indices of the special value associated with the run is in the first group of coefficients, and the ordered location of the index preceding the number of consecutive indices of the special value associated with the run in the sequence of n coefficients, if the coefficient corresponding to the index preceding the number of consecutive indices of the special value associated with the run is in the second group of coefficients.

32. The computer program product as defined in claim 31 wherein each super node having a corresponding coefficient in the first group of coefficients comprises two associated nodes;

each super node having a corresponding coefficient in the second group of coefficients comprises a single associated node; and, the plurality of connections between pairs of super nodes comprises a plurality of connections between non-associated pairs of nodes representing the plurality of possible (run, level) pairs.

33. The computer program product as defined in claim 32 wherein providing the plurality of connections between pairs of super nodes further comprises:

for each super node in the sequence of n super nodes, determining an output level using a hard-decision quantizer defined by the given quantization table to quantize the corresponding coefficient in the sequence of n coefficients; and for each super node in the sequence of n super nodes, and for each predecessor node preceding that super node in the sequence of n super nodes, the predecessor node being the initial node or a super node, wherein the number of intermediary nodes separating that super node and that predecessor node does not exceed the maximum run value in the plurality of possible (run, level) pairs, establishing a reduced number of connections connecting a node in that super node to that predecessor node, wherein each connection between a pair of connected nodes in the reduced number of connections corresponds to a different level value within a selected difference of the output level determined for that super node.

* * * * *